United States Patent
Holmes et al.

(10) Patent No.: US 11,380,836 B2
(45) Date of Patent: Jul. 5, 2022

(54) TOPOLOGICAL QUBIT DEVICE

(71) Applicant: International Business Machines Corporation, Armonk, NY (US)

(72) Inventors: Steven J. Holmes, Ossining, NY (US); Timothy Mathew Philip, Albany, NY (US); Sagarika Mukesh, Albany, NY (US); Youngseok Kim, Upper Saddle River, NJ (US); Devendra K. Sadana, Pleasantville, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 57 days.

(21) Appl. No.: 16/820,048

(22) Filed: Mar. 16, 2020

(65) Prior Publication Data
US 2021/0288238 A1  Sep. 16, 2021

(51) Int. Cl.
| | |
|---|---|
| *H01L 39/22* | (2006.01) |
| *H01L 39/02* | (2006.01) |
| *H01L 39/24* | (2006.01) |
| *B82Y 25/00* | (2011.01) |
| *B82Y 10/00* | (2011.01) |
| *B82Y 40/00* | (2011.01) |

(52) U.S. Cl.
CPC .......... *H01L 39/223* (2013.01); *H01L 39/025* (2013.01); *H01L 39/2493* (2013.01); *B82Y 10/00* (2013.01); *B82Y 25/00* (2013.01); *B82Y 40/00* (2013.01)

(58) Field of Classification Search
CPC . H01L 39/223; H01L 39/2493; H01L 39/025; B82Y 10/00; B82Y 25/00; B82Y 40/00
See application file for complete search history.

(56) References Cited

U.S. PATENT DOCUMENTS

| | | | |
|---|---|---|---|
| 9,455,391 | B1 | 9/2016 | Nayfeh et al. |
| 10,367,132 | B2 | 7/2019 | Krogstrup et al. |
| 2019/0214561 | A1 | 7/2019 | Schrade et al. |

(Continued)

FOREIGN PATENT DOCUMENTS

| | | |
|---|---|---|
| EP | 3505490 | 7/2019 |
| WO | 2018171823 | 9/2018 |

OTHER PUBLICATIONS

Ke, C.T., Moehle, C.M., de Vries, F.K et al. Ballistic superconductivity and tunable π-junctions in InSb quantum wells. Nat Commun 10, 3764 (2019). https://doi.org/10.1038/s41467-019-11742-4 (Year: 2019).*

(Continued)

*Primary Examiner* — Matthew L Reames
(74) *Attorney, Agent, or Firm* — Amin, Turocy & Watson, LLP

(57) ABSTRACT

Devices, systems, and/or methods that can facilitate topological quantum computing are provided. According to an embodiment, a device can comprise a circuit layer formed on a wiring layer of the device and that comprises control components. The device can further comprise a topological qubit device formed on the circuit layer and that comprises a nanorod capable of hosting *Majorana* fermions and a quantum well tunable Josephson junction that is coupled to the control components.

20 Claims, 39 Drawing Sheets

(56) References Cited

U.S. PATENT DOCUMENTS

2019/0220769 A1     7/2019   Pikulin
2019/0273196 A1     9/2019   Marcus et al.
2021/0327712 A1*   10/2021   Olsson .............. H01L 21/02543

OTHER PUBLICATIONS

Litinski et al., "Combining Topological Hardware and Topological Software: Color Code Quantum Computing with Topological Superconductor Networks," arXiv:1704.01589 [cond-mat.mes-hall], Sep. 22, 2017, 24 pages.
Ran et al., "Nearly ferromagnetic spin-triplet superconductivity," Science, vol. 365, Issue 6454, Aug. 16, 2019, 17 pages.
Nadj-Perge et al., "Observation of Majorana Fermions in Ferromagnetic Atomic Chains on a Superconductor," arXiv:1410.0682 [cond-mat.mes-hall], 45 pages.
Feldman et al., "High-resolution studies of the Majorana atomic chain platform," Nature Phys 13, Nov. 7, 2016, 52 pages.
Liu et al., "Template-free synthesis of nickel nanowires by magnetic field," Materials Letters, vol. 63, Issue 20, Aug. 15, 2009, 3 pages.
Chang et al., "Experimental observation of the quantum anomalous Hall effect in a magnetic topological insulator," arXiv:1605.08829 [cond-mat.mes-hall], Science 340, 2013, 15 pages.

* cited by examiner

TOPOLOGICAL QUBIT DEVICE

BACKGROUND

The subject disclosure relates to qubit devices and a method for forming the same. More specifically, the subject disclosure relates to topological qubit devices and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that facilitate topological quantum computing are described.

According to an embodiment, a device can comprise a circuit layer formed on a wiring layer of the device and that comprises control components. The device can further comprise a topological qubit device formed on the circuit layer and that comprises a nanorod capable of hosting *Majorana* fermions and a quantum well tunable Josephson junction that is coupled to the control components.

According to an embodiment, a device can comprise a wiring layer formed on a substrate. The device can further comprise a circuit layer formed on the wiring layer and that comprises control components. The device can further comprise a first device layer formed on the circuit layer and that comprises a quantum well and electrical contacts coupled to the control components. The device can further comprise a second device layer formed on the first device layer and that comprises nanorods capable of hosting *Majorana* fermions and Josephson junction electrodes. The Josephson junction electrodes are coupled to the electrical contacts.

According to an embodiment, a method can comprise forming on a substrate a wiring layer. The method can further comprise forming on the wiring layer a circuit layer comprising control components. The method can further comprise forming on the circuit layer a first device layer comprising a quantum well and electrical contacts coupled to the control components. The method can further comprise forming on the first device layer a second device layer comprising nanorods capable of hosting *Majorana* fermions and Josephson junction electrodes. The Josephson junction electrodes are coupled to the electrical contacts.

DETAILED DESCRIPTION

Figure 1:
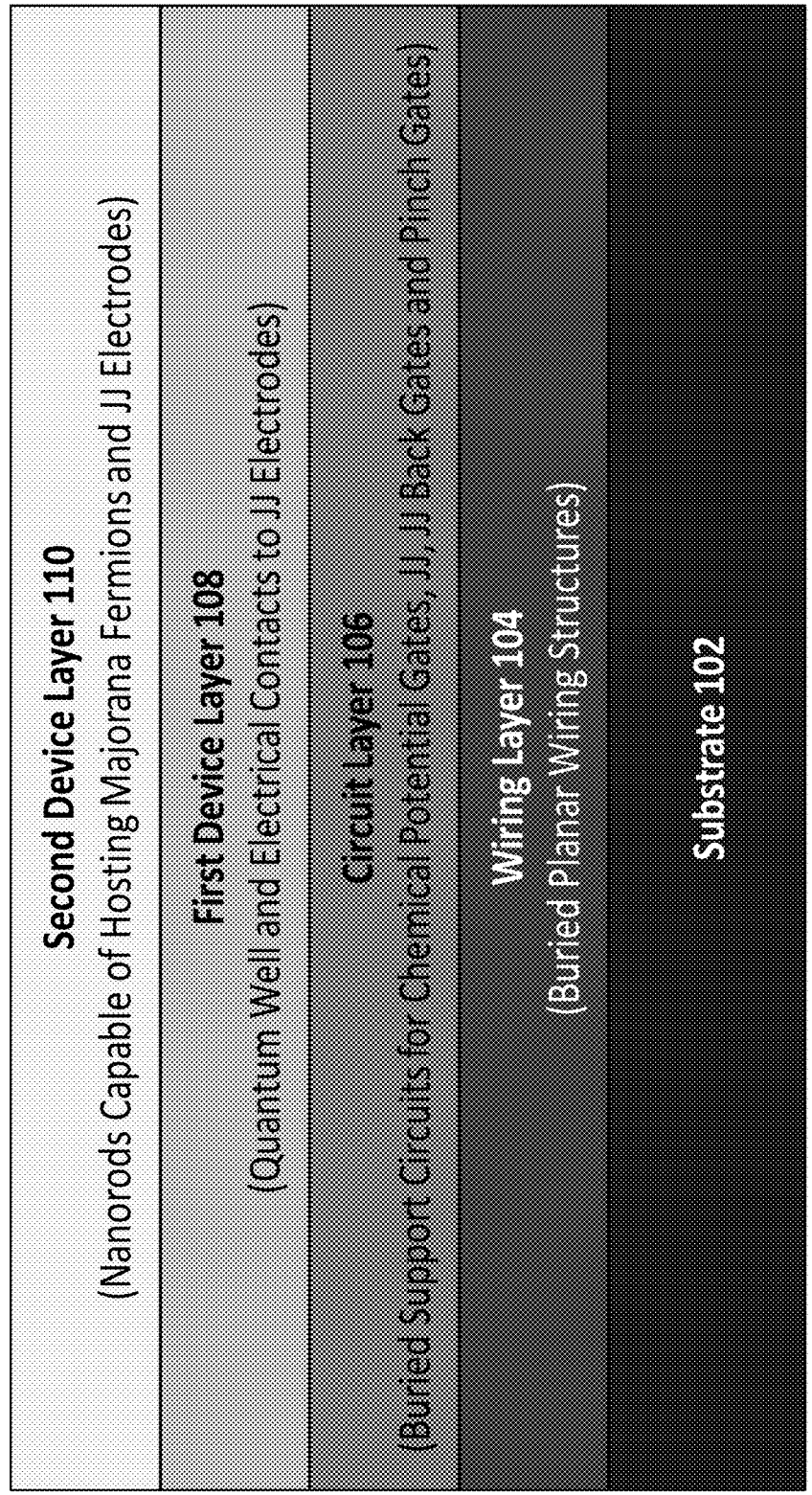
FIG. 1 illustrates a cross-sectional side view of an example, non-limiting device that can facilitate topological quantum computing in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Some existing quantum computing technologies attempt to incorporate *Majorana* fermion quantum phenomena to leverage potential advantages of a *Majorana* fermion. A *Majorana* fermion (also referred to as a *Majorana* particle (quasiparticle)) is a fermion that has the property of being its own antiparticle. A *Majorana* fermion device (e.g., a *Majorana* fermion based device) can comprise a structure of semiconducting and/or superconducting materials that can mimic and/or host *Majorana* fermions and/or facilitate measurement of observations that can be a characteristic of *Majorana* fermions (e.g., behavior, functionality, property, etc.).

The *Majorana* fermion device described above can be implemented as a quantum device such as, for instance, a topological qubit, a *Majorana* qubit, and/or another qubit device that can be implemented in a quantum computing device. Such a quantum device (e.g., topological qubit, *Majorana* qubit, etc.) offer the possibility of long coherence times and/or fast and possibly universal quantum computing. However, given the delicate nature of a *Majorana* fermion, fabrication of an effective and/or robust *Majorana* fermion device that can mimic and/or host *Majorana* fermions using existing semiconductor and/or superconductor fabrication techniques is very difficult. Some examples of such challenges can include:

a) Fabrication of extremely high-quality interfaces and films.

b) Conventional processing damages films (e.g., reactive-ion etching (RIE), cleans, air oxidation, etc.).

c) Dielectrics quench coherence, so the challenge is to make wiring structures without dielectric films separating structures (e.g., if they have trapped charges, and can make quasiparticles, uncontrolled electron density can result).

d) Integration of multiple elements such as, for instance, integration of: nanorods (e.g., nanorods that can host Marion fermions); quantum wells; nanowires; sensing gates (e.g., Josephson junction (JJ) sensing gates to sense the *Majorana* fermions); pinch gates (e.g., to separate activity of nanorods); chemical potential gates (e.g., to control chemical potential of a nanorod, for instance, to put it into the zero-energy state (*Majorana* regime) instead of the Coulomb state/regime and vice versa); contacts and circuit wires; semiconducting connections for sensing regions; and/or other elements.

One or more embodiments of the subject disclosure are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

FIG. 1 illustrates a cross-sectional side view of an example, non-limiting device 100 that can facilitate topological quantum computing in accordance with one or more embodiments described herein. Device 100 can comprise a semiconducting and superconducting device that can comprise and/or be implemented as a quantum device in a quantum computing device. For example, device 100 can comprise an integrated semiconducting and superconducting circuit (e.g., a quantum circuit) that can comprise and/or be implemented as a topological qubit device and/or a *Majorana* qubit device in a quantum computing device such as, for instance, quantum hardware, a quantum processor, a quantum computer, and/or another quantum computing device.

Device 100 can comprise a substrate 102. Substrate 102 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate 102 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor.

Device 100 can further comprise a wiring layer 104 formed on substrate 102 as illustrated in FIG. 1. Wiring layer 104 can comprise one or more planar wires (denoted as Buried Planar Wiring Structures in FIG. 1) that can be coupled (e.g., chemically, communicatively, electrically, electromagnetically, operatively, optically, physically, thermally, etc.) to one or more control circuits and/or control equipment (not illustrated in FIG. 1) that can be external to device 100. Such control circuits and/or control equipment (e.g., control circuits and/or control equipment that can be external to device 100) can be employed to control the operation of one or more active components of device 100 (e.g., to control the operation of one or more active components of first device layer 108 of device 100 and/or one or more other active components of second device layer 110 of device 100 as described below).

The planar wires described above that can be formed in wiring layer 104 of device 100 can comprise a grid of planar wires that can be buried (e.g., embedded, integrated, etc.) in substrate 102. For example, the planar wires can comprise damascene wiring structures that can be buried (e.g., embedded, integrated, etc.) in substrate 102.

Device 100 can further comprise a circuit layer 106 formed on wiring layer 104 as illustrated in FIG. 1. Circuit layer 106 can comprise one or more control components that can be coupled (e.g., chemically, communicatively, electrically, electromagnetically, operatively, optically, physically, thermally, etc.) to one or more of the planar wires of wiring layer 104 described above to control the operation of one or more active components of device 100 (e.g., using the control circuits and/or control equipment described above that can be external to device 100 and coupled to the planar wires of wiring layer 104). Such one or more control components are denoted in FIG. 1 as Buried Support Circuits for Chemical Potential Gates, Josephson junction (JJ), JJ Back Gates and Pinch Gates.

In an example, circuit layer 106 can comprise one or more control components including, but not limited to, one or more: control gates; Josephson junction (JJ) sensing circuits; chemical potential gates; pinch gates; Josephson junction (JJ) gates; and/or another control component that can be coupled to one or more of the planar wires of wiring layer 104 (e.g., using through-silicon vias (TSV) as described below) to control the operation of one or more active components of device 100 (e.g., using the control circuits and/or control equipment described above that can be external to device 100 and coupled to the planar wires of wiring layer 104). The control components of circuit layer 106 can comprise damascene wiring structures such as, for instance, damascene electrodes that can be buried (e.g., embedded, integrated, etc.) in circuit layer 106.

Device 100 can further comprise a first device layer 108 formed on circuit layer 106 as illustrated in FIG. 1. First device layer 108 can comprise the one or more active components described above that can be coupled (e.g., chemically, communicatively, electrically, electromagnetically, operatively, optically, physically, thermally, etc.) to one or more of the control components of circuit layer 106 and/or to one or more of the planar wires of wiring layer 104 described above to control the operation of such active component(s) of first device layer 108 (e.g., using the control circuits and/or control equipment described above that can be external to device 100 and coupled to the planar wires of wiring layer 104). For example, first device layer 108 can comprise one or more quantum wells and/or one or more electrical contacts that can be coupled (e.g., chemically, communicatively, electrically, electromagnetically, operatively, optically, physically, thermally, etc.) to such quantum well(s) and/or to the control components of circuit layer 106 described above. In this example, such electrical contacts of first device layer 108 can be further coupled (e.g., chemically, communicatively, electrically, electromagnetically, operatively, optically, physically, thermally, etc.) to one or more other active components of device 100 that can be positioned in second device layer 110 as described below to control the operation of such other active component(s) (e.g., using the control circuits and/or control equipment described above that can be external to device 100 and coupled to the planar wires of wiring layer 104).

In an example, first device layer 108 can comprise one or more quantum wells that can respectively comprise semiconductor-based quantum wells (e.g., quantum wells respectively comprising one or more semiconductor materials). In another example, first device layer 108 can comprise one or more quantum wells that can respectively comprise semiconductor-based quantum well tunable Josephson junctions (e.g., quantum well tunable Josephson junctions respectively comprising one or more semiconductor materials).

Device 100 can further comprise a second device layer 110 formed on first device layer 108 as illustrated in FIG. 1. Second device layer 110 can comprise the one or more other active components described above that can be coupled (e.g., chemically, communicatively, electrically, electromagnetically, operatively, optically, physically, thermally, etc.) to the electrical contacts of first device layer 108 described above, where such electrical contacts can be further coupled to the one or more of the control components of circuit layer 106 and/or to one or more of the planar wires of wiring layer 104 described above to control the operation of such other active component(s) of second device layer 110 (e.g., using the control circuits and/or control equipment described above that can be external to device 100 and coupled to the planar wires of wiring layer 104). For example, second device layer 110 can comprise one or more nanorods capable of hosting *Majorana* fermions and/or one or more Josephson junction (JJ) electrodes, where the Josephson junction (JJ) electrodes can be coupled (e.g., chemically, communicatively, electrically, electromagnetically, operatively, optically, physically, thermally, etc.) to such nanorod(s), to the electrical contacts of first device layer 108 described above, and/or to the quantum well(s) of first device layer 108 described above.

In an example, second device layer 110 can comprise one or more nanorods capable of hosting *Majorana* fermions, where such nanorod(s) can respectively comprise a single material having superconducting properties and magnetic properties. For instance, such nanorod(s) can respectively comprise uranium telluride ($UTe_2$). In another example, second device layer 110 can comprise one or more nanorods capable of hosting *Majorana* fermions, where such nanorod(s) can respectively comprise a magnetic material formed on a superconducting material. For instance, such nanorod(s) can respectively comprise a magnetic material such as, for example, iron (Fe) formed on a superconducting material such as, for example, lead (Pb).

In some embodiments, first device layer 108 and second device layer 110 together can constitute a topological qubit device and/or a *Majorana* qubit device that can be implemented as a quantum device in a quantum computing device. For example, first device layer 108 and second device layer 110 together can constitute an integrated semiconducting and superconducting circuit (e.g., a quantum circuit) that can be implemented as a topological qubit device and/or a *Majorana* qubit device in a quantum computing device such as, for instance, quantum hardware, a quantum processor, a quantum computer, and/or another quantum computing device. In this example and as illustrated in FIG. 1, second device layer 110 can comprise an outermost layer of such a topological qubit device and/or a *Majorana* qubit device. As described below with reference to FIGS. 6-37, second device layer 110 and/or one or more components thereof can be formed on first device layer 108 as a final step in a fabrication process that can be implemented to create device 100. It should be appreciated that forming second device layer 110 and/or component(s) thereof on first device layer 108 in a final step of such a fabrication process can thereby facilitate at least one of: reduced damage of the components of second device layer 110 during the fabrication process (e.g., reduced damage of the nanorod(s) of second device layer 110); improved coherence time of such a topological qubit device and/or *Majorana* qubit device comprising first device layer 108 and second device layer 110 as described above; improved lifespan of such a topological qubit device and/or *Majorana* qubit device comprising first device layer 108 and second device layer 110 as described above; or improved performance of device 100 (e.g., improved performance of device 100 in embodiments where device 100 is implemented in a quantum computing device such as, for instance, a quantum processor, quantum computer, etc.).

Figure 2:
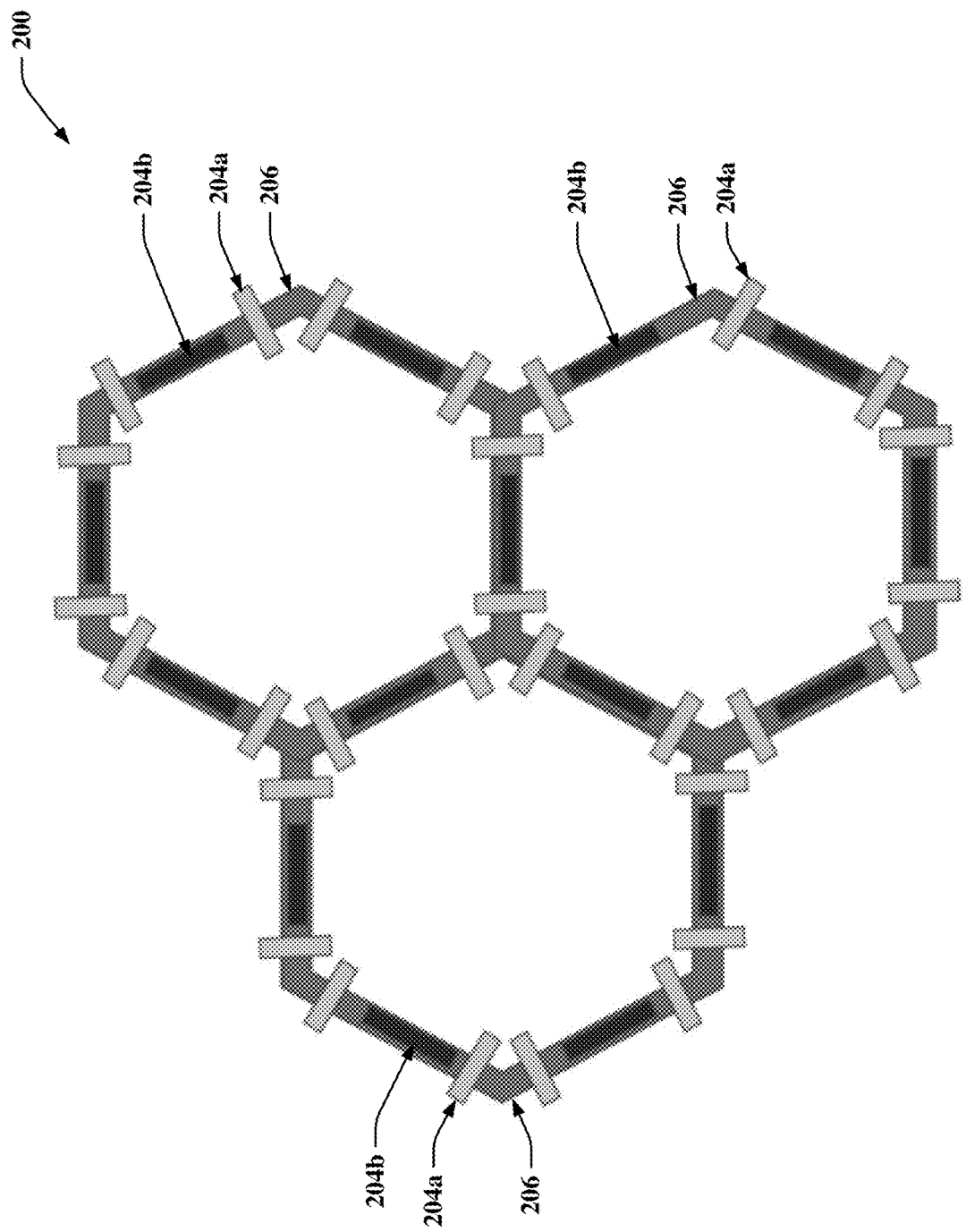
FIG. 2 illustrates a bottom view of an example, non-limiting device that can facilitate topological quantum computing in accordance with one or more embodiments described herein.

FIG. 2 illustrates a bottom view of an example, non-limiting device 200 that can facilitate topological quantum computing in accordance with one or more embodiments described herein. Repetitive description of like elements and/or processes employed in other embodiments described herein is omitted for sake of brevity.

Device 200 can comprise an example, non-limiting embodiment of device 100 described above with reference to FIG. 1. The illustration of device 200 depicted in FIG. 2 can comprise a bottom view of circuit layer 106, first device layer 108, and second device layer 110 of device 100, where substrate 102 and wiring layer 104 have been removed for clarity. More specifically, the illustration of device 200 depicted in FIG. 2 can comprise a bottom view of circuit layer 106, first device layer 108, and second device layer 110 of device 100 as seen from the vantage point of wiring layer 104, which has been removed for clarity (e.g., as seen from the vantage point of wiring layer 104, looking through circuit layer 106, first device layer 108, and second device layer 110 of device 100).

As described above with reference to FIG. 1, circuit layer 106 can comprise one or more control components (e.g., control gates, Josephson junction (JJ) sensing circuits, chemical potential gates, pinch gates, Josephson junction (JJ) gates, etc.). In an example, as illustrated in FIG. 2, circuit layer 106 can comprise one or more pinch gates 204a (also referred to as pinch electrodes, pinch off gates, pinch off electrodes, etc.) and/or one or more chemical potential gates 204b (also referred to as chemical potential electrodes, Ec electrodes, etc.).

As described above with reference to FIG. 1, such control components of circuit layer 106, which can comprise pinch gates 204a and/or chemical potential gates 204b, can be coupled (e.g., chemically, communicatively, electrically, electromagnetically, operatively, optically, physically, thermally, etc.) to one or more active components of first device layer 108 and/or second device layer 110. For example, pinch gates 204a and/or chemical potential gates 204b can be coupled to the above described quantum well(s) (not illustrated in FIGS. 1 and 2) of first device layer 108 and/or one or more nanorods 206 of second device layer 110 as illustrated in FIG. 2. For instance, pinch gates 204a and/or chemical potential gates 204b can be coupled to the above described electrical contacts of first device layer 108. In this example, such electrical contacts can be further coupled to: the above described quantum well(s) of first device layer 108; nanorods 206 of second device layer 110; and/or the above described Josephson junction (JJ) electrodes of second device layer 110, where such Josephson junction (JJ) electrodes can be further coupled to nanorods 206.

Nanorods 206 depicted in FIG. 2 can comprise nanorods that are capable of hosting *Majorana* fermions. In an example, nanorods 206 can respectively comprise a single material having superconducting properties and magnetic properties. For instance, nanorods 206 can respectively comprise uranium telluride ($UTe_2$). In another example, nanorods 206 can respectively comprise a magnetic material formed on a superconducting material. For instance, nanorods 206 can respectively comprise a magnetic material such as, for example, iron (Fe) formed on a superconducting material such as, for example, lead (Pb).

Although nanorods 206 depicted in FIG. 2 comprise a substantially hexagonal ring shape, it should be appreciated that the subject disclosure is not so limiting. For example, nanorods 206 can be formed in any shape (e.g., a circular ring, a square ring, a triangular ring, etc.) that can enable fabrication and/or implementation of one or more embodiments of the subject disclosure that can facilitate topological quantum computing as described herein.

Pinch gates 204a depicted in FIG. 2 can be used to separate activity of the segments of nanorods 206. To facilitate such activity separation of the segments of nanorods 206, the above described planar wires of wiring layer 104 can be coupled (e.g., chemically, communicatively, electrically, electromagnetically, operatively, optically, physically, thermally, etc.) to an electrical power source that can be external to device 100 (e.g., an electrical voltage source and/or an electrical current source, not illustrated in the figures). Such an electrical power source can be employed to apply an electrical current and/or an electrical voltage to the above described planar wires of wiring layer 104 to separate activity of the segments of nanorods 206.

Chemical potential gates 204b depicted in FIG. 2 can be used to control chemical potential of nanorods 206. For example, chemical potential gates 204b can be used to put nanorods 206 into the zero-energy state, also referred to as the *Majorana* regime, instead of the Coulomb regime or vice versa. To facilitate such a shift from the Coulomb regime to the *Majorana* regime, the above described planar wires of wiring layer 104 can be coupled to (e.g., chemically, communicatively, electrically, electromagnetically, operatively, optically, physically, thermally, etc.) to the electrical power source described above that can be external to device 100 (e.g., an electrical voltage source and/or an electrical current source, not illustrated in the figures). Such an electrical power source can be employed to apply an electrical current and/or an electrical voltage to the above described planar wires of wiring layer 104 to change the voltage on chemical potential gates 204b and thereby facilitate setting nanorods 206 to a zero-energy state to mimic *Majorana* fermion characteristics or to a Coulomb regime.

Figure 3:
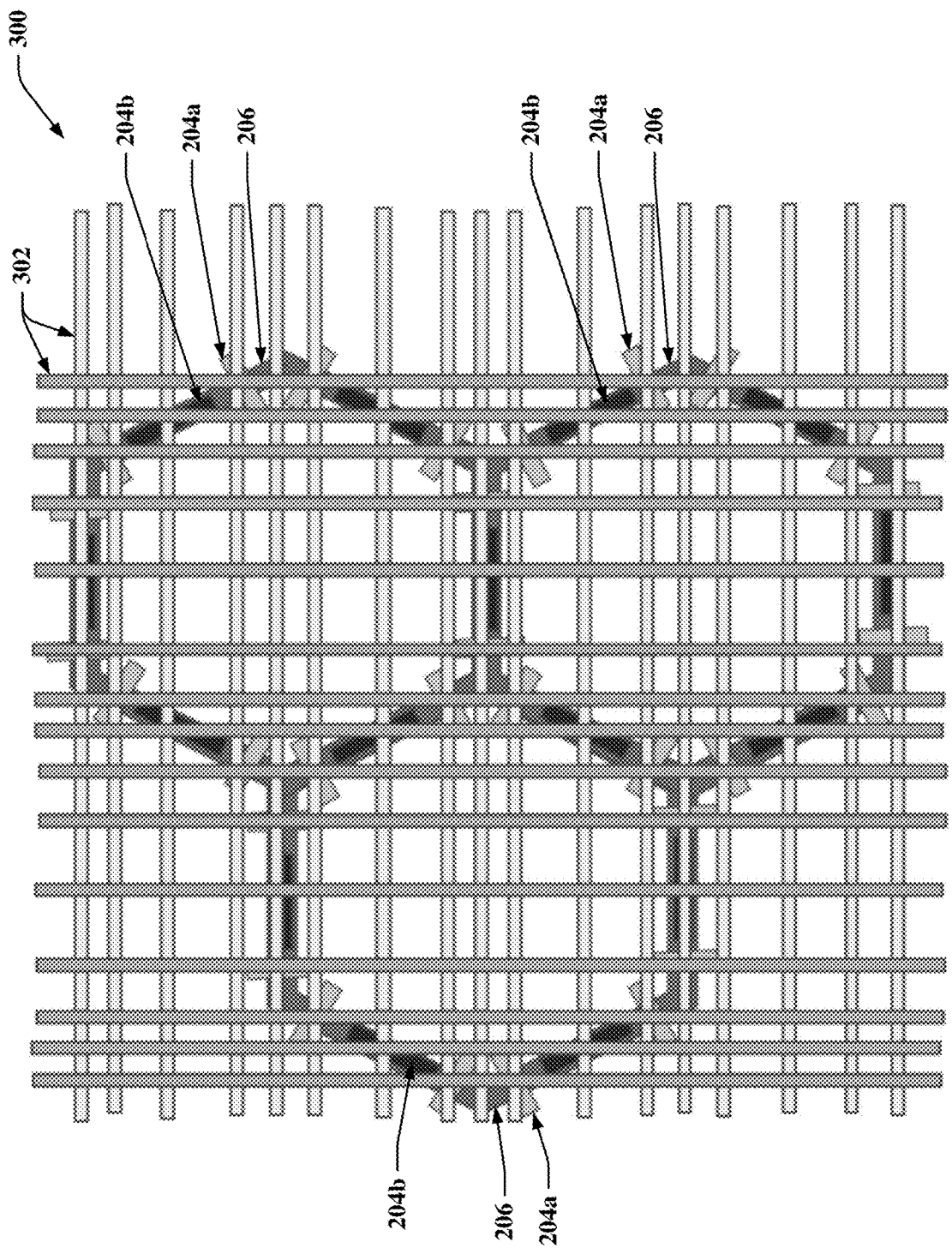
FIG. 3 illustrates a bottom view of an example, non-limiting device that can facilitate topological quantum computing in accordance with one or more embodiments described herein.

FIG. 3 illustrates a bottom view of an example, non-limiting device 300 that can facilitate topological quantum computing in accordance with one or more embodiments described herein. Repetitive description of like elements and/or processes employed in other embodiments described herein is omitted for sake of brevity.

Device 300 can comprise an example, non-limiting embodiment of device 100 and/or 200 described above with reference to FIGS. 1 and 2, respectively. The illustration of device 300 depicted in FIG. 3 can comprise a bottom view of wiring layer 104, circuit layer 106, first device layer 108, and second device layer 110 of device 100, where substrate 102 has been removed for clarity. More specifically, the illustration of device 300 depicted in FIG. 3 can comprise a bottom view of wiring layer 104, circuit layer 106, first device layer 108, and second device layer 110 of device 100 as seen from the vantage point of substrate 102, which has been removed for clarity (e.g., as seen from the vantage point of substrate 102, looking through wiring layer 104, circuit layer 106, first device layer 108, and second device layer 110 of device 100).

As described above with reference to FIG. 1, wiring layer 104 can comprise one or more planar wires that can be coupled (e.g., chemically, communicatively, electrically, electromagnetically, operatively, optically, physically, thermally, etc.) to one or more control circuits and/or control equipment (not illustrated in FIG. 1) that can be external to device 100. In an example, wiring layer 104 can comprise planar wires 302 illustrated in FIG. 3. Planar wires 302 can comprise a grid of planar wires as depicted in FIG. 3 that can be buried (e.g., embedded, integrated, etc.) in substrate 102. For example, planar wires 302 can comprise a grid of damascene wiring structures that can be buried (e.g., embedded, integrated, etc.) in substrate 102.

Although planar wires 302 depicted in FIG. 3 respectively comprise a substantially rectangular shape and are arranged in a grid pattern, it should be appreciated that the subject disclosure is not so limiting. For example, planar wires 302 can be formed in any shape and/or arranged in any pattern that can enable fabrication and/or implementation of one or more embodiments of the subject disclosure that can facilitate topological quantum computing as described herein.

Figure 4:
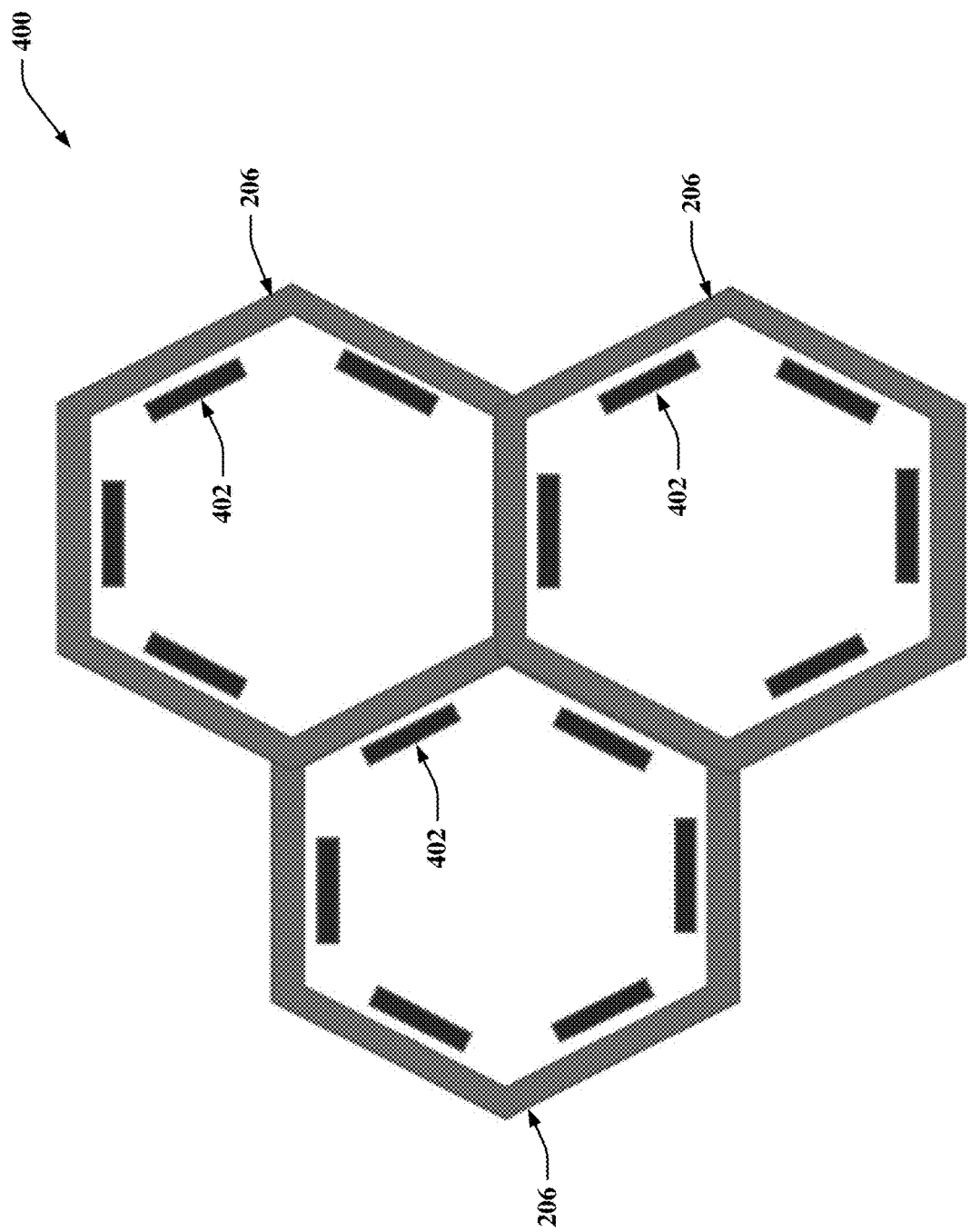
FIG. 4 illustrates a top view of an example, non-limiting device that can facilitate topological quantum computing in accordance with one or more embodiments described herein.

FIG. 4 illustrates a top view of an example, non-limiting device 400 that can facilitate topological quantum computing in accordance with one or more embodiments described herein. Repetitive description of like elements and/or processes employed in other embodiments described herein is omitted for sake of brevity.

Device 400 can comprise an example, non-limiting embodiment of device 100, 200, and/or 300 described above with reference to FIGS. 1, 2, and 3, respectively. The illustration of device 400 depicted in FIG. 4 can comprise a top view of second device layer 110 of device 100, where substrate 102, wiring layer 104, circuit layer 106, and first device layer 108 have been removed for clarity.

As described above with reference to FIGS. 1 and 2, second device layer 110 can comprise one or more Josephson junction (JJ) electrodes that can be coupled (e.g., chemically, communicatively, electrically, electromagnetically, operatively, optically, physically, thermally, etc.) to one or more nanorods, to the electrical contacts of first device layer 108 described above, and/or to the quantum well(s) of first device layer 108 described above. As illustrated in FIG. 4, device 400 can comprise one or more Josephson junction (JJ) electrodes 402 that can comprise the Josephson junction (JJ) electrodes described above.

Although Josephson junction (JJ) electrodes 402 depicted in FIG. 4 comprise a substantially rectangular shape, it should be appreciated that the subject disclosure is not so limiting. For example, Josephson junction (JJ) electrodes 402 can be formed in any shape (e.g., circle, triangle, square, pentagon, hexagon, etc.) that can enable fabrication and/or implementation of one or more embodiments of the subject disclosure that can facilitate topological quantum computing as described herein.

Figure 5:
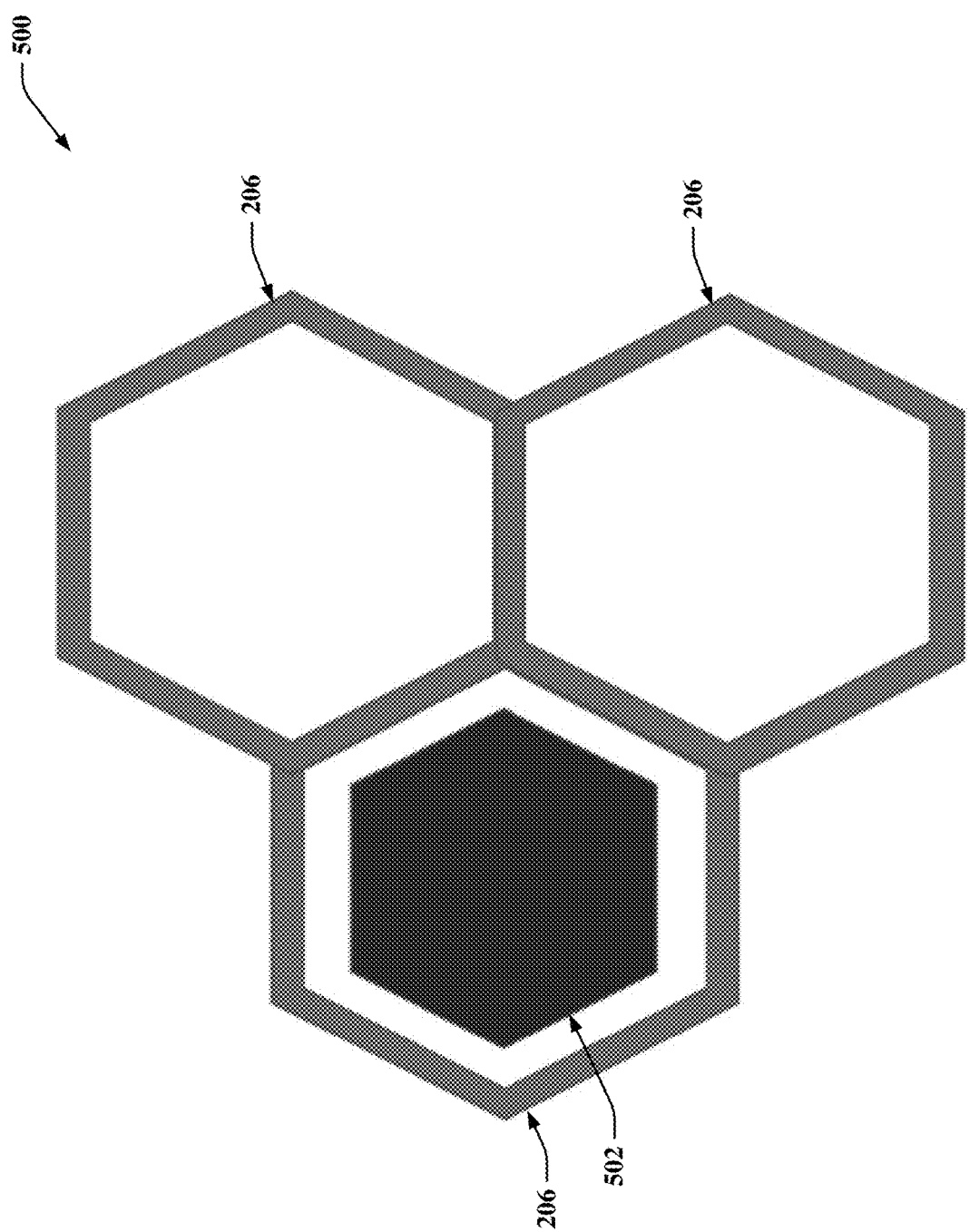
FIG. 5 illustrates a top view of an example, non-limiting device that can facilitate topological quantum computing in accordance with one or more embodiments described herein.

FIG. 5 illustrates a top view of an example, non-limiting device 500 that can facilitate topological quantum computing in accordance with one or more embodiments described herein. Repetitive description of like elements and/or processes employed in other embodiments described herein is omitted for sake of brevity.

Device 500 can comprise an example, non-limiting alternative embodiment of device 100, 200, 300, and/or 400 described above with reference to FIGS. 1, 2, 3, and 4, respectively. For example, Josephson junction (JJ) electrode 502 of device 500 depicted in FIG. 5 can comprise an example, non-limiting alternative embodiment of Josephson junction (JJ) electrodes 402 of device 400 depicted in FIG. 4, where Josephson junction (JJ) electrode 502 can comprise a shared Josephson junction (JJ) electrode. For instance, rather than having a certain quantity of Josephson junction (JJ) electrodes 402 (e.g., a quantity of 6 as depicted in FIG. 4), second device layer 110 can comprise a single, shared Josephson junction (JJ) electrode 502 as illustrated in FIG. 5.

Although Josephson junction (JJ) electrode 502 depicted in FIG. 5 comprises a substantially hexagonal shape, it should be appreciated that the subject disclosure is not so limiting. For example, Josephson junction (JJ) electrode 502 can be formed in any shape (e.g., circle, triangle, square, pentagon, etc.) that can enable fabrication and/or implementation of one or more embodiments of the subject disclosure that can facilitate topological quantum computing as described herein.

FIGS. 6-37 illustrate an example, non-limiting multi-step fabrication sequence that can be implemented to fabricate one or more embodiments of the subject disclosure described herein and/or illustrated in the figures. For example, the non-limiting multi-step fabrication sequence illustrated in FIGS. 6-37 can be implemented to fabricate device 3700, where device 3700 can comprise an example, non-limiting alternative embodiment of device 100, 200, 300, 400, and/or 500 described above with reference to FIGS. 1-5.

Although the non-limiting multi-step fabrication sequence illustrated in FIGS. 6-37 describes fabrication of device 3700, it should be appreciated that the subject disclosure is not so limiting. For example, the non-limiting multi-step fabrication sequence illustrated in FIGS. 6-37 can be modified accordingly and implemented to fabricate device 100, 200, 300, 400, and/or 500 described above with reference to FIGS. 1-5.

As described below with reference to FIGS. 6-37, fabrication of the various embodiments of the subject disclosure described herein and/or illustrated in the figures (e.g., device 100, 200, 300, 400, 500, 3700, etc.) can comprise a multi-step sequence of, for example, photolithographic and/or chemical processing steps that facilitate gradual creation of electronic-based systems, devices, components, and/or circuits in a semiconducting and superconducting device (e.g., an integrated circuit). For instance, the various embodiments of the subject disclosure described herein and/or illustrated in the figures (e.g., device 100, 200, 300, 400, 500, 3700, etc.) can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), epitaxial deposition, chemical-mechanical planarization (CMP), backgrinding techniques, and/or another technique for fabricating an integrated circuit.

As described below with reference to FIGS. 6-37, the various embodiments of the subject disclosure described herein and/or illustrated in the figures (e.g., device 100, 200, 300, 400, 500, 3700, etc.) can be fabricated using various materials. For example, the various embodiments of the subject disclosure described herein and/or illustrated in the figures (e.g., device 100, 200, 300, 400, 500, 3700, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 6:
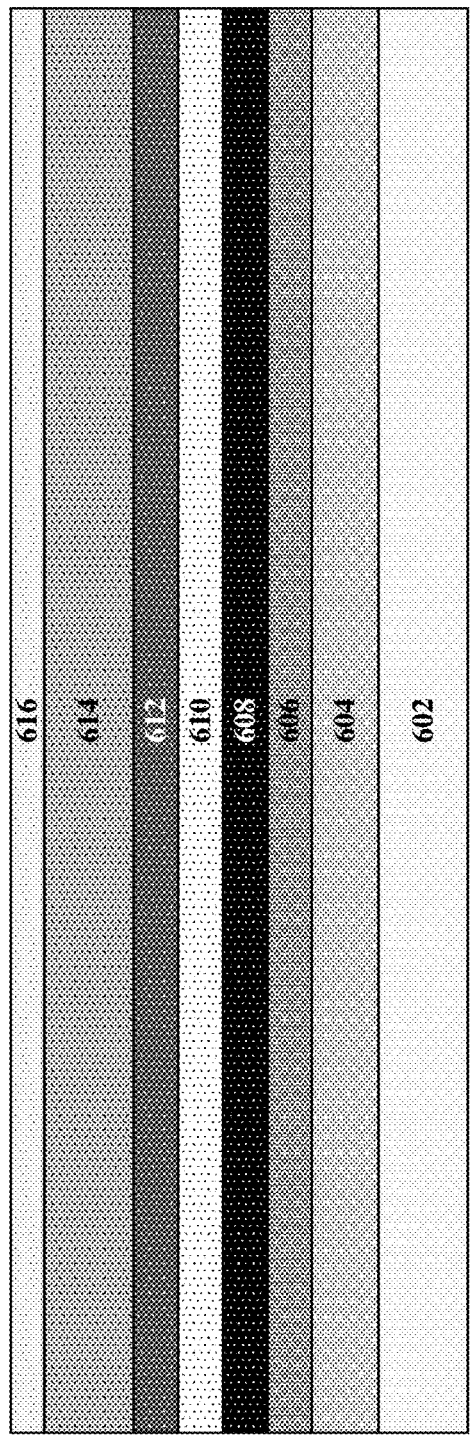
FIG. 6 illustrates a cross-sectional side view of an example, non-limiting device comprising a quantum well formed on a substrate in accordance with one or more embodiments described herein.

FIG. 6 illustrates a cross-sectional side view of an example, non-limiting device 600 comprising a quantum well formed on a substrate in accordance with one or more embodiments described herein. Repetitive description of like elements and/or processes employed in other embodiments described herein is omitted for sake of brevity.

Device 600 can comprise a substrate 602. Substrate 602 can comprise substrate 102. For example, substrate 602 can comprise the same material as that of substrate 102 (e.g., silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, silicon/silicon-germanium (Si/SiGe), silicon/silicon carbide (Si/SiC), silicon-on-insulators (SOIs), silicon germanium-on-insulators (SGOIs), etc.). Substrate 602 can comprise a thickness (e.g., height) ranging from approximately 500 micrometers ($\mu$m) to approximately 800 $\mu$m.

Device 600 can further comprise a buffer layer 604 that can be deposited on substrate 602 using one or more material deposition techniques defined above (e.g., evaporation techniques, sputtering techniques, CVD, ALD, PVD, MBE, ECD, epitaxial deposition, etc.). Buffer layer 604 can be formed using a material including, but not limited to, silicon-germanium (SiGe), germanium (Ge), indium arsenide (InAs), and/or another material. Buffer layer 604 can comprise a thickness (e.g., height) ranging from approximately 20 nanometers (nm) to approximately 1,000 nm.

Device 600 can further comprise an etch stop layer 606 that can be deposited on buffer layer 604 using one or more material deposition techniques defined above (e.g., evaporation techniques, sputtering techniques, CVD, ALD, PVD, MBE, ECD, epitaxial deposition, etc.). In some embodiments, etch stop layer 606 is not deposited on buffer layer 604, as etch stop layer 606 is an optional layer. Etch stop layer 606 can be formed using a material comprising germanium (Ge) including, but not limited to, silicon-germanium (SiGe), and/or another material. Etch stop layer 606 can comprise a thickness (e.g., height) ranging from approximately 30 nm to approximately 2,000 nm.

Device 600 can further comprise one or more semiconductor layers that can comprise one or more epitaxial films formed (e.g., grown) on etch stop layer 606. For example, device 600 can comprise: a first quantum well layer 608 that can be formed on etch stop layer 606; a second quantum well layer 610 that can be formed on first quantum well layer 608; and a third quantum well layer 612 that can be formed on second quantum well layer 610.

First quantum well layer 608, second quantum well layer 610, and/or third quantum well layer 612 defined above that can comprise epitaxial films can be grown on etch stop layer 606 using an epitaxial film growth process (e.g., epitaxial deposition) performed in an epitaxial growth furnace. For example, first quantum well layer 608, second quantum well layer 610, and/or third quantum well layer 612 can be grown on etch stop layer 606 together in situ during the same fabrication phase (e.g., in situ epitaxial film growth performed in an epitaxial growth furnace).

Utilizing such an in situ epitaxial film growth process to grow first quantum well layer 608, second quantum well layer 610, and/or third quantum well layer 612 on etch stop layer 606 in such a manner can facilitate desirable crystallinity of each layer (film), as well as prevent oxidation and/or defects at the interfaces between each of such layers (e.g., at the interfaces between first quantum well layer 608, second quantum well layer 610, and/or third quantum well layer 612), at the interface between etch stop layer 606 and first quantum well layer 608, and/or at the interface between third quantum well layer 612 and epitaxial layer 614. Utilizing such an in situ epitaxial film growth process to grow first quantum well layer 608, second quantum well layer 610, and/or third quantum well layer 612 on etch stop layer 606 in such a manner can further facilitate repeatable fabrication of each of such layers to a desirable dimension (e.g., height, thickness, etc.). Such repeatable fabrication of each of such layers to a desirable dimension (e.g., height, thickness, etc.) can facilitate: improved consistency of the desirable dimension in a plurality of topological qubit devices fabricated using such an in situ epitaxial film growth process; and/or improved coherence time, improved performance, and/or improved lifespan of a topological qubit device fabricated using such an in situ epitaxial film growth process.

First quantum well layer 608, an epitaxial semiconductor, can be epitaxially grown on etch stop layer 606. Materials for first quantum well layer 608 can be selected based on the composition of second quantum well layer 610, to provide crystal quality above a particular quality threshold. In one embodiment, first quantum well layer 608 can be formed using a certain composition of silicon-germanium (SiGe), indium gallium arsenide (InGaAs), and/or indium aluminum arsenide (InAlAs) to match the crystal lattice of one or more layers adjacent to first quantum well layer 608. In one embodiment, first quantum well layer 608 can comprise a gradual change in composition from the interface with etch stop layer 606 to the interface with second quantum well layer 610 to avoid creating crystal defects (e.g. dislocations) in first quantum well layer 608. In one embodiment, the gradual change in composition can be a linear change. These examples of materials are not intended to be limiting. From this disclosure those of ordinary skill in the art will be able to conceive of many other materials suitable for forming first quantum well layer 608 and the same are contemplated within the scope of the illustrative embodiments. First quantum well layer 608 can comprise a thickness (e.g., height) ranging from approximately 1 nm to approximately 100 nm.

Second quantum well layer 610 can be epitaxially grown on first quantum well layer 608. Second quantum well layer 610 can host *Majorana* fermions as described above with reference to FIGS. 1-5. In an embodiment, second quantum well layer 610 can be formed using, for instance, silicon (Si), strontium ruthenate ($Sr_2RuO_4$), uranium telluride ($UTe_2$), indium arsenide (InAs), magnetically doped $(Bi_{1-x}Sb_x)_2Te_3$, and/or another material. These examples of materials are not intended to be limiting. From this disclosure those of ordinary skill in the art will be able to conceive of many other materials suitable for forming second quantum well layer 610 and the same are contemplated within the scope of the illustrative embodiments. Second quantum well layer 610 can comprise a thickness (e.g., height) ranging from approximately 2 nm to approximately 50 nm.

Third quantum well layer 612, an epitaxial semiconductor, can be epitaxially grown on second quantum well layer 610. Materials for third quantum well layer 612 can be selected based on the composition of second quantum well layer 610, to provide crystal quality above a particular quality threshold. In one embodiment, third quantum well layer 612 can be formed using a certain composition of silicon-germanium (SiGe), indium gallium arsenide (InGaAs), and/or indium aluminum arsenide (InAlAs) to match the crystal lattice of one or more layers adjacent to third quantum well layer 612. In one embodiment, third quantum well layer 612 can comprise a gradual change in composition from the interface with second quantum well layer 610 to the interface with epitaxial layer 614 to avoid creating crystal defects (e.g. dislocations) in third quantum well layer 612. In one embodiment, the gradual change in composition can be a linear change. These examples of materials are not intended to be limiting. From this disclosure those of ordinary skill in the art will be able to conceive of many other materials suitable for forming third quantum well layer 612 and the same are contemplated within the scope of the illustrative embodiments. Third quantum well layer 612 can comprise a thickness (e.g., height) ranging from approximately 1 nm to approximately 100 nm.

In some embodiments, first quantum well layer 608 and/or third quantum well layer 612 can each comprise an epitaxial film comprising a certain composition of silicon-germanium (SiGe). For example, first quantum well layer 608 and/or third quantum well layer 612 can each comprise an epitaxial film comprising a certain composition of silicon-germanium (SiGe), where the amount of germanium (Ge) in such a certain composition of silicon-germanium (SiGe) can be approximately equal to or greater than 30 percent (30%). In other embodiments, first quantum well layer 608 and/or third quantum well layer 612 can each comprise an epitaxial film comprising a composition of silicon-germanium (SiGe) that is different from that of one or more of the other epitaxial films. For example, in an embodiment, first quantum well layer 608 can comprise an epitaxial film comprising a first composition of silicon-germanium (SiGe) and third quantum well layer 612 can comprise an epitaxial film comprising a second composition of silicon-germanium (SiGe) that is different from that of the first composition of silicon-germanium (SiGe) in first quantum well layer 608.

First quantum well layer 608 and third quantum well layer 612 can protect surfaces of second quantum well layer 610 from damage during fabrication. A damaged portion of second quantum well layer 610 could degrade device properties.

Device 600 can further comprise an epitaxial layer 614 that can be deposited on third quantum well layer 612 using one or more material deposition techniques defined above (e.g., evaporation techniques, sputtering techniques, CVD, ALD, PVD, MBE, ECD, epitaxial deposition, etc.). In an example, epitaxial layer 614 can be formed on third quantum well layer 612 using the epitaxial film growth process (e.g., epitaxial deposition) described above. Epitaxial layer 614 can be formed using, for instance, silicon (Si). Epitaxial layer 614 can comprise a thickness (e.g., height) ranging from approximately 30 nm to approximately 200 nm.

Device 600 can further comprise a dielectric layer 616 that can be deposited on epitaxial layer 614 using one or more material deposition techniques defined above (e.g., evaporation techniques, sputtering techniques, CVD, ALD, PVD, MBE, ECD, epitaxial deposition, etc.). Dielectric layer 616 can be formed using, for instance, a silicon oxide (e.g., silicon dioxide ($SiO_2$). Dielectric layer 616 can comprise a thickness (e.g., height) ranging from approximately 10 nm to approximately 40 nm.

Figure 7:
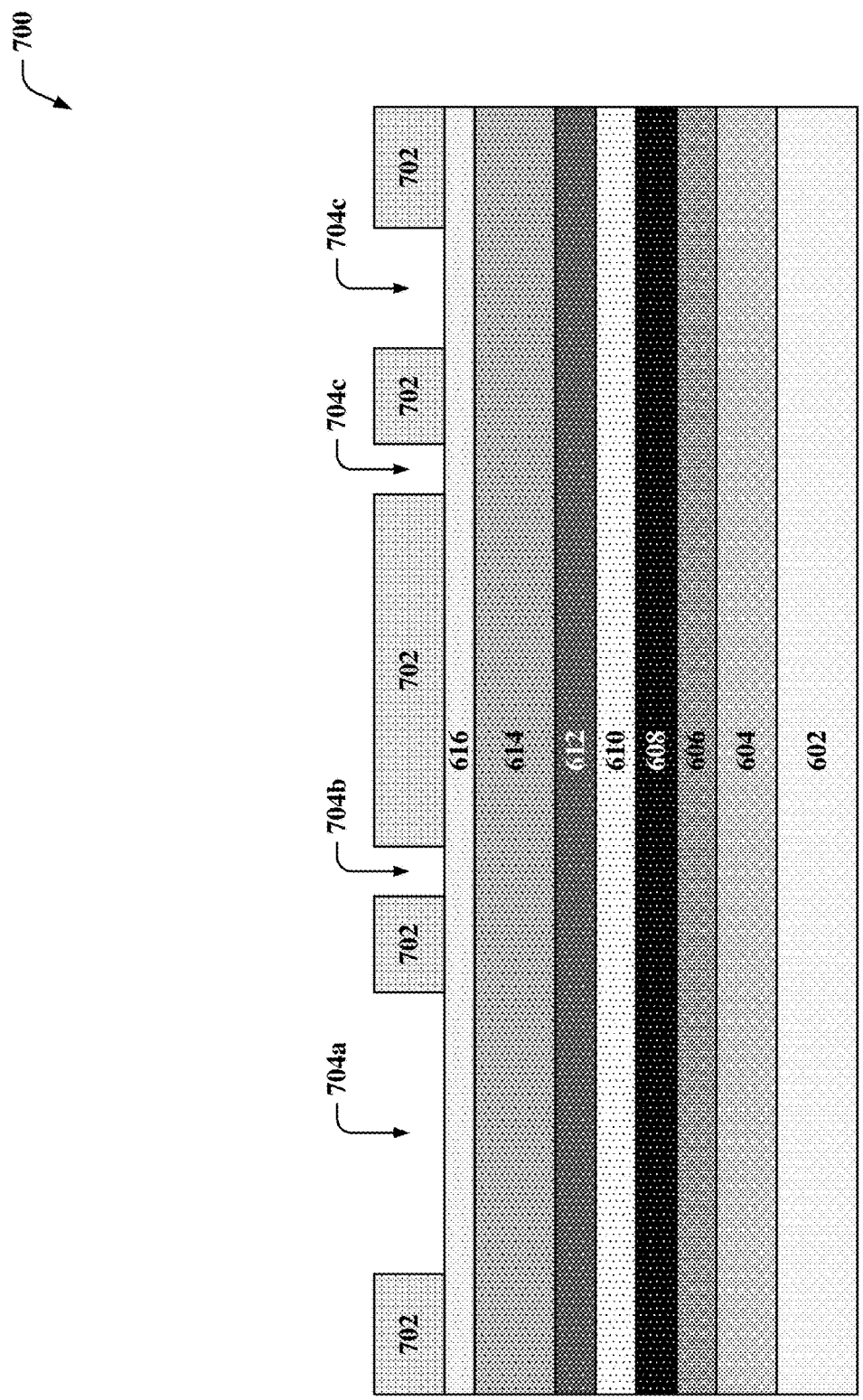
FIG. 7 illustrates a cross-sectional side view of the example, non-limiting device of FIG. 6 after forming a resist layer in accordance with one or more embodiments described herein.

FIG. 7 illustrates a cross-sectional side view of the example, non-limiting device 600 of FIG. 6 after forming a resist layer in accordance with one or more embodiments described herein. Repetitive description of like elements and/or processes employed in other embodiments described herein is omitted for sake of brevity.

Device 700 can comprise an example, non-limiting alternative embodiment of device 600 after formation of a resist layer 702 on dielectric layer 616 to form voids 704a, 704b, 704c as illustrated in FIG. 7. Resist layer 702 can comprise a photoresist material that can be formed on dielectric layer 616 using one or more photolithography, patterning, and/or photoresist techniques defined above (e.g., a lithographic patterning process). Resist layer 702 can comprise a photoresist including, but not limited to, a positive-tone photoresist, a negative-tone photoresist, a hybrid-tone photoresist, and/or another photoresist.

Figure 8:
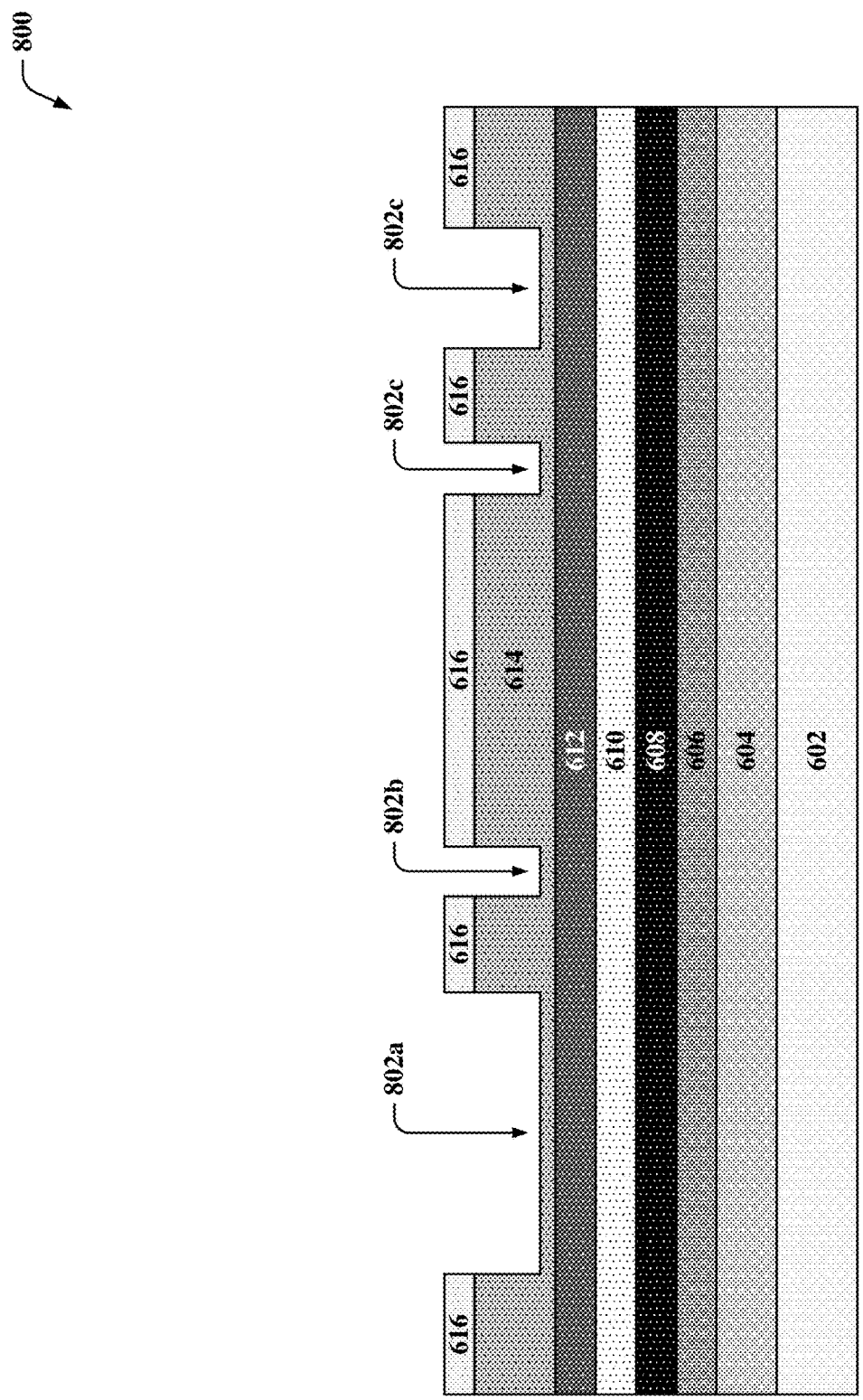
FIG. 8 illustrates a cross-sectional side view of the example, non-limiting device of FIG. 7 after etching voids into the device and removing the resist layer in accordance with one or more embodiments described herein.

FIG. 8 illustrates a cross-sectional side view of the example, non-limiting device 700 of FIG. 7 after etching voids into device 700 and removing the resist layer in accordance with one or more embodiments described herein. Repetitive description of like elements and/or processes employed in other embodiments described herein is omitted for sake of brevity.

Device 800 can comprise an example, non-limiting alternative embodiment of device 700 after etching voids 802a, 802b, 802c into epitaxial layer 614 and dielectric layer 616 as illustrated in FIG. 8 and removing resist layer 702. Voids 802a, 802b, 802c can be etched into epitaxial layer 614 and dielectric layer 616 using one or more etching techniques (e.g., reactive ion etching (RIE), dry etching, wet etching, ion beam etching, plasma etching, laser ablation, etc.). Resist layer 702 can be removed using a lift off technique (e.g., washing with a solvent, stripping, etc.).

Figure 9:
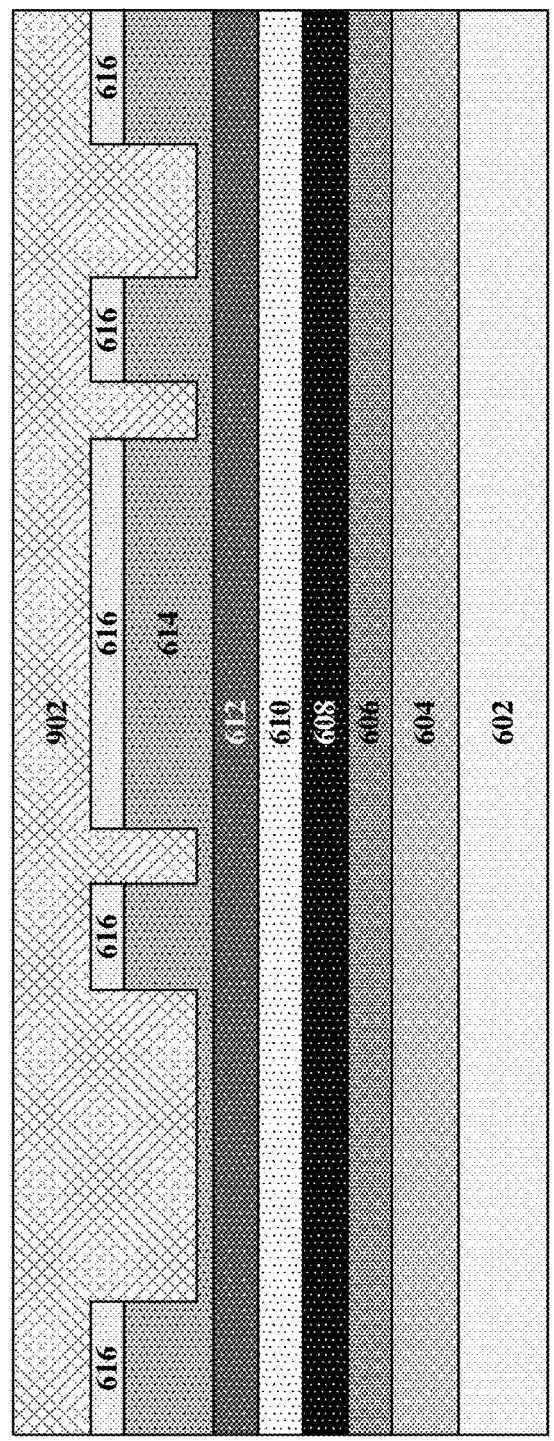
FIG. 9 illustrates a cross-sectional side view of the example, non-limiting device of FIG. 8 after depositing a superconducting layer on the device in accordance with one or more embodiments described herein.

FIG. 9 illustrates a cross-sectional side view of the example, non-limiting device 800 of FIG. 8 after depositing a superconducting layer on device 800 in accordance with one or more embodiments described herein. Repetitive description of like elements and/or processes employed in other embodiments described herein is omitted for sake of brevity.

Device 900 can comprise an example, non-limiting alternative embodiment of device 800 after depositing a superconducting layer 902 on device 800 as illustrated in FIG. 9 (e.g., onto dielectric layer 616 and onto the exposed surfaces of epitaxial layer 614 in voids 802a, 802b, 802c). Superconducting layer 902 can be deposited on device 800 (e.g., onto dielectric layer 616 and onto the exposed surfaces of epitaxial layer 614 in voids 802a, 802b, 802c) using one or more material deposition techniques defined above (e.g., evaporation techniques, sputtering techniques, CVD, ALD, PVD, MBE, ECD, epitaxial deposition, etc.). Superconducting layer 902 can be formed using a superconducting material including, but not limited to, niobium (Nb), tantalum (Ta), tantalum nitride (TaN), titanium (Ti), titanium nitride (TiN) and/or another superconducting material. Superconducting layer 902 can comprise a thickness (e.g., height) ranging from approximately 30 nm to approximately 400 nm. Superconducting layer 902 can be deposited on device 800 as described above and illustrated in FIG. 9 to form control components such as, for instance, control components 1002a, 1002b, 1002c as described below and illustrated in FIG. 10.

Figure 10:
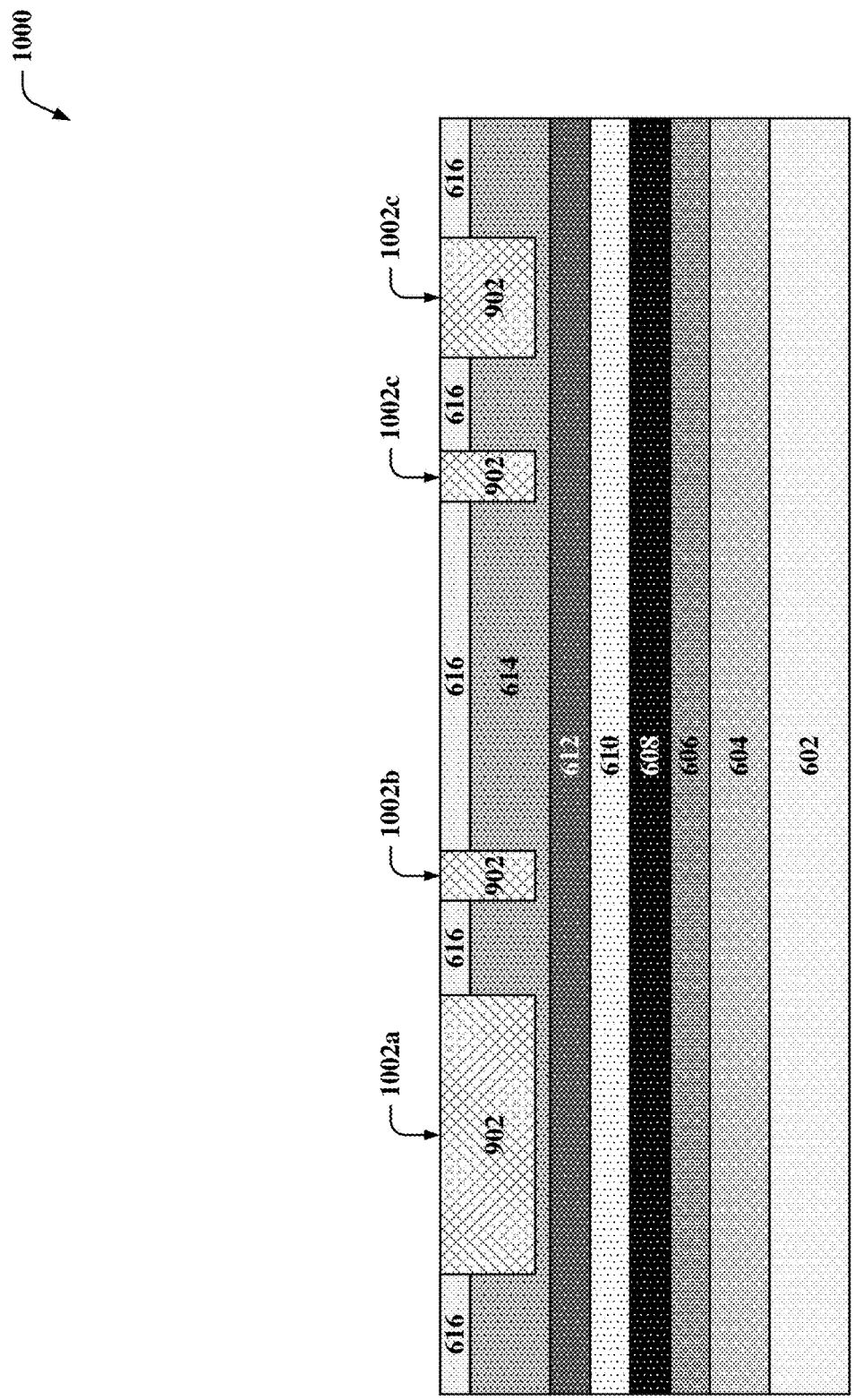
FIG. 10 illustrates a cross-sectional side view of the example, non-limiting device of FIG. 9 after removing portions of the superconducting layer from the device in accordance with one or more embodiments described herein.

FIG. 10 illustrates a cross-sectional side view of the example, non-limiting device 900 of FIG. 9 after removing portions of the superconducting layer from device 900 in accordance with one or more embodiments described herein. Repetitive description of like elements and/or processes employed in other embodiments described herein is omitted for sake of brevity.

Device 1000 can comprise an example, non-limiting alternative embodiment of device 900 after removing portions of superconducting layer 902 from device 900 as illustrated in FIG. 10 to form control components 1002a, 1002b, 1002c. Such portions of superconducting layer 902 can be removed using chemical-mechanical planarization (CMP). Control components 1002a, 1002b, 1002c can comprise control components of circuit layer 106 described above with reference to FIGS. 1, 2, and 3. In an example, control component 1002a can comprise a chemical potential gate (e.g., chemical potential gate 204b described above with reference to FIGS. 2 and 3). In another example, control component 1002b can comprise a pinch gate (e.g., pinch gate 204a described above with reference to FIGS. 2 and 3). In another example, control components 1002c can comprise a Josephson junction (JJ) gate (e.g., the Josephson junction (JJ) gate and/or the Josephson junction (JJ) sensing gate described above with reference to FIG. 1).

Figure 11:
FIG. 11 illustrates a cross-sectional side view of the example, non-limiting device of FIG. 10 after depositing a dielectric layer on the device in accordance with one or more embodiments described herein.

FIG. 11 illustrates a cross-sectional side view of the example, non-limiting device 1000 of FIG. 10 after depositing a dielectric layer on device 1000 in accordance with one or more embodiments described herein. Repetitive description of like elements and/or processes employed in other embodiments described herein is omitted for sake of brevity.

Device 1100 can comprise an example, non-limiting alternative embodiment of device 1000 after depositing a dielectric layer 1102 on device 1000 as illustrated in FIG. 11 (e.g., onto dielectric layer 616 and onto control components 1002a, 1002b, 1002c). Dielectric layer 1102 can be deposited on device 1000 (e.g., onto dielectric layer 616 and onto control components 1002a, 1002b, 1002c) using one or more material deposition techniques defined above (e.g., evaporation techniques, sputtering techniques, CVD, ALD, PVD, MBE, ECD, epitaxial deposition, etc.). Dielectric layer 1102 can be formed using, for instance, an amorphous silicon (Si). Dielectric layer 1102 can comprise a thickness (e.g., height) ranging from approximately 30 nm to approximately 200 nm.

Figure 12:
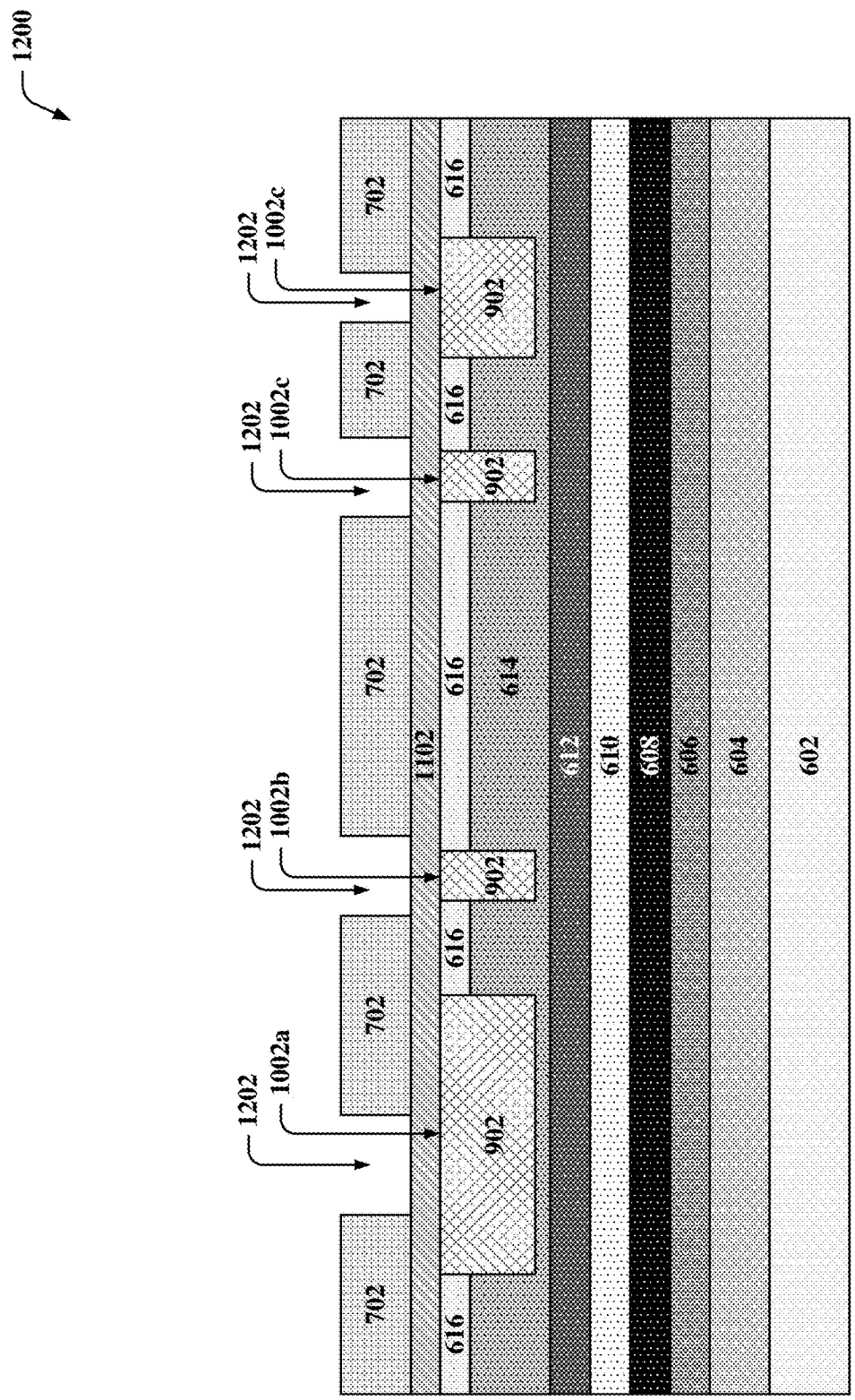
FIG. 12 illustrates a cross-sectional side view of the example, non-limiting device of FIG. 11 after forming a resist layer on the device in accordance with one or more embodiments described herein.

FIG. 12 illustrates a cross-sectional side view of the example, non-limiting device 1100 of FIG. 11 after forming a resist layer on device 1100 in accordance with one or more embodiments described herein. Repetitive description of like elements and/or processes employed in other embodiments described herein is omitted for sake of brevity.

Device 1200 can comprise an example, non-limiting alternative embodiment of device 1100 after formation of resist layer 702 on dielectric layer 1102 of device 1100 to form voids 1202 as illustrated in FIG. 12. Resist layer 702 can comprise a photoresist material that can be formed on dielectric layer 1102 of device 1100 using one or more photolithography, patterning, and/or photoresist techniques defined above (e.g., a lithographic patterning process).

Resist layer 702 can comprise a photoresist including, but not limited to, a positive-tone photoresist, a negative-tone photoresist, a hybrid-tone photoresist, and/or another photoresist.

Figure 13:
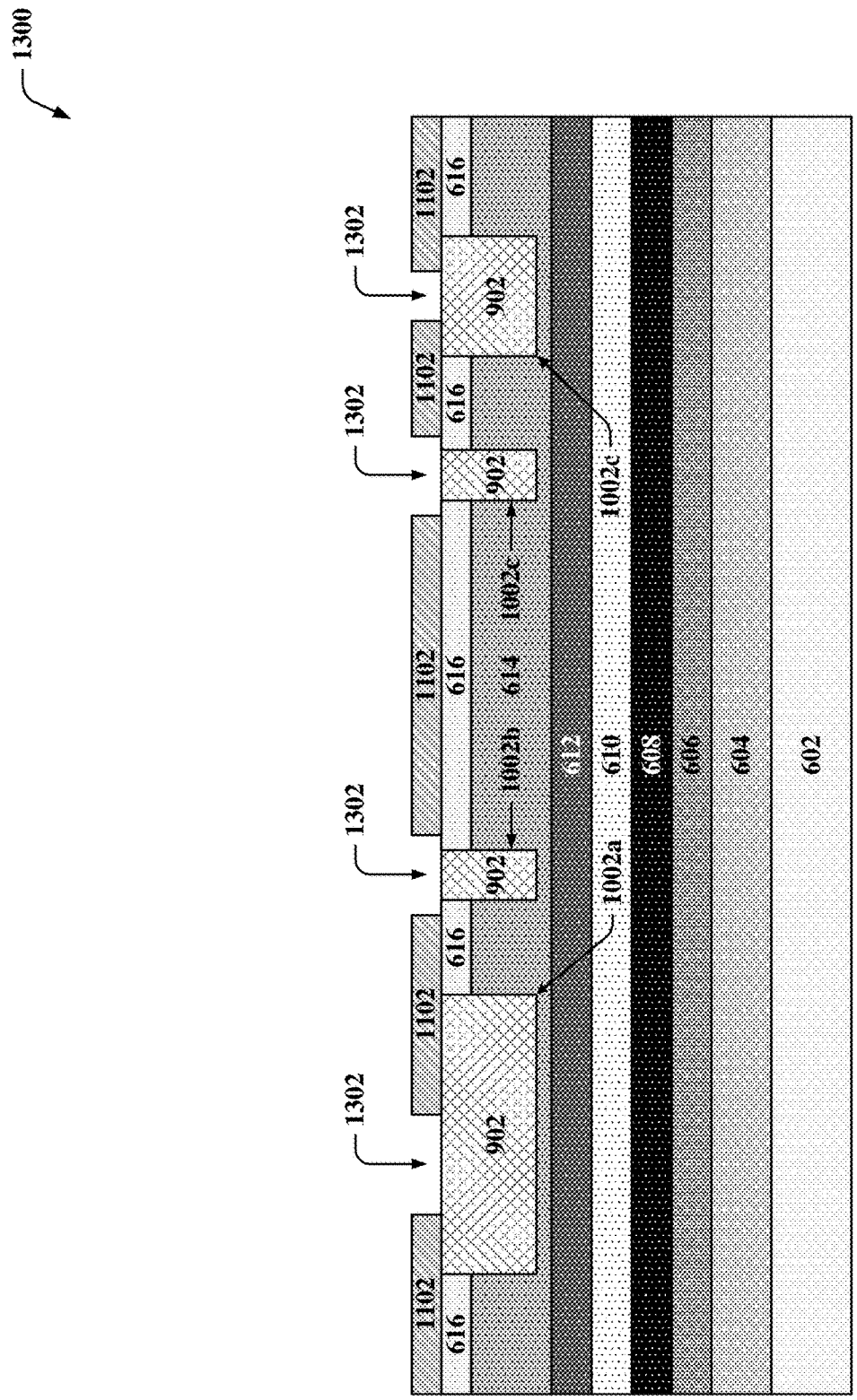
FIG. 13 illustrates a cross-sectional side view of the example, non-limiting device of FIG. 12 after etching voids into the device and removing the resist layer in accordance with one or more embodiments described herein.

FIG. 13 illustrates a cross-sectional side view of the example, non-limiting device 1200 of FIG. 12 after etching voids into device 1200 and removing the resist layer in accordance with one or more embodiments described herein. Repetitive description of like elements and/or processes employed in other embodiments described herein is omitted for sake of brevity.

Device 1300 can comprise an example, non-limiting alternative embodiment of device 1200 after etching voids 1302 into dielectric layer 1102 of device 1200 as illustrated in FIG. 13 and removing resist layer 702. Voids 1302 can be etched into dielectric layer 1102 of device 1200 using one or more etching techniques (e.g., reactive ion etching (RIE), dry etching, wet etching, ion beam etching, plasma etching, laser ablation, etc.). Resist layer 702 can be removed using a lift off technique (e.g., washing with a solvent, stripping, etc.).

Figure 14:
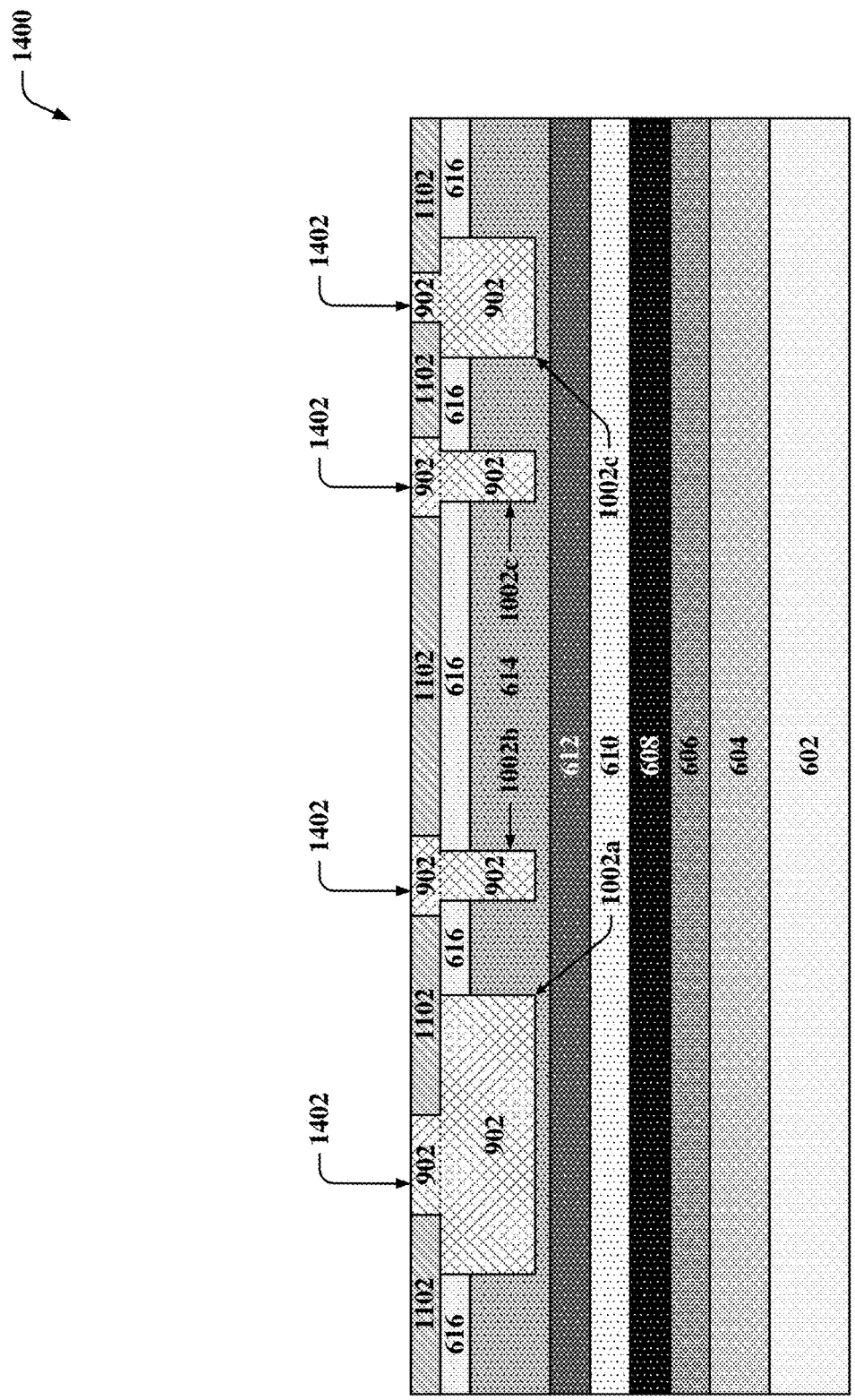
FIG. 14 illustrates a cross-sectional side view of the example, non-limiting device of FIG. 13 after depositing a superconducting layer on the device to form through-silicon vias in accordance with one or more embodiments described herein.

FIG. 14 illustrates a cross-sectional side view of the example, non-limiting device 1300 of FIG. 13 after depositing a superconducting layer on device 1300 to form through-silicon vias (TSV) in accordance with one or more embodiments described herein. Repetitive description of like elements and/or processes employed in other embodiments described herein is omitted for sake of brevity.

Device 1400 can comprise an example, non-limiting alternative embodiment of device 1300 after depositing superconducting layer 902 on device 1300 as illustrated in FIG. 14 (e.g., onto the exposed surfaces of dielectric layer 1102 and control components 1002a, 1002b, 1002c in voids 1302). Superconducting layer 902 can be deposited on device 1300 (e.g., onto the exposed surfaces of dielectric layer 1102 and control components 1002a, 1002b, 1002c in voids 1302) using one or more material deposition techniques defined above (e.g., evaporation techniques, sputtering techniques, CVD, ALD, PVD, MBE, ECD, epitaxial deposition, etc.). Superconducting layer 902 can be formed using a superconducting material including, but not limited to, niobium (Nb), tantalum (Ta), tantalum nitride (TaN), titanium (Ti), titanium nitride (TiN) and/or another superconducting material. Superconducting layer 902 can comprise a thickness (e.g., height) ranging from approximately 30 nm to approximately 300 nm.

Based on such deposition of superconducting layer 902 on device 1300 as described above, portions of superconducting layer 902 can be removed from device 1300 using chemical-mechanical planarization (CMP) to form through-silicon vias (TSV) 1402 of device 1400 illustrated in FIG. 14. In an example, through-silicon vias (TSV) 1402 can comprise the through-silicon vias (TSV) of wiring layer 104 described above with reference to FIG. 1.

Figure 15:
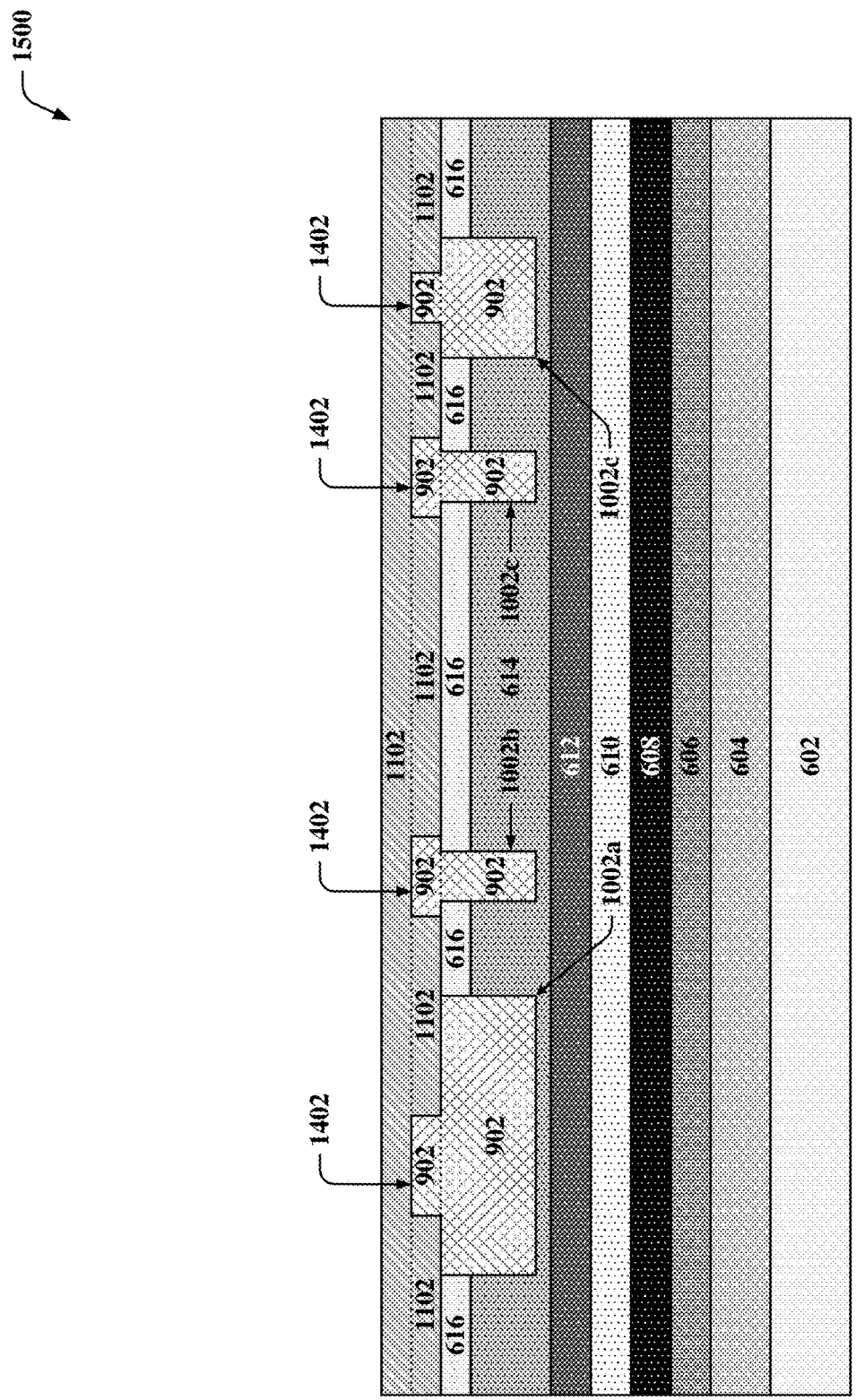
FIG. 15 illustrates a cross-sectional side view of the example, non-limiting device of FIG. 14 after depositing a dielectric layer on the device in accordance with one or more embodiments described herein.

FIG. 15 illustrates a cross-sectional side view of the example, non-limiting device 1400 of FIG. 14 after depositing a dielectric layer on device 1400 in accordance with one or more embodiments described herein. Repetitive description of like elements and/or processes employed in other embodiments described herein is omitted for sake of brevity.

Device 1500 can comprise an example, non-limiting alternative embodiment of device 1400 after depositing dielectric layer 1102 on device 1400 as illustrated in FIG. 15 (e.g., onto dielectric layer 1102 of device 1400 and onto through-silicon vias (TSV) 1402). Dielectric layer 1102 can be deposited on device 1400 (e.g., onto dielectric layer 1102 of device 1400 and onto through-silicon vias (TSV) 1402) using one or more material deposition techniques defined above (e.g., evaporation techniques, sputtering techniques, CVD, ALD, PVD, MBE, ECD, epitaxial deposition, etc.). Dielectric layer 1102 can be formed using, for instance, an amorphous silicon (Si). Dielectric layer 1102 can comprise a thickness (e.g., height) ranging from approximately 30 nm to approximately 200 nm.

Figure 16:
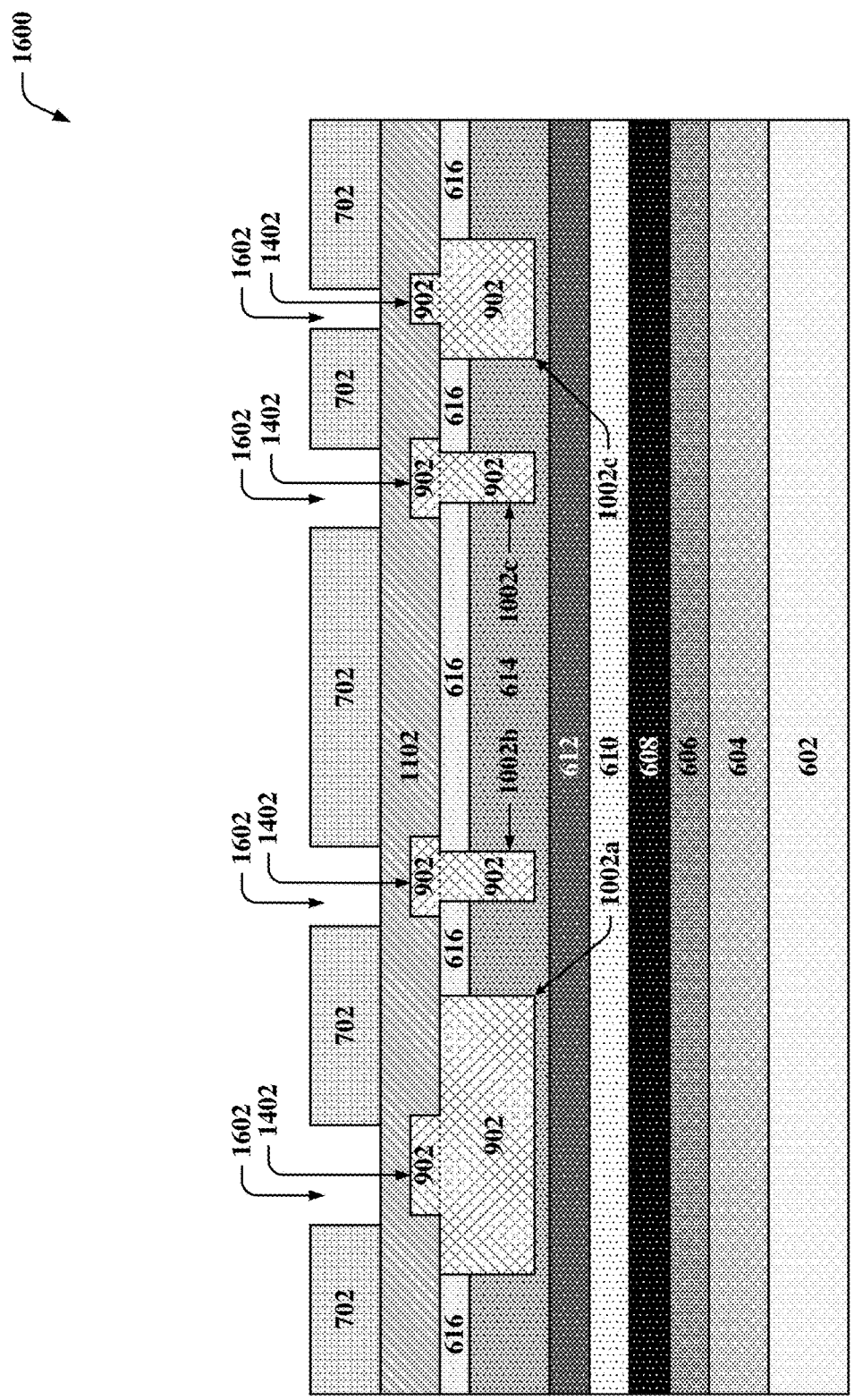
FIG. 16 illustrates a cross-sectional side view of the example, non-limiting device of FIG. 15 after forming a resist layer on the device in accordance with one or more embodiments described herein.

FIG. 16 illustrates a cross-sectional side view of the example, non-limiting device 1500 of FIG. 15 after forming a resist layer on device 1500 in accordance with one or more embodiments described herein. Repetitive description of like elements and/or processes employed in other embodiments described herein is omitted for sake of brevity.

Device 1600 can comprise an example, non-limiting alternative embodiment of device 1500 after formation of resist layer 702 on dielectric layer 1102 of device 1500 to form voids 1602 as illustrated in FIG. 16. Resist layer 702 can comprise a photoresist material that can be formed on dielectric layer 1102 of device 1500 using one or more photolithography, patterning, and/or photoresist techniques defined above (e.g., a lithographic patterning process). Resist layer 702 can comprise a photoresist including, but not limited to, a positive-tone photoresist, a negative-tone photoresist, a hybrid-tone photoresist, and/or another photoresist.

Figure 17:
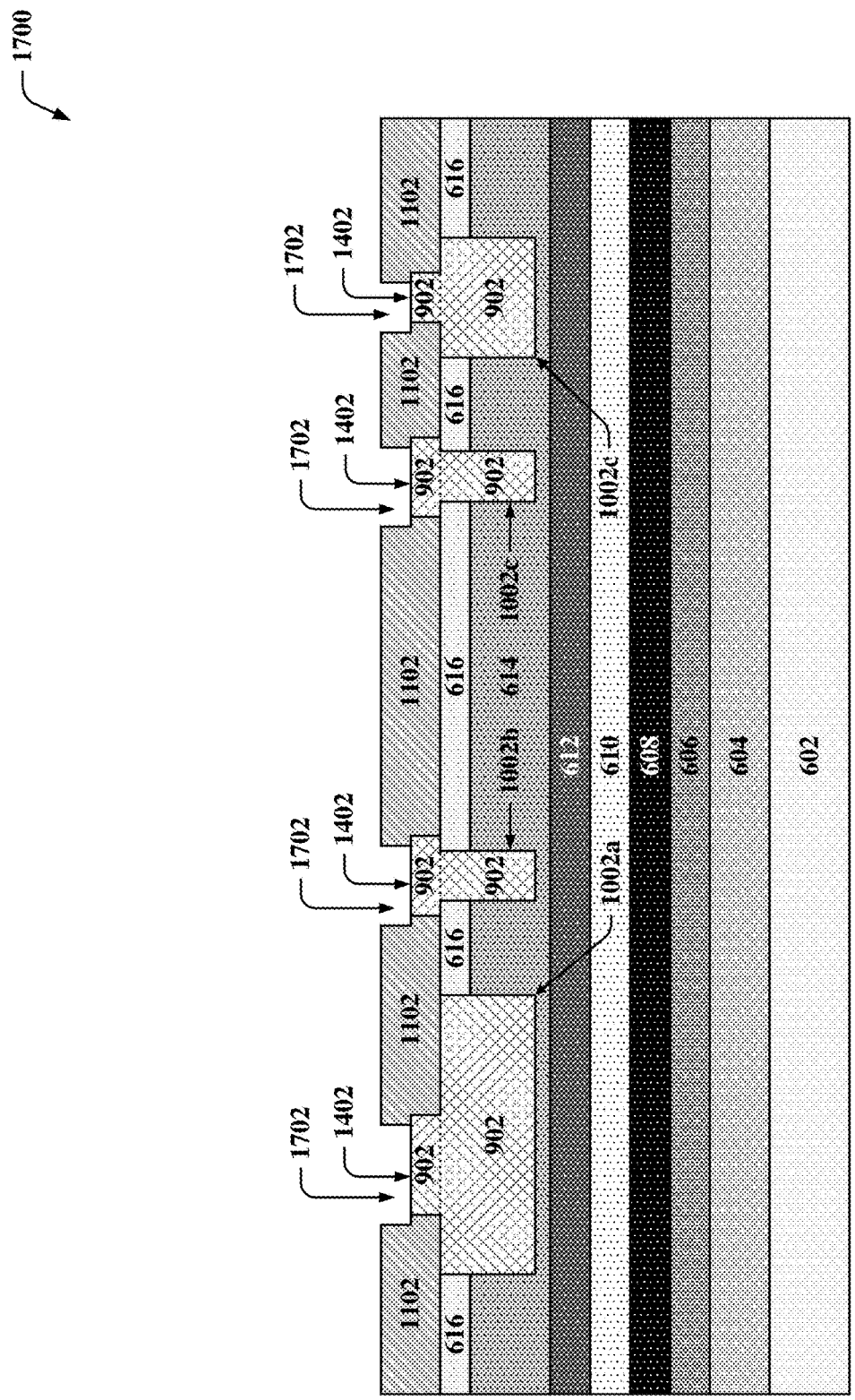
FIG. 17 illustrates a cross-sectional side view of the example, non-limiting device of FIG. 16 after etching voids into the device and removing the resist layer in accordance with one or more embodiments described herein.

FIG. 17 illustrates a cross-sectional side view of the example, non-limiting device 1600 of FIG. 16 after etching voids into device 1600 and removing the resist layer in accordance with one or more embodiments described herein. Repetitive description of like elements and/or processes employed in other embodiments described herein is omitted for sake of brevity.

Device 1700 can comprise an example, non-limiting alternative embodiment of device 1600 after etching voids 1702 into dielectric layer 1102 of device 1600 as illustrated in FIG. 17 and removing resist layer 702. Voids 1702 can be etched into dielectric layer 1102 of device 1600 using one or more etching techniques (e.g., reactive ion etching (RIE), dry etching, wet etching, ion beam etching, plasma etching, laser ablation, etc.). Resist layer 702 can be removed using a lift off technique (e.g., washing with a solvent, stripping, etc.).

Figure 18:
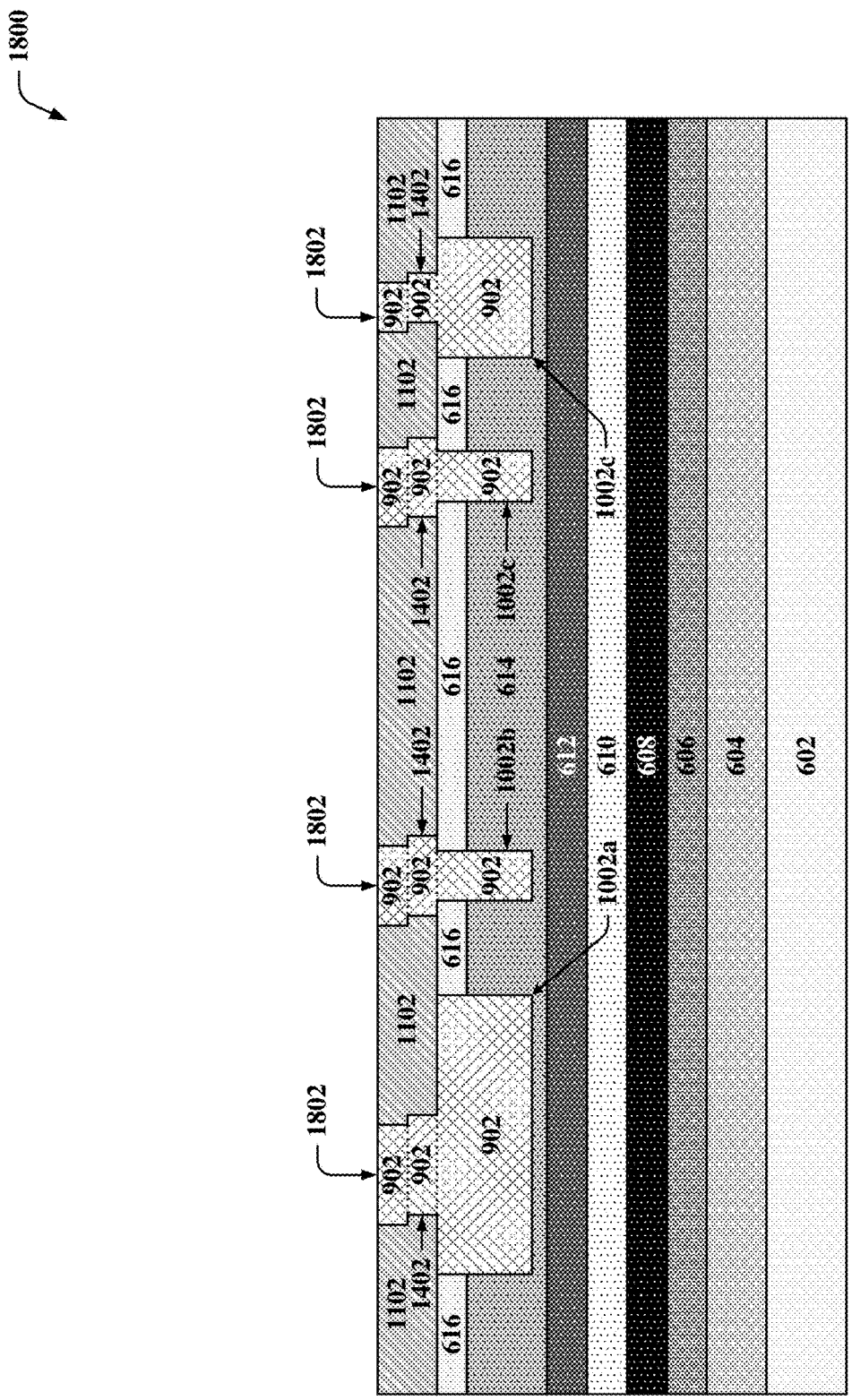
FIG. 18 illustrates a cross-sectional side view of the example, non-limiting device of FIG. 17 after depositing a superconducting layer on the device to form planar wires in accordance with one or more embodiments described herein.

FIG. 18 illustrates a cross-sectional side view of the example, non-limiting device 1700 of FIG. 17 after depositing a superconducting layer on device 1700 to form planar wires in accordance with one or more embodiments described herein. Repetitive description of like elements and/or processes employed in other embodiments described herein is omitted for sake of brevity.

Device 1800 can comprise an example, non-limiting alternative embodiment of device 1700 after depositing superconducting layer 902 on device 1700 as illustrated in FIG. 18 (e.g., onto the exposed surfaces of dielectric layer 1102 of device 1700 and through-silicon vias (TSV) 1402 in voids 1702). Superconducting layer 902 can be deposited on device 1700 (e.g., onto the exposed surfaces of dielectric layer 1102 of device 1700 and through-silicon vias (TSV) 1402 in voids 1702) using one or more material deposition techniques defined above (e.g., evaporation techniques, sputtering techniques, CVD, ALD, PVD, MBE, ECD, epitaxial deposition, etc.). Superconducting layer 902 can be formed using a superconducting material including, but not limited to, niobium (Nb), tantalum (Ta), tantalum nitride (TaN), titanium (Ti), titanium nitride (TiN) and/or another superconducting material. Superconducting layer 902 can comprise a thickness (e.g., height) ranging from approximately 30 nm to approximately 250 nm.

Based on such deposition of superconducting layer 902 on device 1700 as described above, portions of superconducting layer 902 can be removed from device 1700 using chemical-mechanical planarization (CMP) to form planar wires 1802 of device 1800 illustrated in FIG. 18, where planar wires 1802 extend into and out of the page of FIG. 18. In an example, planar wires 1802 can comprise the planar wires of wiring layer 104 described above with reference to FIGS. 1 and 3 and/or planar wires 302 described above and illustrated in FIG. 3.

Figure 19:
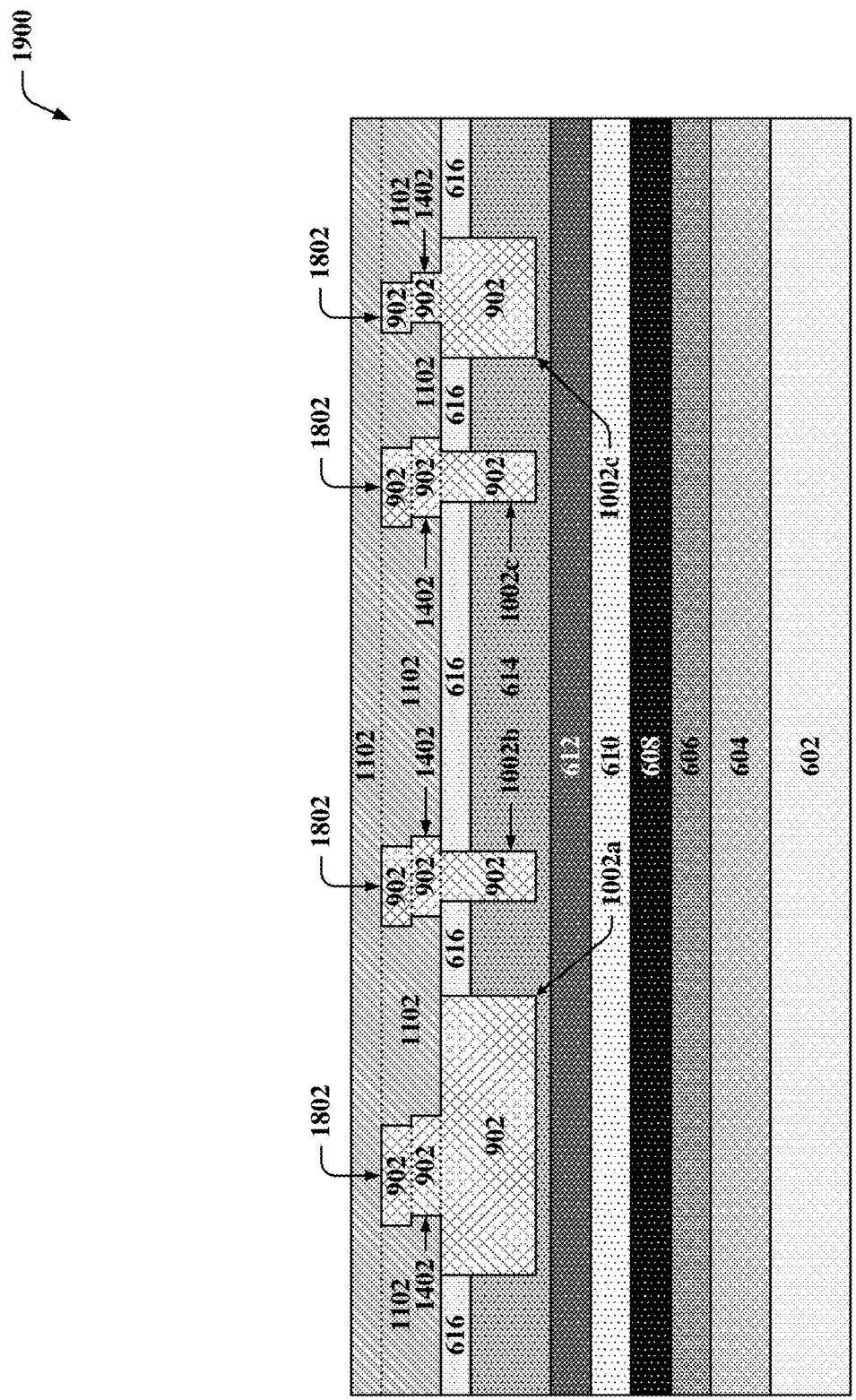
FIG. 19 illustrates a cross-sectional side view of the example, non-limiting device of FIG. 18 after depositing a dielectric layer on the device in accordance with one or more embodiments described herein.

FIG. 19 illustrates a cross-sectional side view of the example, non-limiting device 1800 of FIG. 18 after depositing a dielectric layer on device 1800 in accordance with one or more embodiments described herein. Repetitive description of like elements and/or processes employed in other embodiments described herein is omitted for sake of brevity.

Device 1900 can comprise an example, non-limiting alternative embodiment of device 1800 after depositing dielectric layer 1102 on device 1800 as illustrated in FIG. 19 (e.g., onto dielectric layer 1102 of device 1800 and onto planar wires 1802). Dielectric layer 1102 can be deposited on device 1800 (e.g., onto dielectric layer 1102 of device 1800 and onto planar wires 1802) using one or more material deposition techniques defined above (e.g., evaporation techniques, sputtering techniques, CVD, ALD, PVD, MBE, ECD, epitaxial deposition, etc.). Dielectric layer 1102 can be formed using, for instance, an amorphous silicon (Si). Dielectric layer 1102 can comprise a thickness (e.g., height) ranging from approximately 30 nm to approximately 200 nm.

Figure 20:
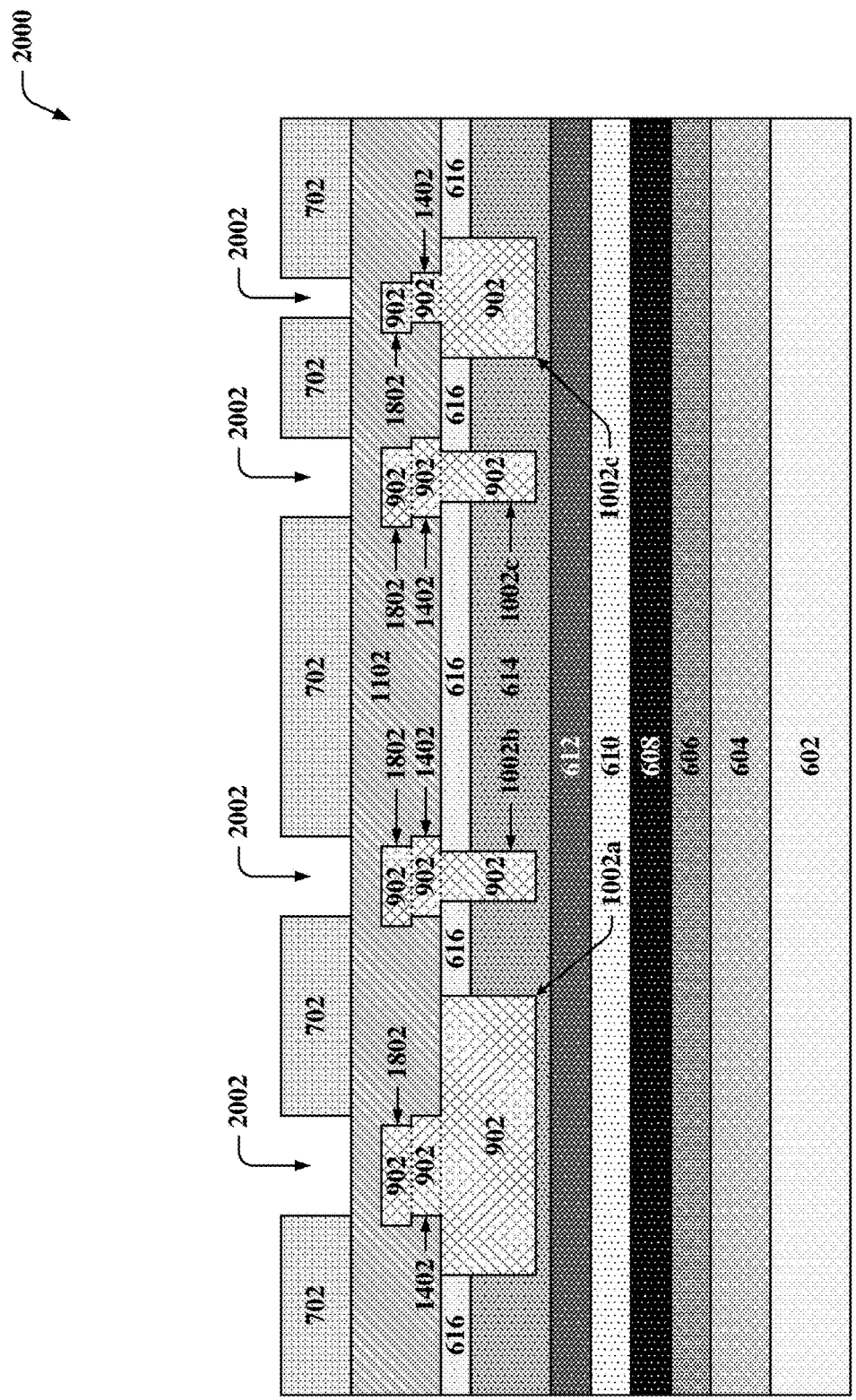
FIG. 20 illustrates a cross-sectional side view of the example, non-limiting device of FIG. 19 after forming a resist layer on the device in accordance with one or more embodiments described herein.

FIG. 20 illustrates a cross-sectional side view of the example, non-limiting device 1900 of FIG. 19 after forming a resist layer on device 1900 in accordance with one or more embodiments described herein. Repetitive description of like elements and/or processes employed in other embodiments described herein is omitted for sake of brevity.

Device 2000 can comprise an example, non-limiting alternative embodiment of device 1900 after formation of resist layer 702 on dielectric layer 1102 of device 1900 to form voids 2002 as illustrated in FIG. 20. Resist layer 702 can comprise a photoresist material that can be formed on dielectric layer 1102 of device 1900 using one or more photolithography, patterning, and/or photoresist techniques defined above (e.g., a lithographic patterning process). Resist layer 702 can comprise a photoresist including, but not limited to, a positive-tone photoresist, a negative-tone photoresist, a hybrid-tone photoresist, and/or another photoresist.

Figure 21:
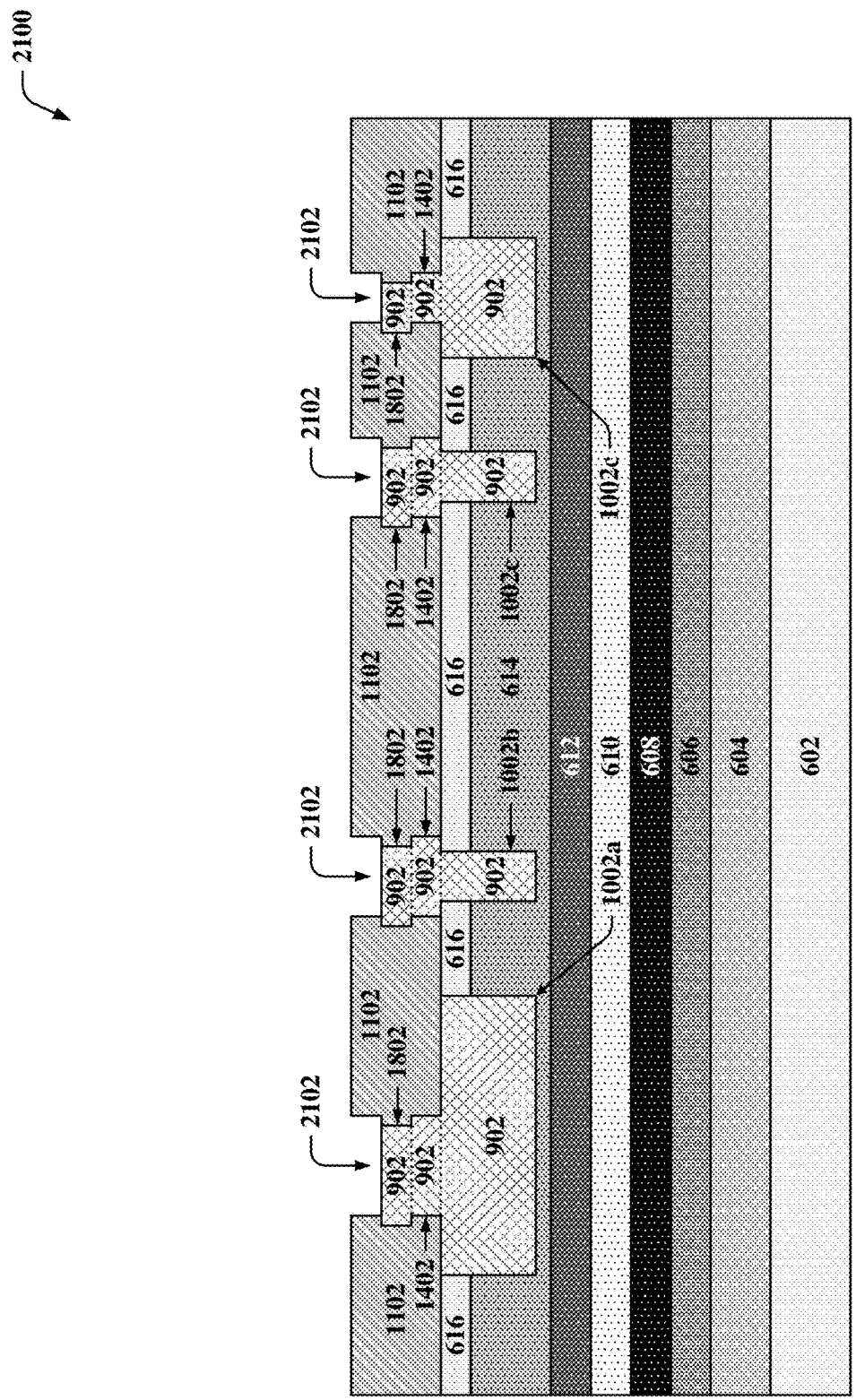
FIG. 21 illustrates a cross-sectional side view of the example, non-limiting device of FIG. 20 after etching voids into the device and removing the resist layer in accordance with one or more embodiments described herein.

FIG. 21 illustrates a cross-sectional side view of the example, non-limiting device 2000 of FIG. 20 after etching voids into device 2000 and removing the resist layer in accordance with one or more embodiments described herein. Repetitive description of like elements and/or processes employed in other embodiments described herein is omitted for sake of brevity.

Device 2100 can comprise an example, non-limiting alternative embodiment of device 2000 after etching voids 2102 into dielectric layer 1102 of device 2000 as illustrated in FIG. 21 and removing resist layer 702. Voids 2102 can be etched into dielectric layer 1102 of device 2000 using one or more etching techniques (e.g., reactive ion etching (RIE), dry etching, wet etching, ion beam etching, plasma etching, laser ablation, etc.). Resist layer 702 can be removed using a lift off technique (e.g., washing with a solvent, stripping, etc.).

Figure 22:
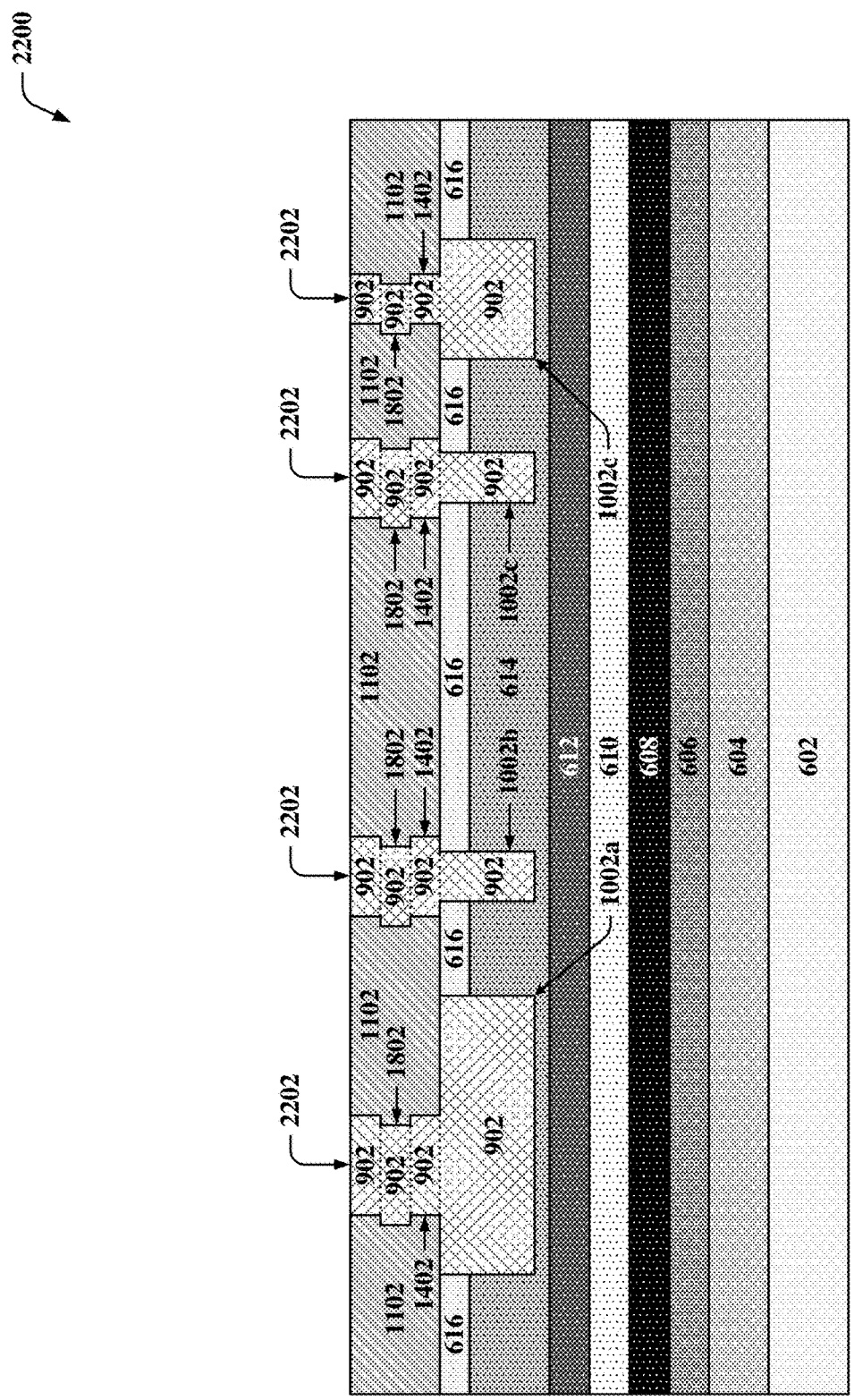
FIG. 22 illustrates a cross-sectional side view of the example, non-limiting device of FIG. 21 after depositing a superconducting layer on the device to form through-silicon vias in accordance with one or more embodiments described herein.

FIG. 22 illustrates a cross-sectional side view of the example, non-limiting device 2100 of FIG. 21 after depositing a superconducting layer on device 2100 to form through-silicon vias (TSV) in accordance with one or more embodiments described herein. Repetitive description of like elements and/or processes employed in other embodiments described herein is omitted for sake of brevity.

Device 2200 can comprise an example, non-limiting alternative embodiment of device 2100 after depositing superconducting layer 902 on device 2100 as illustrated in FIG. 22 (e.g., onto the exposed surfaces of dielectric layer 1102 of device 2100 and planar wires 1802 in voids 2102). Superconducting layer 902 can be deposited on device 2100 (e.g., onto the exposed surfaces of dielectric layer 1102 of device 2100 and planar wires 1802 in voids 2102) using one or more material deposition techniques defined above (e.g., evaporation techniques, sputtering techniques, CVD, ALD, PVD, MBE, ECD, epitaxial deposition, etc.). Superconducting layer 902 can be formed using a superconducting material including, but not limited to, niobium (Nb), tantalum (Ta), tantalum nitride (TaN), titanium (Ti), titanium nitride (TiN) and/or another superconducting material. Superconducting layer 902 can comprise a thickness (e.g., height) ranging from approximately 30 nm to approximately 250 nm.

Based on such deposition of superconducting layer 902 on device 2100 as described above, portions of superconducting layer 902 can be removed from device 2100 using chemical-mechanical planarization (CMP) to form through-silicon vias (TSV) 2202 of device 2200 illustrated in FIG. 22. In an example, through-silicon vias (TSV) 2202 can comprise the through-silicon vias (TSV) of wiring layer 104 described above with reference to FIG. 1 and/or through-silicon vias (TSV) 1402 described above and illustrated in FIG. 14.

Figure 23:
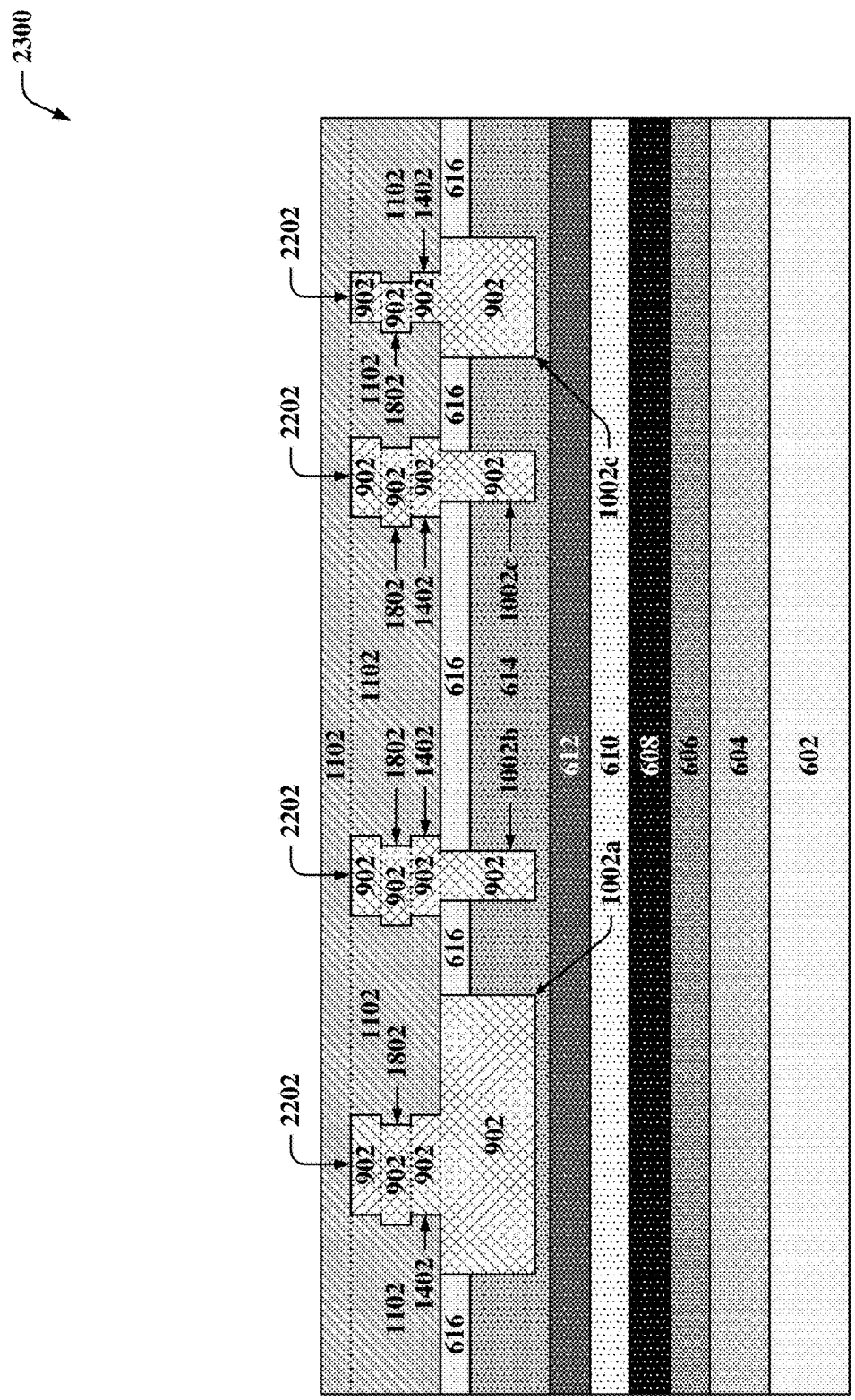
FIG. 23 illustrates a cross-sectional side view of the example, non-limiting device of FIG. 22 after depositing a dielectric layer on the device in accordance with one or more embodiments described herein.

FIG. 23 illustrates a cross-sectional side view of the example, non-limiting device 2200 of FIG. 22 after depositing a dielectric layer on device 2200 in accordance with one or more embodiments described herein. Repetitive description of like elements and/or processes employed in other embodiments described herein is omitted for sake of brevity.

Device 2300 can comprise an example, non-limiting alternative embodiment of device 2200 after depositing dielectric layer 1102 on device 2200 as illustrated in FIG. 23 (e.g., onto dielectric layer 1102 of device 2200 and onto through-silicon vias (TSV) 2202). Dielectric layer 1102 can be deposited on device 2200 (e.g., onto dielectric layer 1102 of device 2200 and onto through-silicon vias (TSV) 2202) using one or more material deposition techniques defined above (e.g., evaporation techniques, sputtering techniques, CVD, ALD, PVD, MBE, ECD, epitaxial deposition, etc.). Dielectric layer 1102 can be formed using, for instance, an amorphous silicon (Si). Dielectric layer 1102 can comprise a thickness (e.g., height) ranging from approximately 20 nm to approximately 200 nm.

Figure 24:
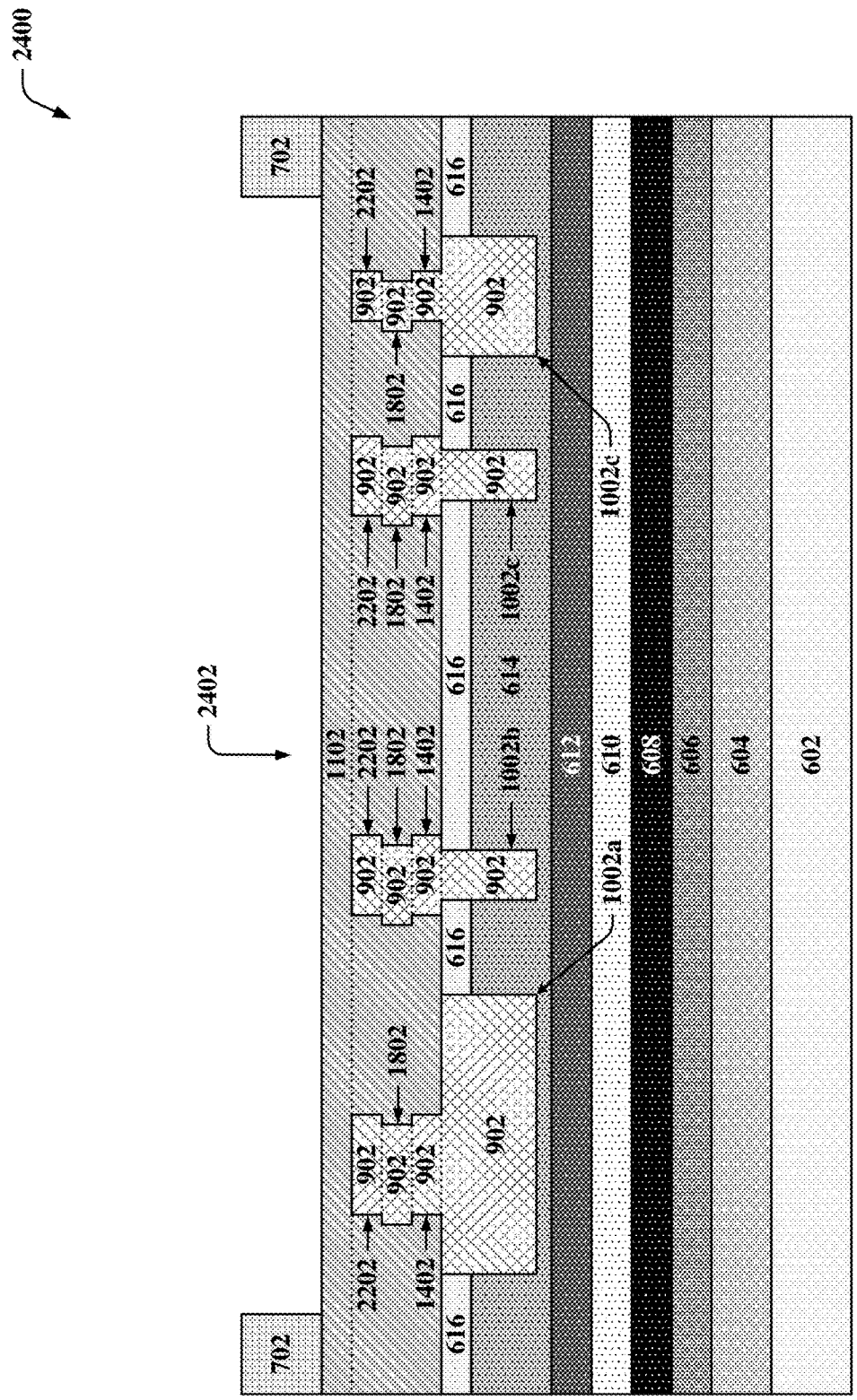
FIG. 24 illustrates a cross-sectional side view of the example, non-limiting device of FIG. 23 after forming a resist layer on the device in accordance with one or more embodiments described herein.

FIG. 24 illustrates a cross-sectional side view of the example, non-limiting device 2300 of FIG. 23 after forming a resist layer on device 2300 in accordance with one or more embodiments described herein. Repetitive description of like elements and/or processes employed in other embodiments described herein is omitted for sake of brevity.

Device 2400 can comprise an example, non-limiting alternative embodiment of device 2300 after formation of resist layer 702 on dielectric layer 1102 of device 2300 to form voids 2402 as illustrated in FIG. 24 (only a single void 2402 is depicted in FIG. 24). Resist layer 702 can comprise a photoresist material that can be formed on dielectric layer 1102 of device 2300 using one or more photolithography, patterning, and/or photoresist techniques defined above (e.g., a lithographic patterning process). Resist layer 702 can comprise a photoresist including, but not limited to, a positive-tone photoresist, a negative-tone photoresist, a hybrid-tone photoresist, and/or another photoresist.

Figure 25:
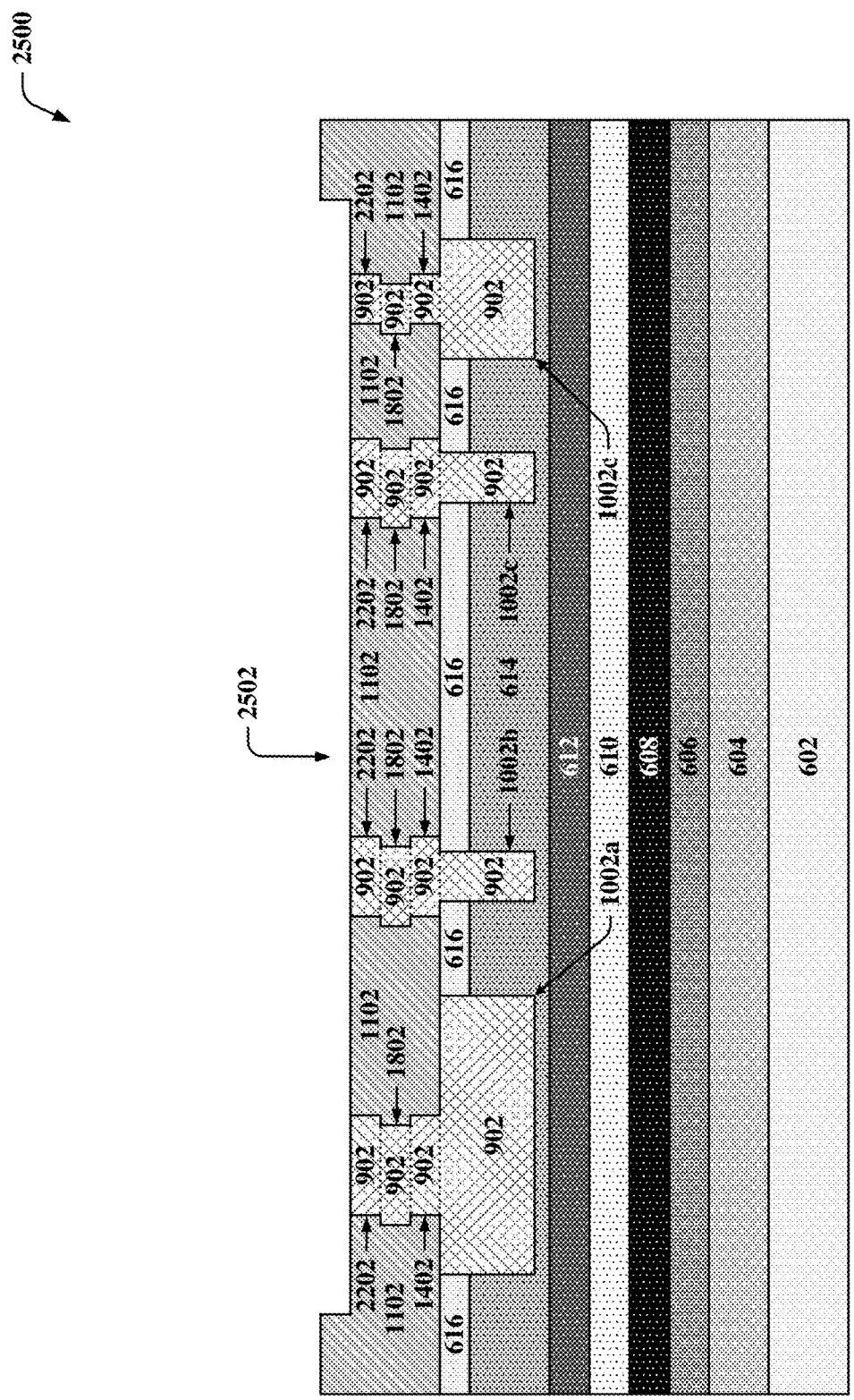
FIG. 25 illustrates a cross-sectional side view of the example, non-limiting device of FIG. 24 after etching voids into the device and removing the resist layer in accordance with one or more embodiments described herein.

FIG. 25 illustrates a cross-sectional side view of the example, non-limiting device 2400 of FIG. 24 after etching voids into device 2400 and removing the resist layer in accordance with one or more embodiments described herein. Repetitive description of like elements and/or processes employed in other embodiments described herein is omitted for sake of brevity.

Device 2500 can comprise an example, non-limiting alternative embodiment of device 2400 after etching voids 2502 into dielectric layer 1102 of device 2400 as illustrated in FIG. 25 and removing resist layer 702 (only a single void 2502 is depicted in FIG. 25). Voids 2502 can be etched into dielectric layer 1102 of device 2400 using one or more etching techniques (e.g., reactive ion etching (RIE), dry etching, wet etching, ion beam etching, plasma etching, laser ablation, etc.). Resist layer 702 can be removed using a lift off technique (e.g., washing with a solvent, stripping, etc.).

Figure 26:
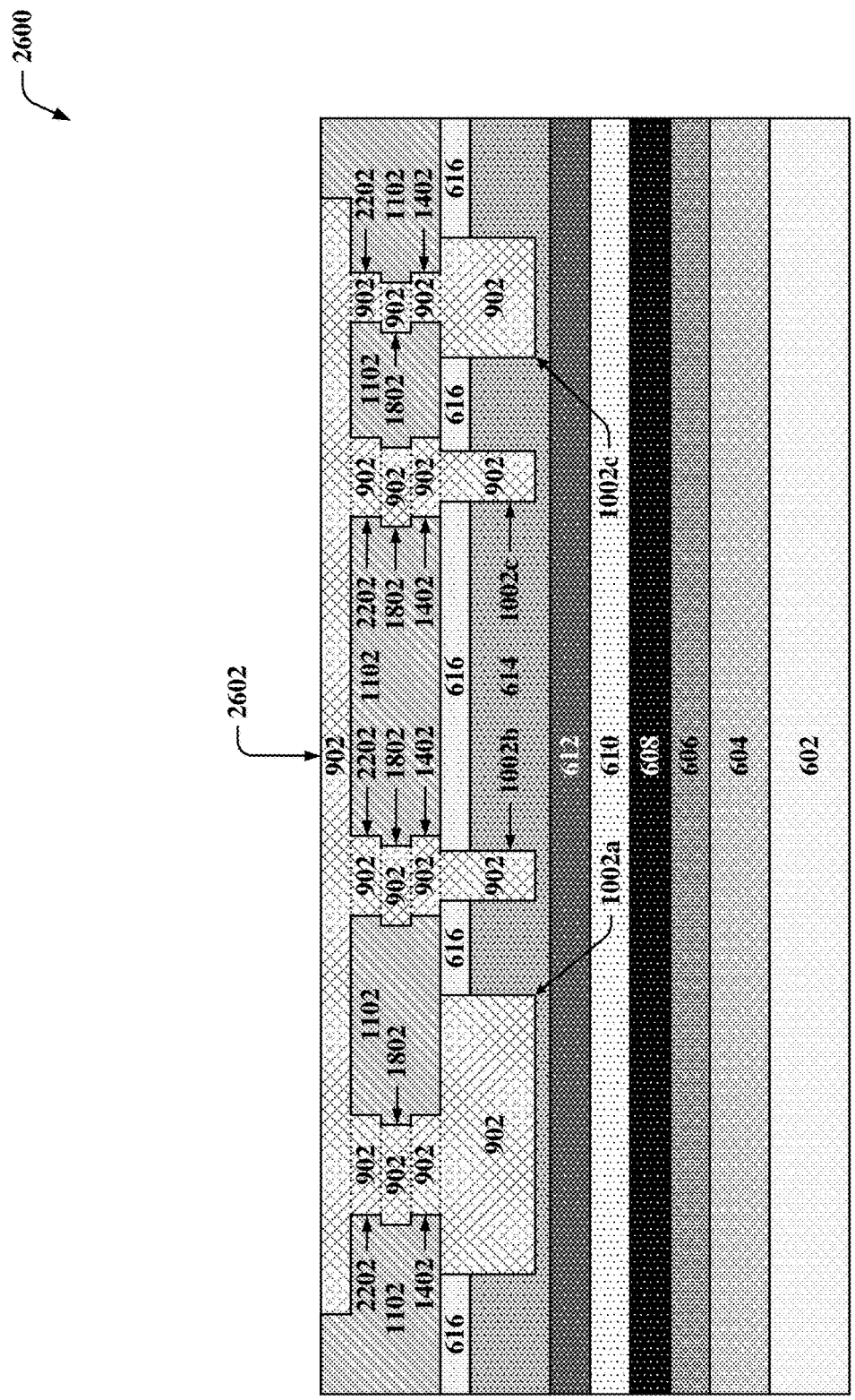
FIG. 26 illustrates a cross-sectional side view of the example, non-limiting device of FIG. 25 after depositing a superconducting layer on the device to form planar wires in accordance with one or more embodiments described herein.

FIG. 26 illustrates a cross-sectional side view of the example, non-limiting device 2500 of FIG. 25 after depositing a superconducting layer on device 2500 to form planar wires in accordance with one or more embodiments described herein. Repetitive description of like elements and/or processes employed in other embodiments described herein is omitted for sake of brevity.

Device 2600 can comprise an example, non-limiting alternative embodiment of device 2500 after depositing superconducting layer 902 on device 2500 as illustrated in FIG. 26 (e.g., onto the exposed surfaces of dielectric layer 1102 of device 2500 and through-silicon vias (TSV) 2202 in voids 2502). Superconducting layer 902 can be deposited on device 2500 (e.g., onto the exposed surfaces of dielectric layer 1102 of device 2500 and through-silicon vias (TSV) 2202 in voids 2502) using one or more material deposition techniques defined above (e.g., evaporation techniques, sputtering techniques, CVD, ALD, PVD, MBE, ECD, epitaxial deposition, etc.). Superconducting layer 902 can be formed using a superconducting material including, but not limited to, niobium (Nb), tantalum (Ta), tantalum nitride (TaN), titanium (Ti), titanium nitride (TiN) and/or another superconducting material. Superconducting layer 902 can comprise a thickness (e.g., height) ranging from approximately 20 nm to approximately 250 nm.

Based on such deposition of superconducting layer 902 on device 2500 as described above, portions of superconducting layer 902 can be removed from device 2500 using chemical-mechanical planarization (CMP) to form planar wires 2602 of device 2600 illustrated in FIG. 26 (only a single planar wire 2602 is depicted in FIG. 26). In an example, planar wires 2602 can comprise the planar wires of wiring layer 104 described above with reference to FIGS. 1 and 3. In another example, planar wires 2602 can comprise planar wires 302 described above and illustrated in FIG. 3. In another example, planar wires 2602 can comprise planar wires 1802 described above and illustrated in FIG. 18, where planar wires 2602 are positioned perpendicular to and across planar wires 1802 as illustrated in FIG. 26.

Although planar wires 2602 depicted in FIG. 26 do not extend entirely across device 2600, it should be appreciated that the subject disclosure is not so limiting. For example, in some embodiments, planar wires 2602 can extend across all of device 2600. For instance, as illustrated in FIG. 27, planar wires 2602 can extend across all of device 2700.

Figure 27:
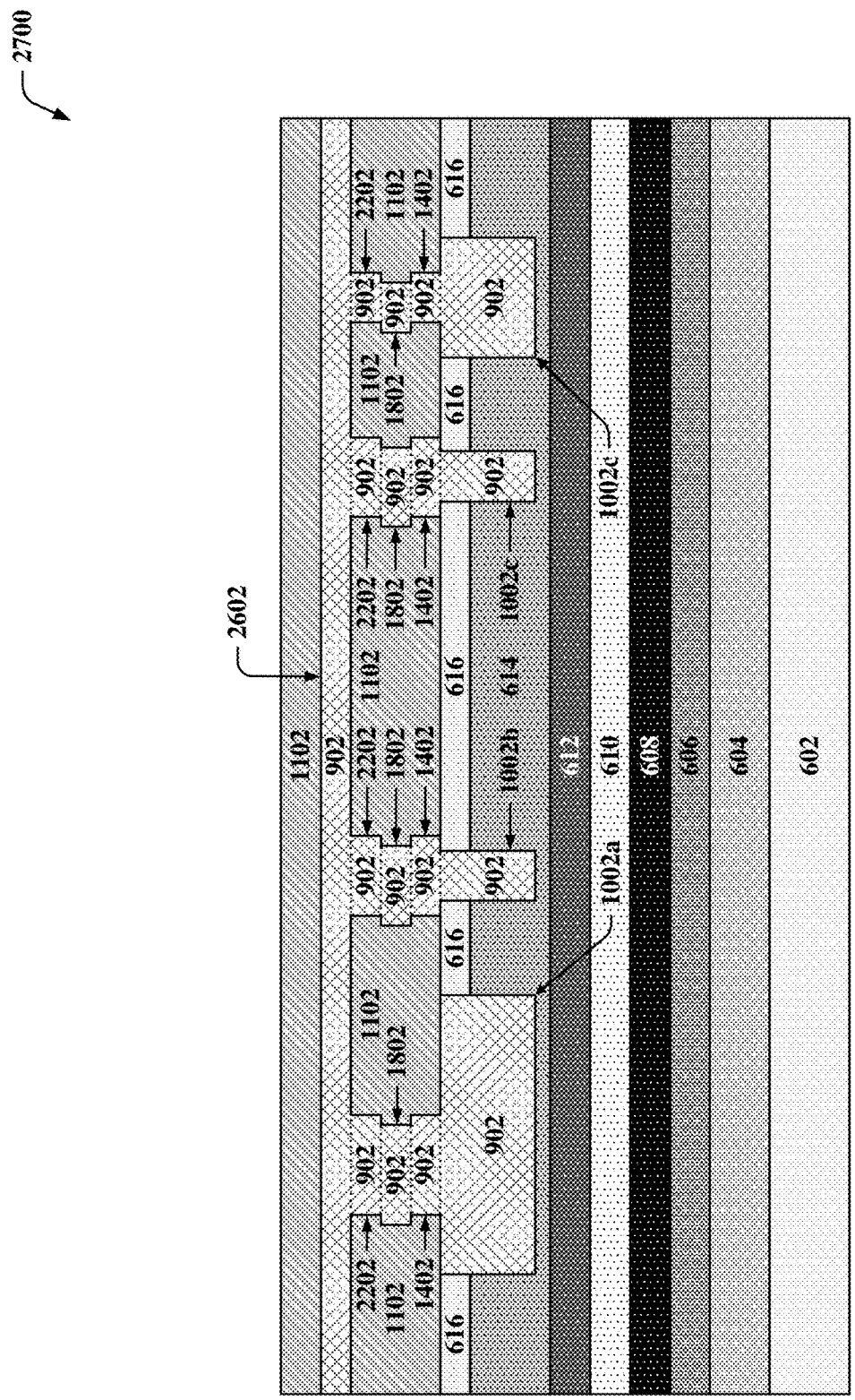
FIG. 27 illustrates a cross-sectional side view of the example, non-limiting device of FIG. 26 after depositing a dielectric layer on the device in accordance with one or more embodiments described herein.

FIG. 27 illustrates a cross-sectional side view of the example, non-limiting device 2600 of FIG. 26 after depositing a dielectric layer on device 2600 in accordance with one or more embodiments described herein. Repetitive description of like elements and/or processes employed in other embodiments described herein is omitted for sake of brevity.

Device 2700 can comprise an example, non-limiting alternative embodiment of device 2600 after depositing dielectric layer 1102 on device 2600 as illustrated in FIG. 27 (e.g., onto planar wires 2602). Dielectric layer 1102 can be deposited on device 2600 (e.g., onto planar wires 2602) using one or more material deposition techniques defined above (e.g., evaporation techniques, sputtering techniques, CVD, ALD, PVD, MBE, ECD, epitaxial deposition, etc.). Dielectric layer 1102 can be formed using, for instance, an amorphous silicon (Si). Dielectric layer 1102 can comprise a thickness (e.g., height) ranging from approximately 30 nm to approximately 200 nm.

Figure 28:
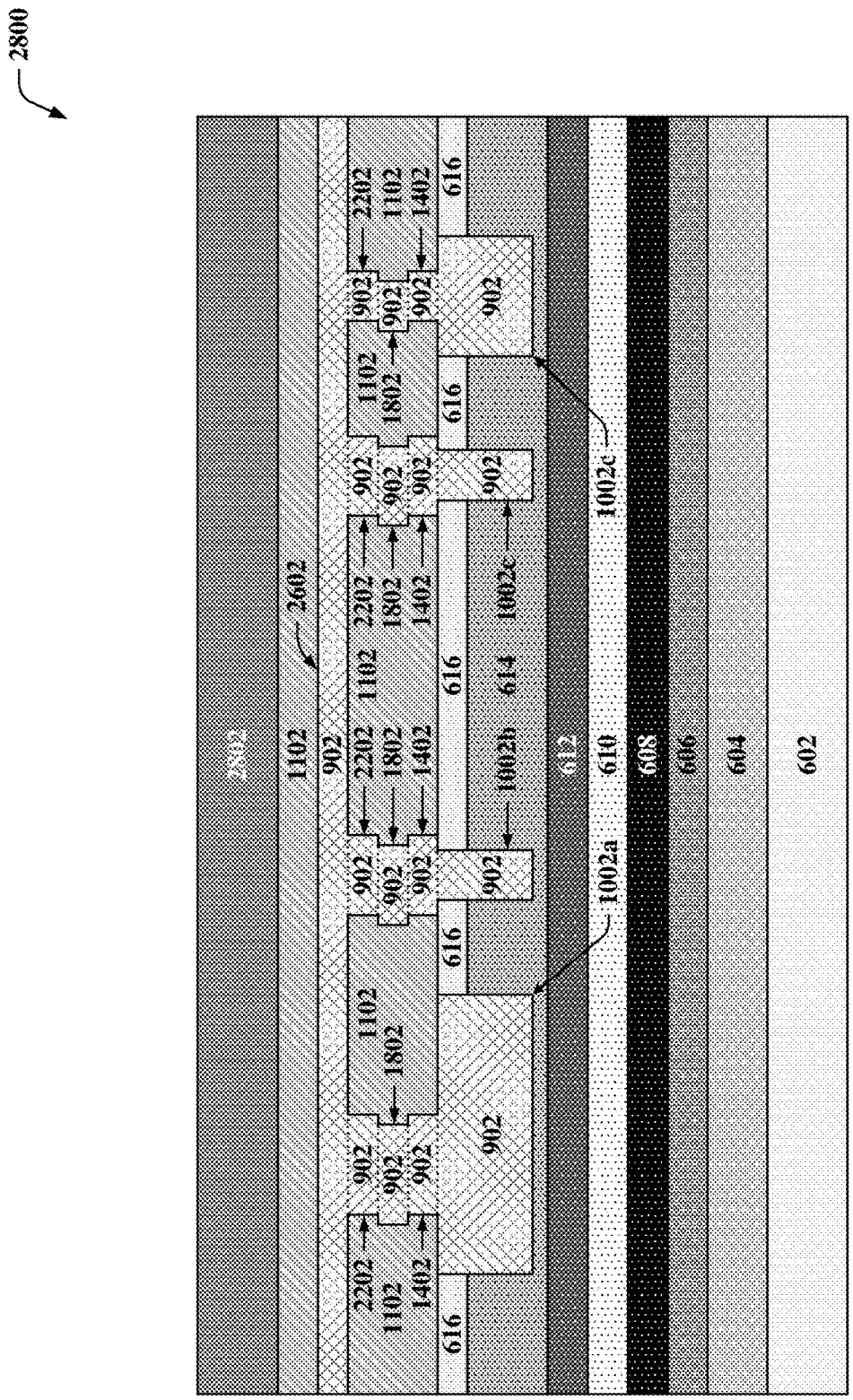
FIG. 28 illustrates a cross-sectional side view of the example, non-limiting device of FIG. 27 after bonding a handle substrate to the dielectric layer of the device in accordance with one or more embodiments described herein.

FIG. 28 illustrates a cross-sectional side view of the example, non-limiting device 2700 of FIG. 27 after bonding a handle substrate to the dielectric layer of device 2700 in accordance with one or more embodiments described herein. Repetitive description of like elements and/or processes employed in other embodiments described herein is omitted for sake of brevity.

Device 2800 can comprise an example, non-limiting alternative embodiment of device 2700 after bonding a handle substrate 2802 to dielectric layer 1102 of device 2700 as illustrated in FIG. 28. Handle substrate 2802 can be bonded to dielectric layer 1102 of device 2700 using a wafer bonding process (e.g., direct bonding, plasma-activated bonding, anodic bonding, eutectic bonding, glass frit bonding, adhesive bonding, thermocompression bonding, transient liquid phase diffusion bonding, surface activated bonding, etc.). Handle substrate 2802 can comprise substrate 102 and/or substrate 602 described above with reference to FIGS. 1 and 6, respectively. For example, handle substrate 2802 can comprise the same material as that of substrate 102 and/or substrate 602 (e.g., silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, silicon/silicon-germanium (Si/SiGe), silicon/silicon carbide (Si/SiC), silicon-on-insulators (SOIs), silicon germanium-on-insulators (SGOIs), etc.). Handle substrate 2802 can comprise a thickness (e.g., height) ranging from approximately 500 μm to approximately 1,000 μm.

Figure 29:
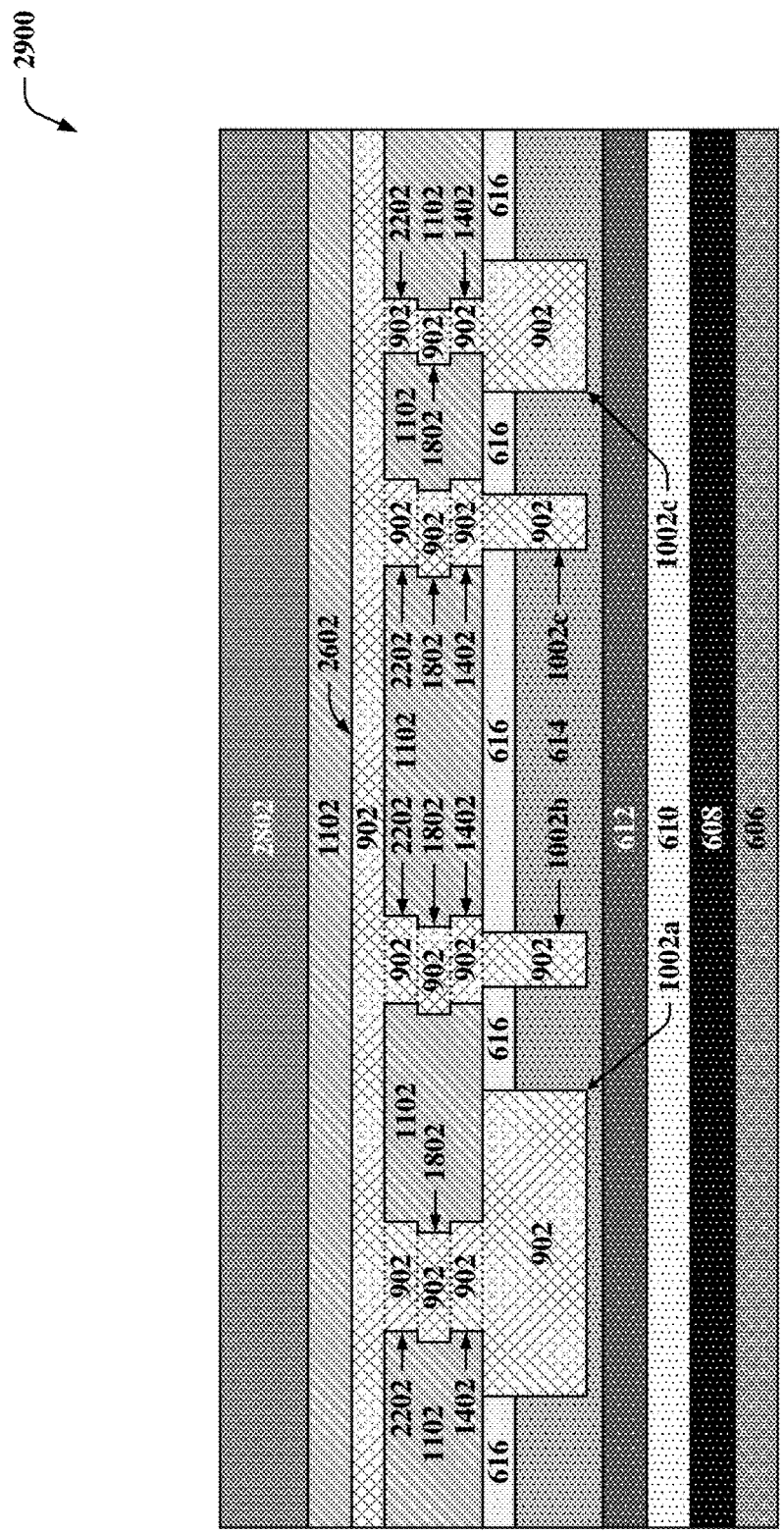
FIG. 29 illustrates a cross-sectional side view of the example, non-limiting device of FIG. 28 after removing the substrate and buffer layer from the device in accordance with one or more embodiments described herein.

FIG. 29 illustrates a cross-sectional side view of the example, non-limiting device 2800 of FIG. 28 after removing the substrate and buffer layer from device 2800 in accordance with one or more embodiments described herein. Repetitive description of like elements and/or processes employed in other embodiments described herein is omitted for sake of brevity.

Device 2900 can comprise an example, non-limiting alternative embodiment of device 2800 after removing substrate 602 and buffer layer 604 from device 2800 as illustrated in FIG. 29. For example, device 2900 can comprise an example, non-limiting alternative embodiment of device

2800 after removal of substrate 602 from buffer layer 604 and removal of buffer layer 604 from etch stop layer 606, where substrate 602 and buffer layer 604 can be removed using one or more material removal techniques defined above (e.g., CMP, etching, backgrinding, etc.).

Figure 30:
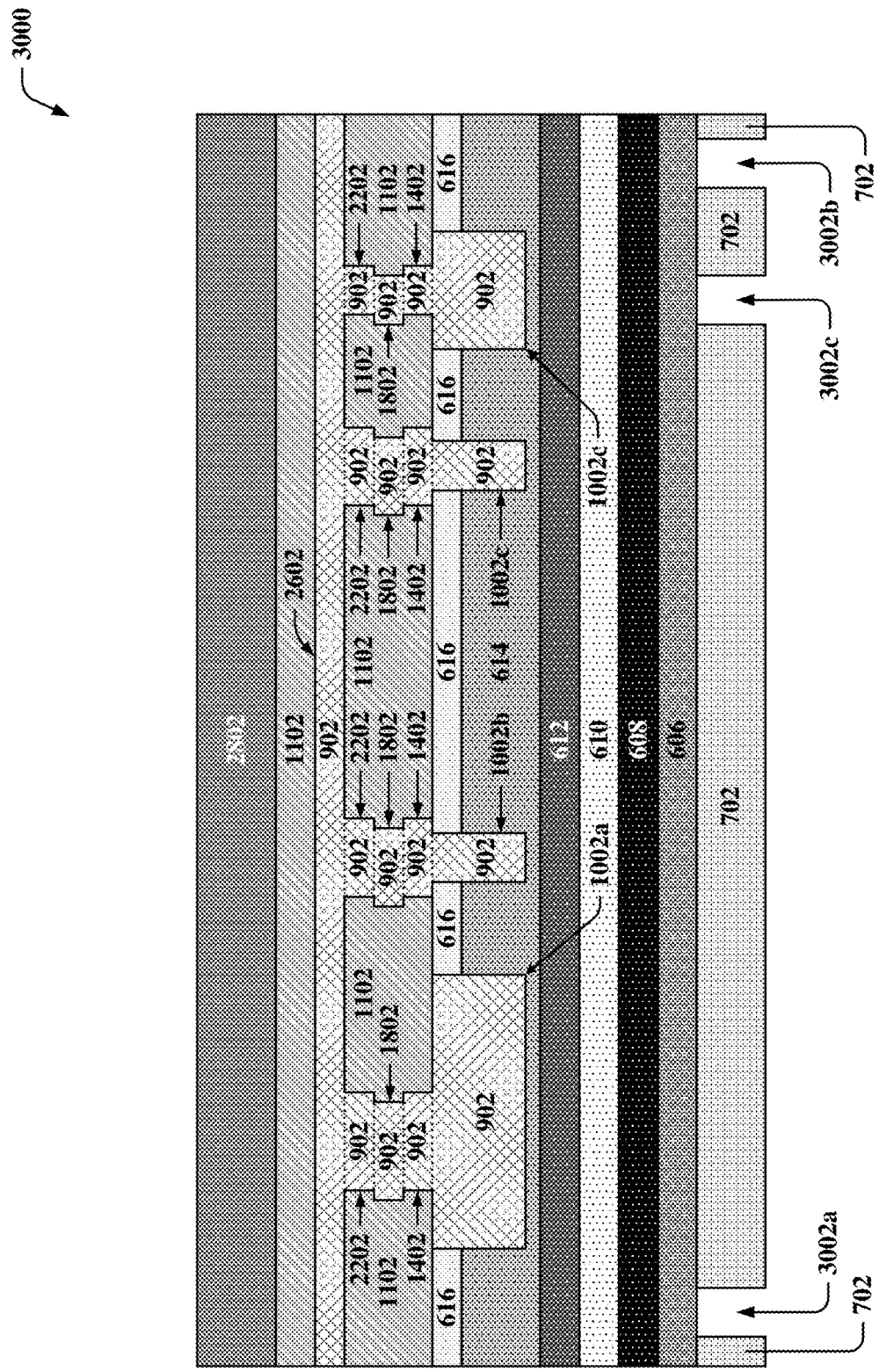
FIG. 30 illustrates a cross-sectional side view of the example, non-limiting device of FIG. 29 after forming a resist layer on the device in accordance with one or more embodiments described herein.

FIG. 30 illustrates a cross-sectional side view of the example, non-limiting device 2900 of FIG. 29 after forming a resist layer on device 2900 in accordance with one or more embodiments described herein. Repetitive description of like elements and/or processes employed in other embodiments described herein is omitted for sake of brevity.

Device 3000 can comprise an example, non-limiting alternative embodiment of device 2900 after formation of resist layer 702 on etch stop layer 606 of device 2900 to form voids 3002a, 3002b, 3002c as illustrated in FIG. 30. Resist layer 702 can comprise a photoresist material that can be formed on etch stop layer 606 of device 2900 using one or more photolithography, patterning, and/or photoresist techniques defined above (e.g., a lithographic patterning process). Resist layer 702 can comprise a photoresist including, but not limited to, a positive-tone photoresist, a negative-tone photoresist, a hybrid-tone photoresist, and/or another photoresist.

Figure 31:
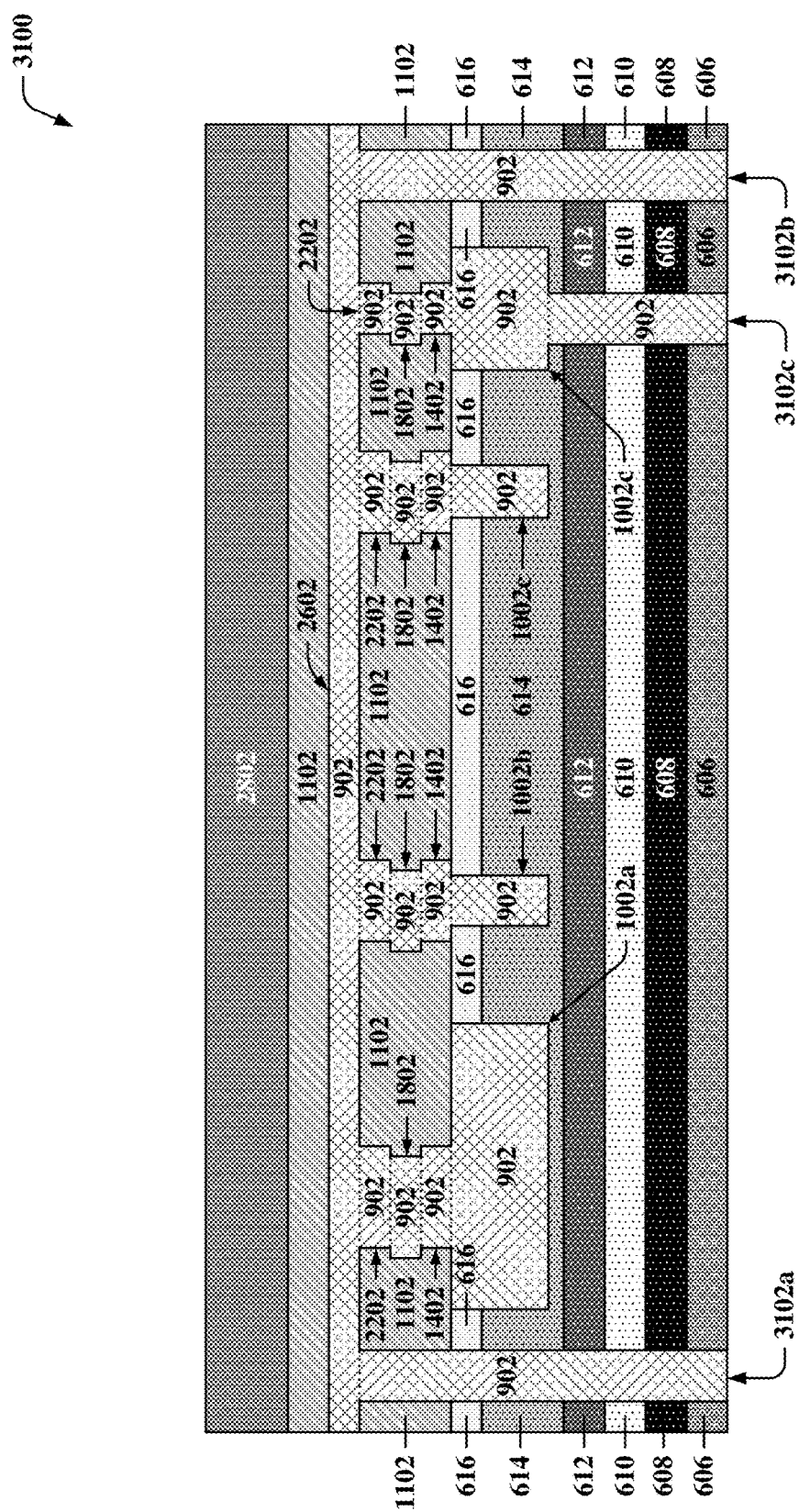
FIG. 31 illustrates a cross-sectional side view of the example, non-limiting device of FIG. 30 after etching voids into the device, removing the resist layer, and depositing a superconducting layer on the device to form contacts in accordance with one or more embodiments described herein.

FIG. 31 illustrates a cross-sectional side view of the example, non-limiting device 3000 of FIG. 30 after etching voids into device 3000, removing the resist layer, and depositing a superconducting layer on device 3000 to form contacts in accordance with one or more embodiments described herein. Repetitive description of like elements and/or processes employed in other embodiments described herein is omitted for sake of brevity.

Device 3100 can comprise an example, non-limiting alternative embodiment of device 3000 after etching voids (not illustrated in figures) into device 3000, removing resist layer 702 from etch stop layer 606 of device 3000, and depositing superconducting layer 902 on device 3000 (e.g., depositing superconducting layer 902 on etch stop layer 606 and into the etched voids of device 3000). Such voids can be etched into device 3000 using one or more etching techniques (e.g., reactive ion etching (RIE), dry etching, wet etching, ion beam etching, plasma etching, laser ablation, etc.). Resist layer 702 can be removed using a lift off technique (e.g., washing with a solvent, stripping, etc.). Superconducting layer 902 can be deposited on device 3000 (e.g., onto etch stop layer 606 and into the etched voids of device 3000) using one or more material deposition techniques defined above (e.g., evaporation techniques, sputtering techniques, CVD, ALD, PVD, MBE, ECD, epitaxial deposition, etc.). Superconducting layer 902 can be formed using a superconducting material including, but not limited to, niobium (Nb), tantalum (Ta), tantalum nitride (TaN), titanium (Ti), titanium nitride (TiN) and/or another superconducting material. Superconducting layer 902 can comprise a thickness (e.g., height) ranging from approximately 20 nm to approximately 250 nm.

Based on such deposition of superconducting layer 902 on device 3000 as described above, portions of superconducting layer 902 can be removed from device 3000 using chemical-mechanical planarization (CMP) to form contacts 3102a, 3102b, 3102c of device 3100 illustrated in FIG. 31. Contacts 3102a, 3102b, 3102c can comprise the electrical contacts that can be formed in first device layer 108 as described above with reference to FIG. 1.

As illustrated in FIG. 31, contacts 3102a, 3102b, 3102c can extend through various layers of device 3100 and can be coupled (e.g., chemically, communicatively, electrically, electromagnetically, operatively, optically, physically, thermally, etc.) to one or more components of device 3100. For example, as illustrated in FIG. 31, contacts 3102a, 3102b can extend through various layers of device 3100 and can be coupled (e.g., chemically, communicatively, electrically, electromagnetically, operatively, optically, physically, thermally, etc.) to one or more planar wires 2602, where such one or more planar wires 2602 can comprise the planar wires of wiring layer 104 described above with reference to FIG. 1 and/or planar wires 302 described above and illustrated in FIG. 3. In this example, such one or more planar wires 2602 can further enable coupling (e.g., chemically, communicatively, electrically, electromagnetically, operatively, optically, physically, thermally, etc.) of contacts 3102a, 3102b to control components 1002a, 1002b, 1002c (e.g., by way of through-silicon vias (TSV) 1402, planar wires 1802, and through-silicon vias (TSV) 2202). In another example, as illustrated in FIG. 31, contact 3102c can extend through various layers of device 3100 and can be coupled (e.g., chemically, communicatively, electrically, electromagnetically, operatively, optically, physically, thermally, etc.) to one or more control components 1002c, where such one or more control components 1002c can comprise can comprise Josephson junction (JJ) gates of circuit layer 106 described above with reference to FIG. 1 (e.g., the Josephson junction (JJ) gates and/or the Josephson junction (JJ) sensing gates described above with reference to FIG. 1).

Figure 32:
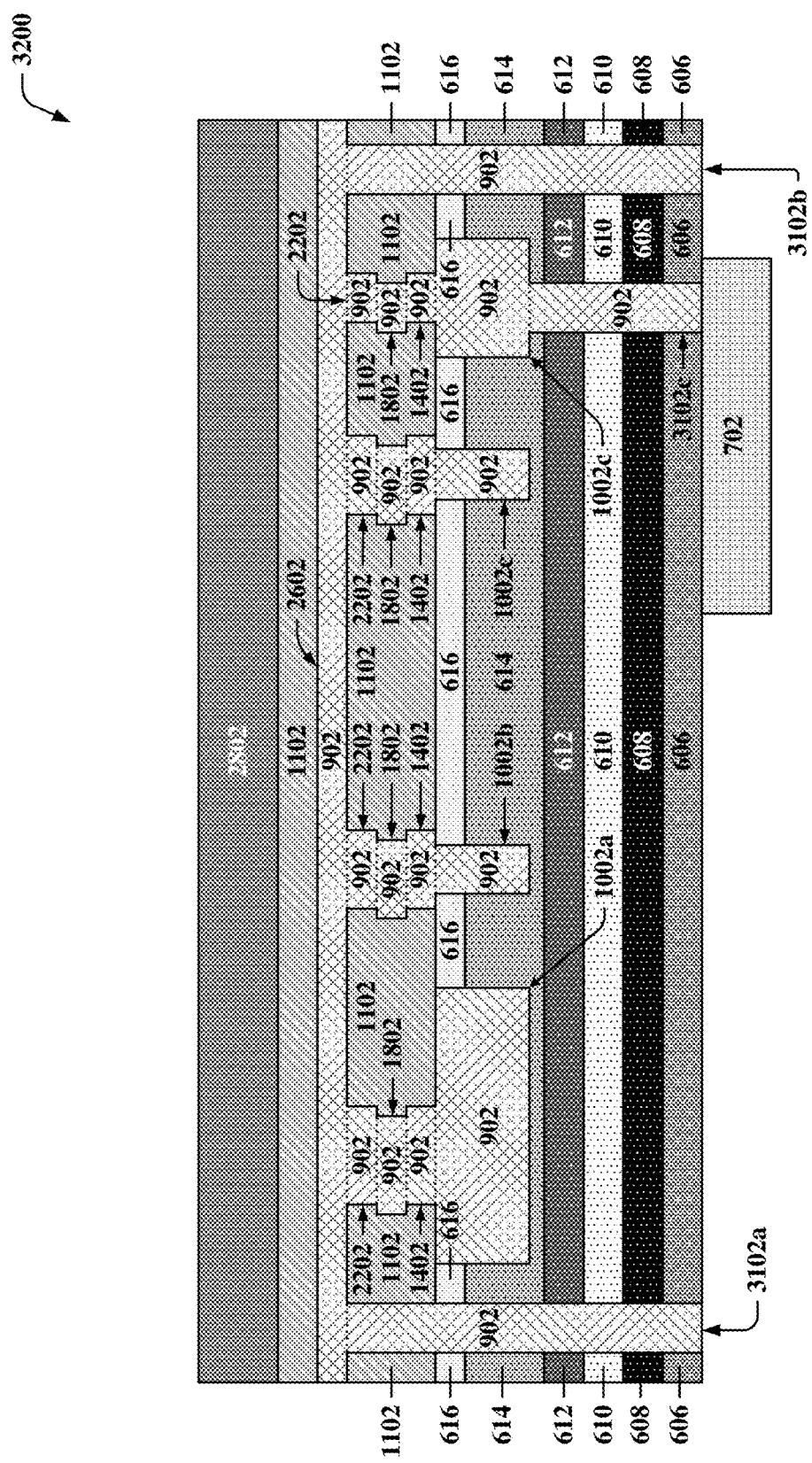
FIG. 32 illustrates a cross-sectional side view of the example, non-limiting device of FIG. 31 after forming a resist layer on the device in accordance with one or more embodiments described herein.

FIG. 32 illustrates a cross-sectional side view of the example, non-limiting device 3100 of FIG. 31 after forming a resist layer on device 3100 in accordance with one or more embodiments described herein. Repetitive description of like elements and/or processes employed in other embodiments described herein is omitted for sake of brevity.

Device 3200 can comprise an example, non-limiting alternative embodiment of device 3100 after formation of resist layer 702 on etch stop layer 606 and contact 3102c of device 3100 as illustrated in FIG. 32. Resist layer 702 can be formed on device 3100 as illustrated in FIG. 32 to pattern a region for a quantum well as described below with reference to FIG. 34 (e.g., a Josephson junction (JJ) control device, a Josephson junction (JJ) channel, a tunable Josephson junction (JJ), a quantum well tunable Josephson junction (JJ), etc.). Resist layer 702 can comprise a photoresist material that can be formed on etch stop layer 606 and contact 3102c of device 3100 using one or more photolithography, patterning, and/or photoresist techniques defined above (e.g., a lithographic patterning process). Resist layer 702 can comprise a photoresist including, but not limited to, a positive-tone photoresist, a negative-tone photoresist, a hybrid-tone photoresist, and/or another photoresist.

Figure 33:
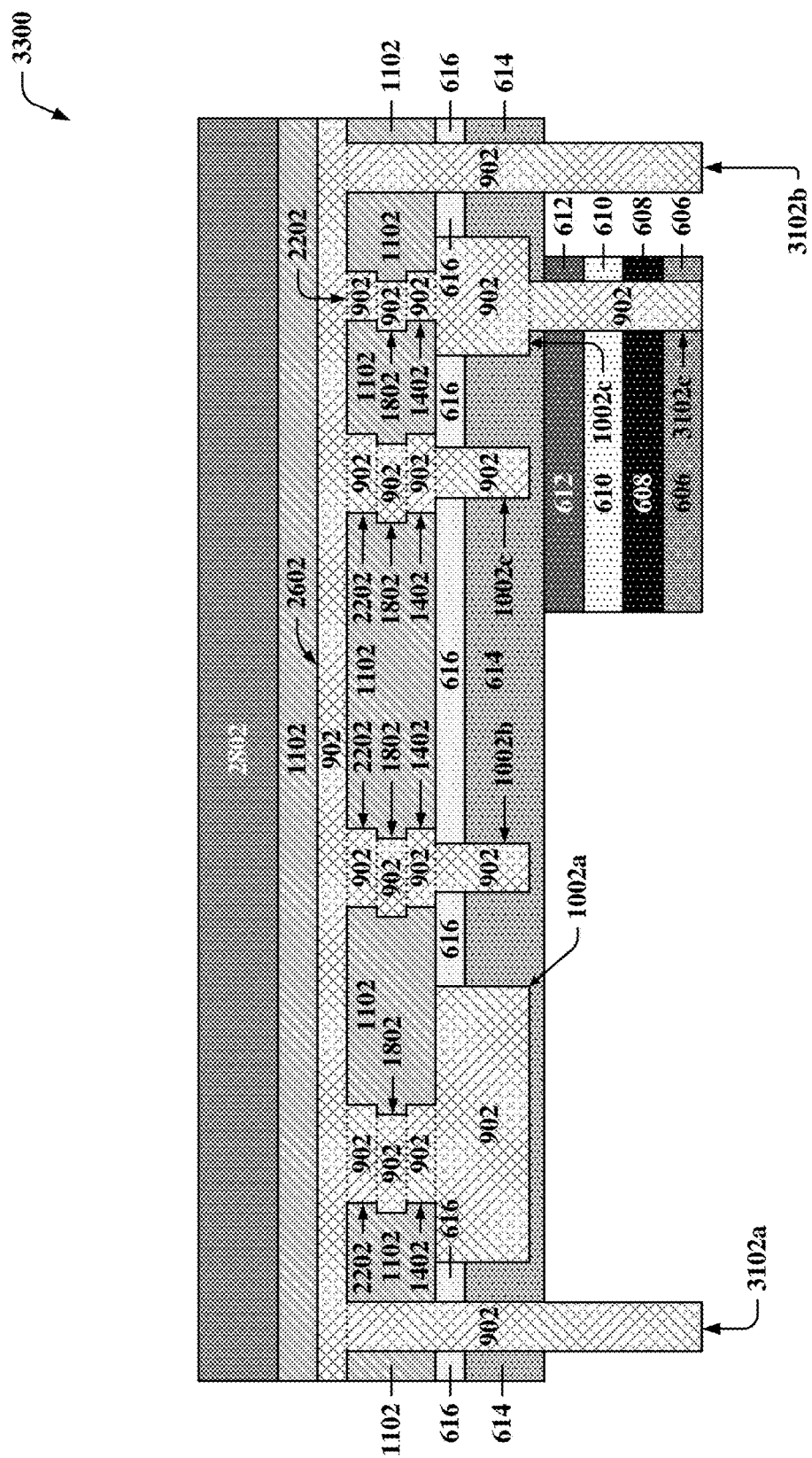
FIG. 33 illustrates a cross-sectional side view of the example, non-limiting device of FIG. 32 after removing portions of several layers of the device and removing the resist layer in accordance with one or more embodiments described herein.

FIG. 33 illustrates a cross-sectional side view of the example, non-limiting device 3200 of FIG. 32 after removing portions of several layers of device 3200 and removing the resist layer in accordance with one or more embodiments described herein. Repetitive description of like elements and/or processes employed in other embodiments described herein is omitted for sake of brevity.

Device 3300 can comprise an example, non-limiting alternative embodiment of device 3200 after removing portions of etch stop layer 606, first quantum well layer 608, second quantum well layer 610, and third quantum well layer 612, as well as resist layer 702, from device 3200 as illustrated in FIG. 33. In an example, etch stop layer 606, first quantum well layer 608, second quantum well layer 610, and third quantum well layer 612 can be removed from device 3200 using chlorine (Cl) or fluorine (F). As described below with reference to FIG. 34, such layers can be removed to form a quantum well (e.g., a Josephson junction (JJ)

control device, a Josephson junction (JJ) channel, a tunable Josephson junction (JJ), a quantum well tunable Josephson junction (JJ), etc.). Such portions of etch stop layer 606, first quantum well layer 608, second quantum well layer 610, and third quantum well layer 612 can be removed from device 3200 using one or more etching techniques (e.g., reactive ion etching (RIE), dry etching, wet etching, ion beam etching, plasma etching, laser ablation, etc.). Resist layer 702 can be removed using a lift off technique (e.g., washing with a solvent, stripping, etc.).

Figure 34:
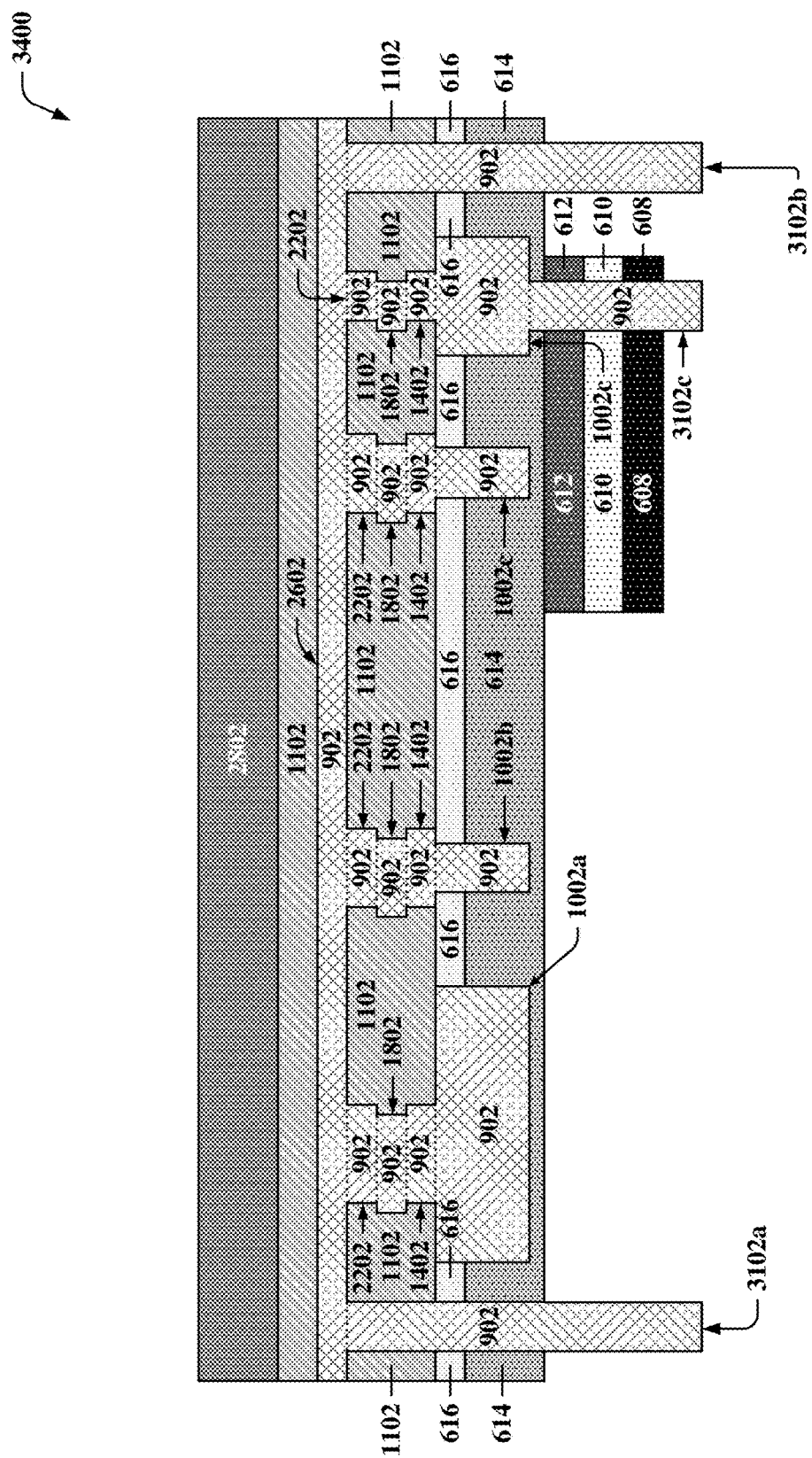
FIG. 34 illustrates a cross-sectional side view of the example, non-limiting device of FIG. 33 after removing the etch stop layer from the device and removing the resist layer in accordance with one or more embodiments described herein.

FIG. 34 illustrates a cross-sectional side view of the example, non-limiting device 3300 of FIG. 33 after removing the etch stop layer from device 3300 and removing the resist layer in accordance with one or more embodiments described herein. Repetitive description of like elements and/or processes employed in other embodiments described herein is omitted for sake of brevity.

Device 3400 can comprise an example, non-limiting alternative embodiment of device 3300 after removing etch stop layer 606 from first quantum well layer 608 of device 3300 as illustrated in FIG. 34 to form a quantum well of device 3400 (e.g., a Josephson junction (JJ) control device, a Josephson junction (JJ) channel, a tunable Josephson junction (JJ), a quantum well tunable Josephson junction (JJ), etc.). Such a quantum well can comprise a quantum well of first device layer 108 described above with reference to FIG. 1. Etch stop layer 606 can be removed from first quantum well layer 608 of device 3300 using one or more etching techniques (e.g., reactive ion etching (RIE), dry etching, wet etching, ion beam etching, plasma etching, laser ablation, etc.) and/or using one or more material removal techniques defined above (e.g., CMP, etching, backgrinding, etc.).

Figure 35:
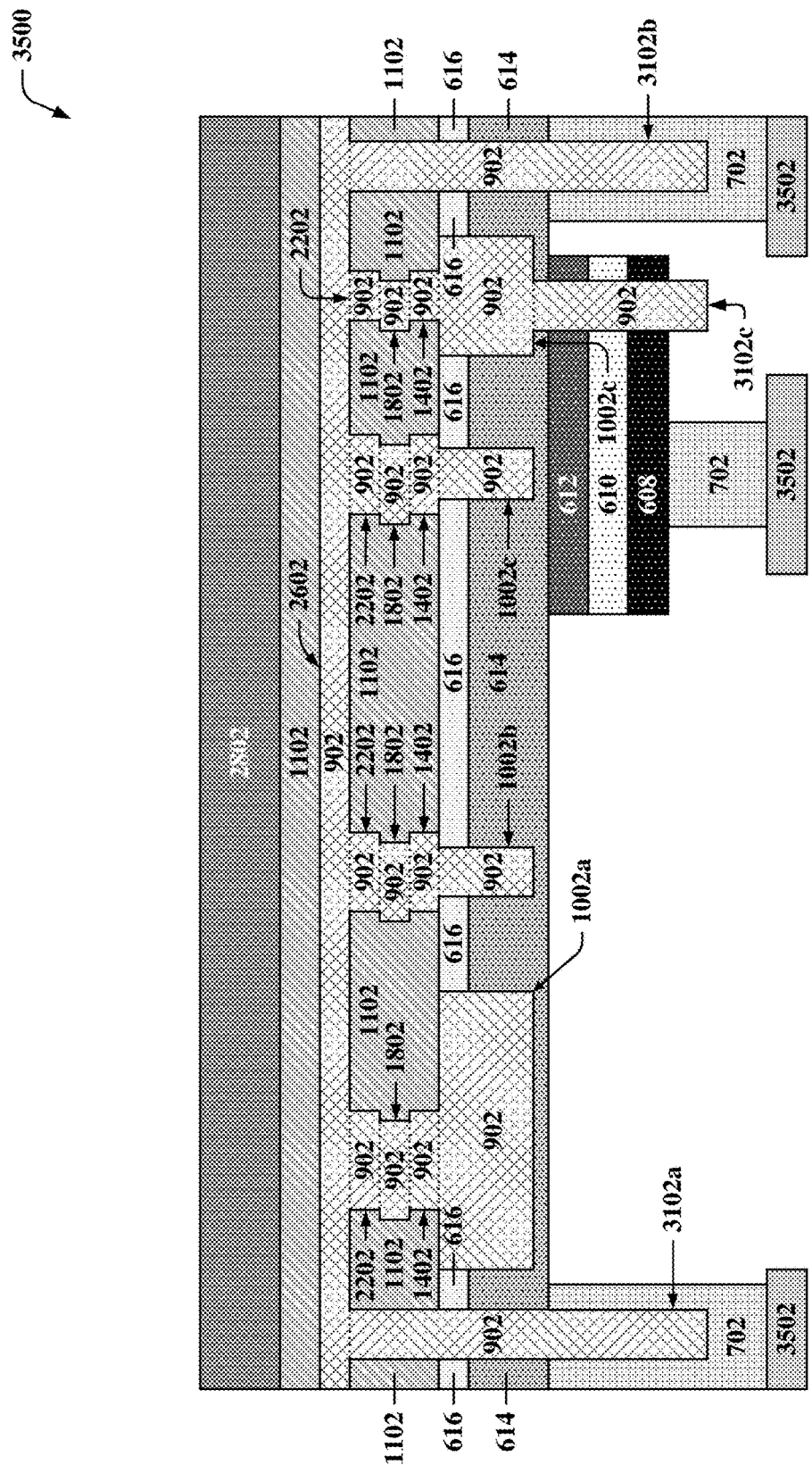
FIG. 35 illustrates a cross-sectional side view of the example, non-limiting device of FIG. 34 after forming a lift off resist structure on the device in accordance with one or more embodiments described herein.

FIG. 35 illustrates a cross-sectional side view of the example, non-limiting device 3400 of FIG. 34 after forming a lift off resist structure on device 3400 in accordance with one or more embodiments described herein. Repetitive description of like elements and/or processes employed in other embodiments described herein is omitted for sake of brevity.

Device 3500 can comprise an example, non-limiting alternative embodiment of device 3400 after formation of a lift off resist structure on device 3400 as illustrated in FIG. 35. Such a lift off resist structure described above can comprise a lift off stack having a resist profile layer 3502 with an undercut profile that can comprise resist layer 702. In an example, resist profile layer 3502 can be formed using the same material and/or the same photolithography, patterning, and/or photoresist techniques defined above (e.g., a lithographic patterning process) that can be used to form resist layer 702. In another example, resist profile layer 3502 can be formed using different material from that used to form resist layer 702. For example, resist profile layer 3502 can comprise a hard mask formed using materials such as, for instance, silicon (Si) or titanium (Ti) and resist layer 702 can be formed using an organic material that can be developed out using, for example, solvent or tetramethylammonium hydroxide to create the undercut profile illustrated in FIG. 35. The lift off resist structure can be formed on device 3400 as illustrated in FIG. 35 to enable formation of, for instance, one or more nanorods capable of hosting *Majorana* fermions and/or one or more electrodes.

Figure 36:
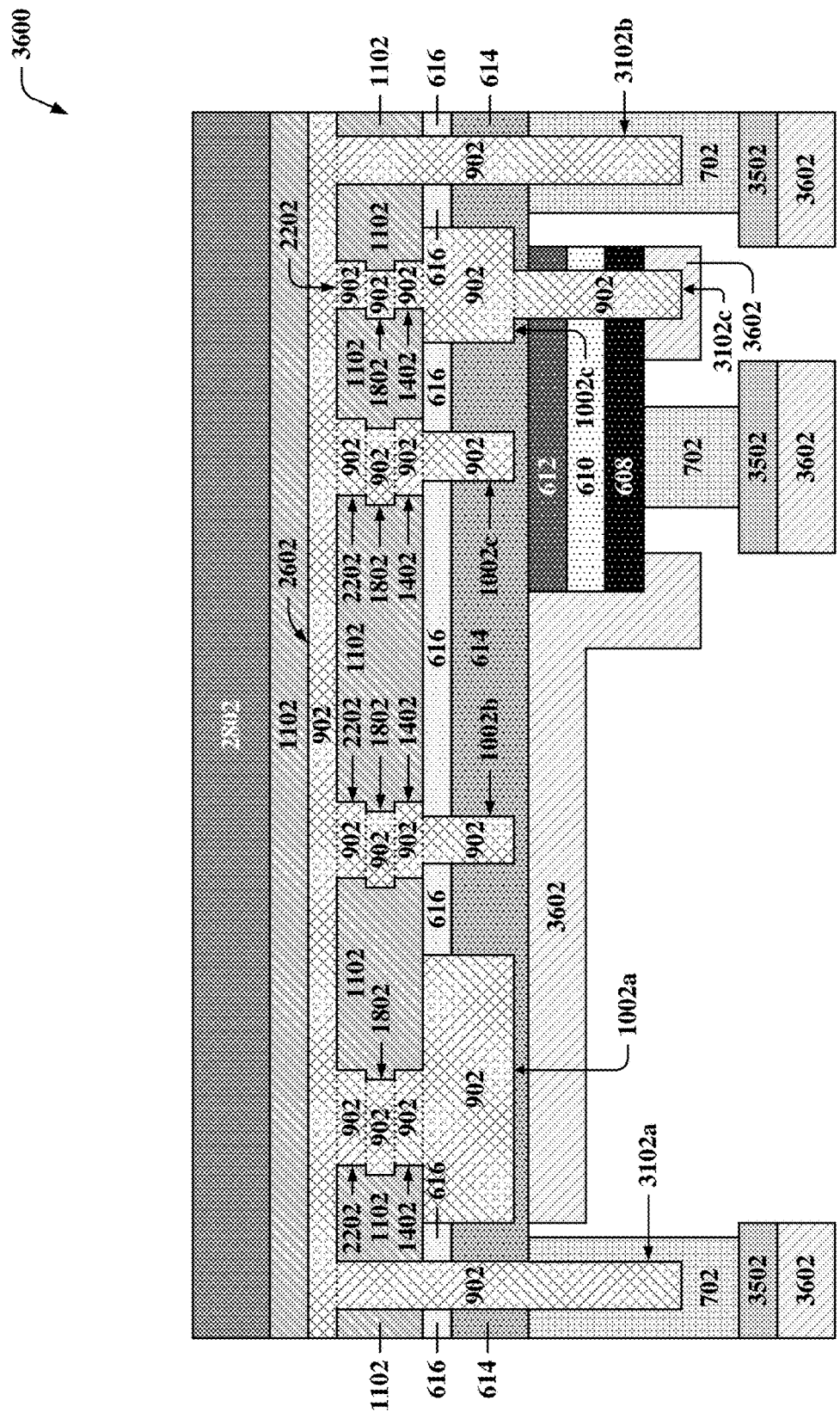
FIG. 36 illustrates a cross-sectional side view of the example, non-limiting device of FIG. 35 after depositing a superconducting layer on the device in accordance with one or more embodiments described herein.

FIG. 36 illustrates a cross-sectional side view of the example, non-limiting device 3500 of FIG. 35 after depositing a superconducting layer on device 3500 in accordance with one or more embodiments described herein. Repetitive description of like elements and/or processes employed in other embodiments described herein is omitted for sake of brevity.

Device 3600 can comprise an example, non-limiting alternative embodiment of device 3500 after depositing a superconducting layer 3602 on device 3500 as illustrated in FIG. 36 (e.g., onto the exposed surfaces of resist profile layer 3502, first quantum well layer 608, second quantum well layer 610, third quantum well layer 612, epitaxial layer 614, and/or contact 3102c). Superconducting layer 3602 can be deposited on device 3500 (e.g., onto the exposed surfaces of resist profile layer 3502, first quantum well layer 608, second quantum well layer 610, third quantum well layer 612, epitaxial layer 614, and/or contact 3102c) using one or more material deposition techniques defined above (e.g., evaporation techniques, sputtering techniques, CVD, ALD, PVD, MBE, ECD, epitaxial deposition, etc.). In an example, superconducting layer 3602 can be formed using a single material having superconducting properties and magnetic properties. For instance, superconducting layer 3602 can be formed using uranium telluride ($UTe_2$). In another example, superconducting layer 3602 can be formed using a magnetic material formed on a superconducting material. For instance, superconducting layer 3602 can be formed using a magnetic material such as, for example, iron (Fe) formed on a superconducting material such as, for example, lead (Pb). Superconducting layer 3602 can comprise a thickness (e.g., height) ranging from approximately 5 nm to approximately 100 nm. Superconducting layer 3602 can be deposited on device 3500 as described above and illustrated in FIG. 36 to enable formation of one or more nanorods capable of hosting *Majorana* fermions and/or one or more electrodes.

Figure 37:
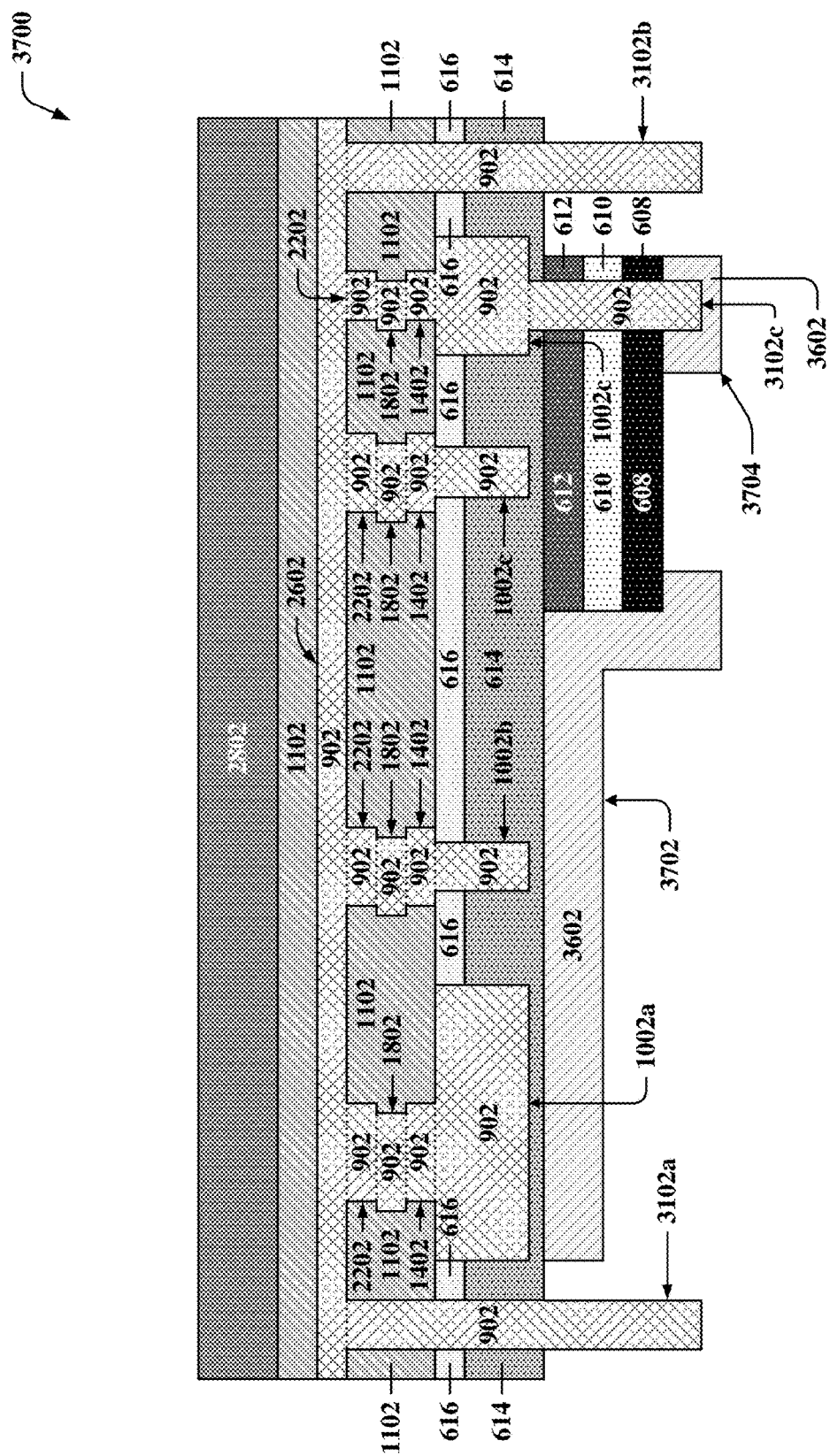
FIG. 37 illustrates a cross-sectional side view of the example, non-limiting device of FIG. 36 after removing the lift off resist structure and portions of the superconducting layer deposited on the lift off resist structure to form one or more nanorods and one or more electrodes in accordance with one or more embodiments described herein.

FIG. 37 illustrates a cross-sectional side view of the example, non-limiting device 3600 of FIG. 36 after removing the lift off resist structure and portions of the superconducting layer deposited on the lift off resist structure to form one or more nanorods and one or more electrodes in accordance with one or more embodiments described herein. Repetitive description of like elements and/or processes employed in other embodiments described herein is omitted for sake of brevity.

Device 3700 can comprise an example, non-limiting alternative embodiment of device 3600 after removing the lift off resist structure comprising resist profile layer 3502 and resist layer 702 and portions of superconducting layer 3602 deposited on resist profile layer 3502 to form one or more nanorods 3702 and one or more electrodes 3704 as illustrated in FIG. 37. The lift off resist structure and portions of superconducting layer 3602 formed on resist profile layer 3502 of the lift off resist structure can be removed using a lift off technique (e.g., washing with a solvent, stripping, etc.) to define one or more nanorods 3702 and one or more electrodes 3704 as illustrated in FIG. 37. In an example, nanorod(s) 3702 and electrode(s) 3704 can comprise the portions of superconducting layer 3602 remaining after removing resist profile layer 3502 and resist layer 702 as described above. In this example, nanorod(s) 3702 can comprise the nanorods capable of hosting *Majorana* fermions that can be formed in second device layer 110 as described above with reference to FIG. 1. In another example, nanorod(s) 3702 can comprise nanorod(s) 206 described above and illustrated in FIGS. 2-5. As illustrated in FIG. 37, nanorod(s) 3702 can be coupled to epitaxial layer 614 and a quantum well of device 3700 comprising first quantum well layer 608, second quantum well layer 610, and third quantum well layer 612. In another example, electrode(s) 3704 can comprise Josephson junction (JJ) electrodes that can be formed in second device layer 110 as described above with reference to FIG. 1. In this example, electrode(s) 3704 can be coupled (e.g., chemically, communicatively, electrically, electromagnetically, operatively, optically, physically, thermally, etc.) to one or more contacts 3102c and/or first quantum well layer 608 of a quantum well of device 3700 as illustrated in FIG. 37.

As described above, in some embodiments, nanorod(s) 3702 can comprise the nanorods capable of hosting *Majorana* fermions that can be formed in second device layer 110 of device 100, where second device layer 110 can comprise an outermost layer of a topological qubit device. In these embodiments and with reference to the non-limiting multi-step fabrication sequence described above and illustrated in FIGS. 6-37, second device layer 110 of device 100 and/or nanorod(s) 3702 of device 3700 can be formed as a final step in such a fabrication sequence, thereby facilitating at least one of: reduced damage of nanorod(s) 3702 in fabrication; improved coherence time of the topological qubit device comprising second device layer 110; improved lifespan of the topological qubit device; or improved performance of a device comprising the topological qubit device (e.g., a quantum computing device comprising the topological qubit device).

The various embodiments of the subject disclosure described herein (e.g., device 100, 200, 300, 400, 500, 3700, etc.) can be associated with various technologies. For example, the various embodiments of the subject disclosure described herein (e.g., device 100, 200, 300, 400, 500, 3700, etc.) can be associated with semiconductor and/or superconductor device technologies, semiconductor and/or superconductor device fabrication technologies, quantum computing device technologies, quantum computing device fabrication technologies, topological qubit device technologies, topological qubit device fabrication technologies, *Majorana* qubit device technologies, *Majorana* qubit device fabrication technologies, and/or other technologies.

The various embodiments of the subject disclosure described herein (e.g., device 100, 200, 300, 400, 500, 3700, etc.) can provide technical improvements to the various technologies listed above. For example, the various embodiments of the subject disclosure described herein (e.g., device 100, 200, 300, 400, 500, 3700, etc.) can each comprise a topological qubit device that can be implemented in a quantum computing device (e.g., a quantum processor, quantum computer, etc.) to facilitate topological quantum computing. In this example, each of such topological qubit devices can comprise one or more nanorods capable of hosting *Majorana* fermions, where such nanorod(s) can be the final component(s) formed on each of the topological qubit devices, thereby facilitating reduced damage of the nanorod(s) in fabrication. In this example, by reducing or eliminating the damage to the nanorod(s) in fabrication, the various embodiments of the subject disclosure described herein (e.g., device 100, 200, 300, 400, 500, 3700, etc.) can thereby facilitate improved coherence time of each of the topological qubit devices comprising the nanorod(s), improved lifespan of each of the topological qubit devices, and/or improved performance of a quantum computing device comprising one or more of topological qubit devices.

The various embodiments of the subject disclosure described herein (e.g., device 100, 200, 300, 400, 500, 3700, etc.) can provide technical improvements to a processing unit associated with one or more of the various embodiments of the subject disclosure described herein (e.g., device 100, 200, 300, 400, 500, 3700, etc.). For example, as described above, the various embodiments of the subject disclosure described herein (e.g., device 100, 200, 300, 400, 500, 3700, etc.) can facilitate at least one of improved coherence time and/or lifespan of a topological qubit device, and thus, can thereby facilitate improved performance (e.g., fidelity, accuracy, etc.) of a quantum computing device comprising such a topological qubit device. In this example, such a quantum computing device can comprise a processing unit such as, for example, a quantum processor comprising one or more of the various embodiments of the subject disclosure described herein (e.g., device 100, 200, 300, 400, 500, 3700, etc.). Such improvement(s) to such a processing unit can further facilitate improved efficiency of the processing unit, as well as reduced computational costs of the processing unit.

A practical application of the various embodiments of the subject disclosure described herein (e.g., device 100, 200, 300, 400, 500, 3700, etc.) is they can be implemented in a quantum computing device (e.g., a quantum processor, a quantum computer, etc.) to improve processing fidelity, processing performance, and/or processing costs of such a device, which can facilitate fast and/or possibly universal quantum computing. Such a practical application can improve the output (e.g., computation and/or processing results) of one or more compilation jobs (e.g., quantum computing jobs) that are executed on such a device(s).

It should be appreciated that the various embodiments of the subject disclosure described herein (e.g., device 100, 200, 300, 400, 500, 3700, etc.) provide a new approach for facilitating topological quantum computing and/or a new approach for fabricating topological qubit devices which is driven by relatively new quantum computing technologies. For example, the various embodiments of the subject disclosure described herein (e.g., device 100, 200, 300, 400, 500, 3700, etc.) provide a new approach for reducing damage during fabrication to a nanorod that can host *Majorana* fermions, where reducing damage to such a nanorod can facilitate at least one of improved coherence time of a topological qubit device comprising the nanorod, improved lifespan of the topological qubit device, and/or improved performance of a quantum computing device comprising the topological qubit device.

The various embodiments of the subject disclosure described herein (e.g., device 100, 200, 300, 400, 500, 3700, etc.) can be coupled to hardware and/or software to solve problems that are highly technical in nature, that are not abstract and that cannot be performed as a set of mental acts by a human. For example, the various embodiments of the subject disclosure described herein (e.g., device 100, 200, 300, 400, 500, 3700, etc.) can be implemented in a quantum computing device that can process information and/or execute calculations that are not abstract and that cannot be performed as a set of mental acts by a human.

It should be appreciated that the various embodiments of the subject disclosure described herein (e.g., device 100, 200, 300, 400, 500, 3700, etc.) can utilize various combinations of electrical components, mechanical components, and circuitry that cannot be replicated in the mind of a human or performed by a human. For example, facilitating topological quantum computing is an operation that is greater than the capability of a human mind. For instance, the amount of data processed, the speed of processing such data, and/or the types of data processed over a certain period of time by such a quantum computing device utilizing the various embodiments of the subject disclosure described herein (e.g., device 100, 200, 300, 400, 500, 3700, etc.) can be greater, faster, and/or different than the amount, speed, and/or data type that can be processed by a human mind over the same period of time.

The various embodiments of the subject disclosure described herein (e.g., device 100, 200, 300, 400, 500, 3700, etc.) can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that the various embodiments of the subject disclosure described herein (e.g., device 100, 200, 300, 400, 500, 3700, etc.) can include information that is impossible to obtain manually by an entity, such as a human user. For example, the type, amount, and/or variety of information included in and/or processed by the various embodiments of the subject disclosure described herein (e.g., device 100, 200, 300, 400, 500, 3700, etc.) can be more complex than information obtained manually by a human user.

Figure 38:
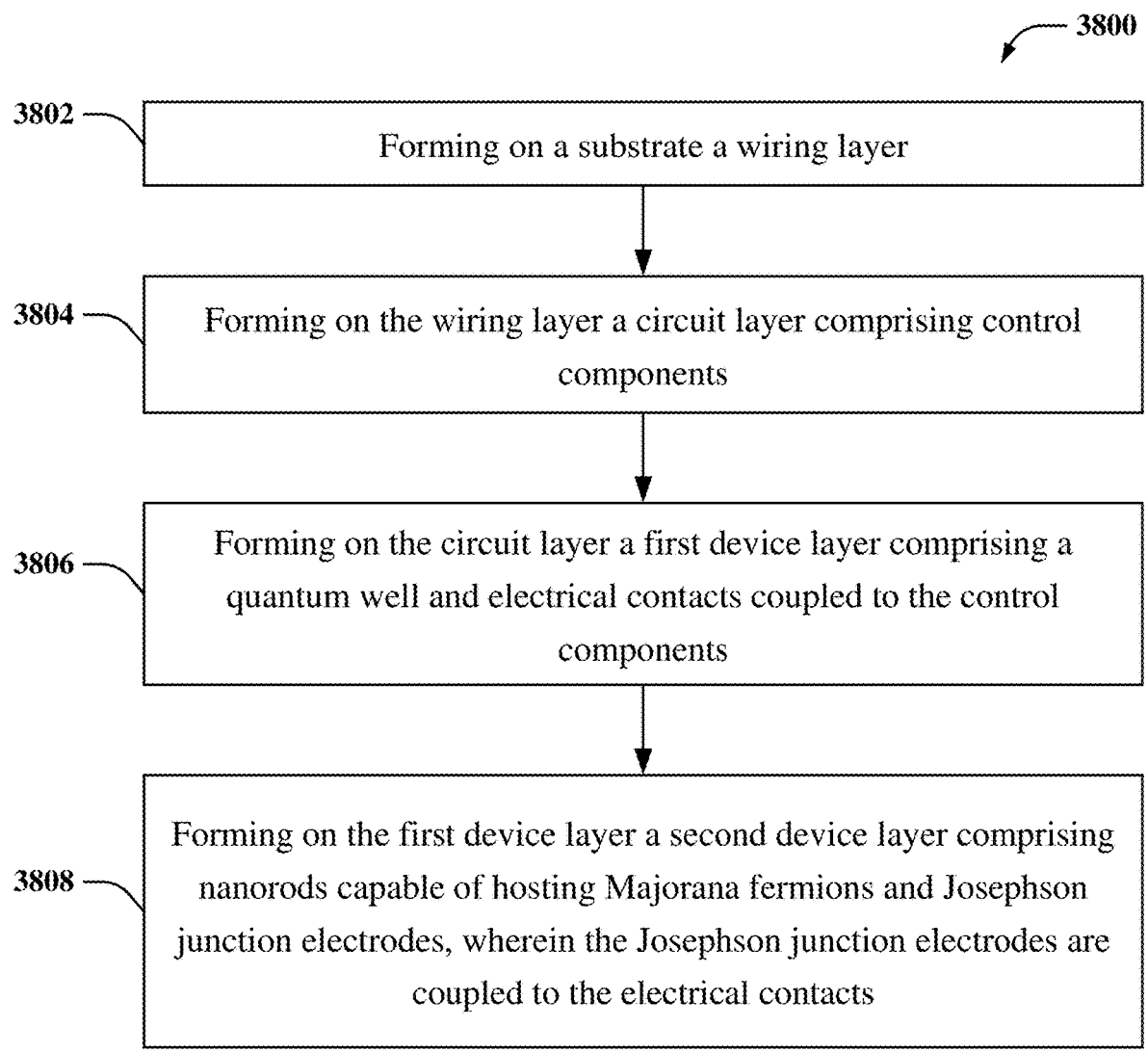
FIG. 38 illustrates a flow diagram of an example, non-limiting method that can facilitate topological quantum computing in accordance with one or more embodiments described herein.

FIG. 38 illustrates a flow diagram of an example, non-limiting method 3800 that can facilitate topological quantum computing in accordance with one or more embodiments described herein. Repetitive description of like elements and/or processes employed in other embodiments described herein is omitted for sake of brevity.

At 3802, method 3800 can comprise forming (e.g., via computer 3012) on a substrate (e.g., substrate 102 and/or 602) a wiring layer (e.g., wiring layer 104 comprising planar wires 302, 1802, and/or 2602 and through-silicon vias (TSV) 1402 and/or 2202).

At 3804, method 3800 can comprise forming (e.g., via computer 3012) on the wiring layer a circuit layer (e.g., circuit layer 106) comprising defined components (e.g., pinch gate 204*a*, chemical potential gate 204*b*, control components 1002*a*, 1002*b*, and/or 1002*c*, etc.).

At 3806, method 3800 can comprise forming (e.g., via computer 3012) on the circuit layer a first device layer (e.g., first device layer 108) comprising a quantum well (e.g., the quantum well described above with reference to FIGS. 1-5, the quantum well of device 3700 comprising first quantum well layer 608, second quantum well layer 610, and third quantum well layer 612, etc.) and electrical contacts (e.g., contacts 3102*a*, 3102*b*, and/or 3102*c*) coupled (e.g., chemically, communicatively, electrically, electromagnetically, operatively, optically, physically, thermally, etc.) to the control components (e.g., coupled to contacts 3102*a*, 3102*b*, 3102*c* by way of through-silicon vias (TSV) 1402, planar wires 1802, through-silicon vias (TSV) 2202, and planar wires 2602 of device 3700 as illustrated in FIG. 37).

At 3808, method 3800 can comprise forming (e.g., via computer 3012) on the first device layer a second device layer (e.g., second device layer 110) comprising nanorods capable of hosting *Majorana* fermions (e.g., nanorods 206 and/or 3702) and Josephson junction electrodes (e.g., Josephson junction (JJ) electrodes 402, electrodes 3704, etc.), wherein the Josephson junction electrodes are coupled (e.g., chemically, communicatively, electrically, electromagnetically, operatively, optically, physically, thermally, etc.) to the electrical contacts.

The example, non-limiting multi-step fabrication sequences described above with reference to FIGS. 6-37 and/or the operations of method 3800 described above with reference to FIG. 38, which can be implemented to fabricate one or more embodiments of the subject disclosure described herein and/or illustrated in the figures, can be implemented by a computing system (e.g., operating environment 3900 illustrated in FIG. 39 and described below) and/or a computing device (e.g., computer 3912 illustrated in FIG. 39 and described below). In non-limiting example embodiments, such computing system (e.g., operating environment 3900) and/or such computing device (e.g., computer 3912) can comprise one or more processors and one or more memory devices that can store executable instructions thereon that, when executed by the one or more processors, can facilitate performance of the example, non-limiting multi-step fabrication operations described herein with reference to FIGS. 6-37 and/or the operations of method 3800 described above with reference to FIG. 38. As a non-limiting example, the one or more processors can facilitate performance of the example, non-limiting multi-step fabrication operations described herein with reference to FIGS. 6-37 and/or the operations of method 3800 described above with reference to FIG. 38 by directing and/or controlling one or more systems and/or equipment operable to perform semiconductor and/or superconductor device fabrication.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 39:
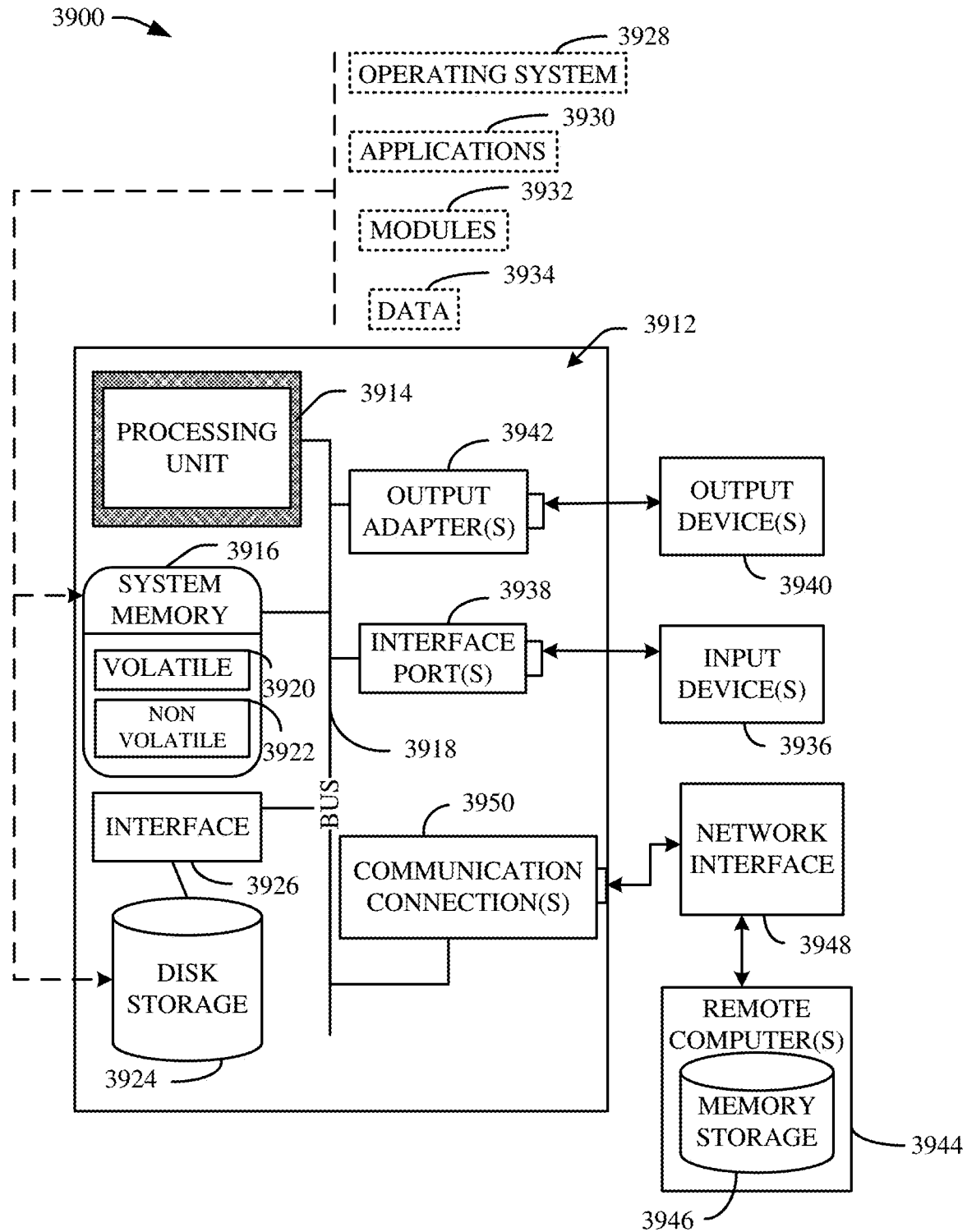
FIG. 39 illustrates a block diagram of an example, non-limiting operating environment in which one or more embodiments described herein can be facilitated.

In order to provide a context for the various aspects of the disclosed subject matter, FIG. 39 as well as the following discussion are intended to provide a general description of a suitable environment in which the various aspects of the disclosed subject matter can be implemented. FIG. 39 illustrates a block diagram of an example, non-limiting operating environment in which one or more embodiments described herein can be facilitated. For example, operating environment 3900 can be used to implement the example, non-limiting multi-step fabrication operations described herein with reference to FIGS. 6-37 and/or the operations of method 3800 described above with reference to FIG. 38 which can facilitate implementation of one or more embodiments of the subject disclosure described herein. Repetitive description of like elements and/or processes employed in other embodiments described herein is omitted for sake of brevity.

With reference to FIG. 39, a suitable operating environment 3900 for implementing various aspects of this disclosure can also include a computer 3912. The computer 3912 can also include a processing unit 3914, a system memory 3916, and a system bus 3918. The system bus 3918 couples system components including, but not limited to, the system memory 3916 to the processing unit 3914. The processing unit 3914 can be any of various available processors. Dual microprocessors and other multiprocessor architectures also can be employed as the processing unit 3914. The system bus 3918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 3916 can also include volatile memory 3920 and nonvolatile memory 3922. The basic input/output system (BIOS), containing the basic routines to transfer information between elements within the computer 3912, such as during start-up, is stored in nonvolatile memory 3922. Computer 3912 can also include removable/non-removable, volatile/non-volatile computer storage media. FIG. 39 illustrates, for example, a disk storage 3924. Disk storage 3924 can also include, but is not limited to, devices like a magnetic disk drive, floppy disk drive, tape drive, Jaz drive, Zip drive, LS-100 drive, flash memory card, or memory stick. The disk storage 3924 also can include storage media separately or in combination with other storage media. To facilitate connection of the disk storage 3924 to the system bus 3918, a removable or non-removable interface is typically used, such as interface 3926. FIG. 39 also depicts software that acts as an intermediary between users and the basic computer resources described in the suitable operating environment 3900. Such software can also include, for example, an operating system 3928. Operating system 3928, which can be stored on disk storage 3924, acts to control and allocate resources of the computer 3912.

System applications 3930 take advantage of the management of resources by operating system 3928 through program modules 3932 and program data 3934, e.g., stored either in system memory 3916 or on disk storage 3924. It is to be appreciated that this disclosure can be implemented with various operating systems or combinations of operating systems. A user enters commands or information into the computer 3912 through input device(s) 3936. Input devices 3936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 3914 through the system bus 3918 via interface port(s) 3938. Interface port(s) 3938 include, for example, a serial port, a parallel port, a game port, and a universal serial bus (USB). Output device(s) 3940 use some of the same type of ports as input device(s) 3936. Thus, for example, a USB port can be used to provide input to computer 3912, and to output information from computer 3912 to an output device 3940. Output adapter 3942 is provided to illustrate that there are some output devices 3940 like monitors, speakers, and printers, among other output devices 3940, which require special adapters. The output adapters 3942 include, by way of illustration and not limitation, video and sound cards that provide a means of connection between the output device 3940 and the system bus 3918. It should be noted that other devices and/or systems of devices provide both input and output capabilities such as remote computer(s) 3944.

Computer 3912 can operate in a networked environment using logical connections to one or more remote computers, such as remote computer(s) 3944. The remote computer(s) 3944 can be a computer, a server, a router, a network PC, a workstation, a microprocessor based appliance, a peer device or other common network node and the like, and typically can also include many or all of the elements described relative to computer 3912. For purposes of brevity, only a memory storage device 3946 is illustrated with remote computer(s) 3944. Remote computer(s) 3944 is logically connected to computer 3912 through a network interface 3948 and then physically connected via communication connection 3950. Network interface 3948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 3950 refers to the hardware/software employed to connect the network interface 3948 to the system bus 3918. While communication connection 3950 is shown for illustrative clarity inside computer 3912, it can also be external to computer 3912. The hardware/software for connection to the network interface 3948 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A device, comprising:
a circuit layer formed on a wiring layer of the device and that comprises defined components; and
a topological qubit device formed on the circuit layer, wherein the topological qubit device comprises:
a nanorod capable of hosting *Majorana* fermions; and
a quantum well tunable Josephson junction that is coupled to the defined components.

2. The device of claim 1, wherein the wiring layer comprises a grid of planar wires coupled to the defined components.

3. The device of claim 1, wherein the defined components are selected from a group consisting of control gates; Josephson junction sensing circuits; chemical potential gates; pinch gates; and Josephson junction gates.

4. The device of claim 1, wherein the nanorod comprises a single material having superconducting properties and magnetic properties.

5. The device of claim 1, wherein the nanorod comprises a magnetic material formed on a superconducting material.

6. The device of claim 1, wherein the quantum well tunable Josephson junction comprises one or more semiconductor material layers.

7. A device, comprising:
a wiring layer formed on a substrate;
a circuit layer formed on the wiring layer and that comprises defined components;
a first device layer formed on the circuit layer, wherein the first device layer comprises a quantum well and electrical contacts coupled to the defined components; and
a second device layer formed on the first device layer, wherein the second device layer comprises:
nanorods capable of hosting *Majorana* fermions; and
electrodes, wherein the electrodes are coupled to the electrical contacts.

8. The device of claim 7, wherein the wiring layer comprises a grid of planar wires coupled to the defined components.

9. The device of claim 7, wherein the defined components are selected from a group consisting of one or more: control gates; Josephson junction sensing circuits; chemical potential gates; pinch gates; and Josephson junction gates.

10. The device of claim 7, wherein the nanorods respectively comprise a single material having superconducting properties and magnetic properties.

11. The device of claim 7, wherein the nanorods respectively comprise a magnetic material formed on a superconducting material.

12. The device of claim 7, wherein the quantum well comprises a tunable quantum well having one or more semiconductor material layers.

13. The device of claim 7, wherein the second device layer comprises an outermost layer of a topological qubit device, thereby facilitating at least one of reduced damage of the nanorods in fabrication, improved coherence time of the topological qubit device, improved lifespan of the topological qubit device, or improved performance of the device.

14. A method, comprising:
forming on a substrate a wiring layer;
forming on the wiring layer a circuit layer comprising defined components;
forming on the circuit layer a first device layer, the first device layer comprising a quantum well and electrical contacts coupled to the defined components; and
forming on the first device layer a second device layer, the second device layer comprising:
nanorods capable of hosting *Majorana* fermions; and
electrodes, wherein the electrodes are coupled to the electrical contacts.

15. The method of claim 14, further comprising:
forming on the substrate the wiring layer comprising a grid of planar wires coupled to the defined components.

16. The method of claim 14, further comprising:
forming on the wiring layer the circuit layer comprising the defined components that are selected from a group consisting of one or more: control gates; Josephson junction sensing circuits; chemical potential gates; pinch gates; and Josephson junction gates.

17. The method of claim 14, further comprising:
forming on the first device layer the second device layer comprising the nanorods that respectively comprise a single material having superconducting properties and magnetic properties.

18. The method of claim 14, further comprising:
forming on the first device layer the second device layer comprising the nanorods that respectively comprise a magnetic material formed on a superconducting material.

19. The method of claim 14, further comprising:
forming on the circuit layer the first device layer having the quantum well comprising a tunable quantum well having one or more semiconductor material layers.

20. The method of claim 14, further comprising:
forming on the first device layer the second device layer, the second device layer comprising an outermost layer of a topological qubit device, thereby facilitating at least one of reduced damage of the nanorods in fabrication, improved coherence time of the topological qubit device, improved lifespan of the topological qubit device, or improved performance of a device comprising the topological qubit device.

* * * * *